US012532504B2

(12) United States Patent
Liaw

(10) Patent No.: US 12,532,504 B2
(45) Date of Patent: Jan. 20, 2026

(54) DEVICE STRUCTURE WITH REDUCED LEAKAGE CURRENT

(71) Applicant: Taiwan Semiconductor Manufacturing Company, Ltd., Hsin-Chu (TW)

(72) Inventor: Jhon Jhy Liaw, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 541 days.

(21) Appl. No.: 17/389,541

(22) Filed: Jul. 30, 2021

(65) Prior Publication Data

US 2023/0033790 A1 Feb. 2, 2023

(51) Int. Cl.

| | |
|---|---|
| ***H10D 62/10*** | (2025.01) |
| ***H01L 21/02*** | (2006.01) |
| ***H01L 21/764*** | (2006.01) |
| ***H10D 30/01*** | (2025.01) |
| ***H10D 30/67*** | (2025.01) |
| ***H10D 64/01*** | (2025.01) |
| ***H10D 84/01*** | (2025.01) |
| ***H10D 84/03*** | (2025.01) |
| ***H10D 84/85*** | (2025.01) |

(52) U.S. Cl.

CPC ..... *H10D 30/6713* (2025.01); *H01L 21/0259* (2013.01); *H01L 21/764* (2013.01); *H10D 30/031* (2025.01); *H10D 30/6735* (2025.01); *H10D 30/6757* (2025.01); *H10D 62/116* (2025.01); *H10D 62/118* (2025.01); *H10D 64/017* (2025.01); *H10D 64/018* (2025.01); *H10D 84/0167* (2025.01); *H10D 84/017* (2025.01); *H10D 84/0188* (2025.01); *H10D 84/038* (2025.01); *H10D 84/85* (2025.01)

(58) Field of Classification Search

None

See application file for complete search history.

(56) References Cited

U.S. PATENT DOCUMENTS

| | | | | |
|---|---|---|---|---|
| 8,395,217 | B1 * | 3/2013 | Cheng | H01L 21/76289 438/222 |
| 2018/0301564 | A1 * | 10/2018 | Kwon | H01L 29/0653 |
| 2019/0165118 | A1 * | 5/2019 | Leobandung | H10D 30/014 |

(Continued)

*Primary Examiner* — Sue A Purvis
*Assistant Examiner* — Carnell Hunter, III
(74) *Attorney, Agent, or Firm* — Cooper Legal Group, LLC

(57) ABSTRACT

A semiconductor device includes a fin on a substrate extending along a fin direction, a first and a second source/drain features on the fin. The semiconductor device also includes a stack of semiconductor layers over a first portion of the fin and between the first source/drain feature and the second source/drain feature. The semiconductor device further includes a gate structure over the stack of semiconductor layers. The gate structure extends along a gate direction perpendicular to the fin direction. Moreover, the gate structure engages with the stack of semiconductor layers. The semiconductor device includes a dielectric layer interposing between the first source/drain feature and the fin along a vertical direction, where the vertical direction is perpendicular to the fin direction and to the gate direction. The dielectric layer interfaces with the first portion of the fin and isolates the first source/drain feature from the first portion of the fin.

20 Claims, 64 Drawing Sheets

(56) References Cited

U.S. PATENT DOCUMENTS

| | | | | |
|---|---|---|---|---|
| 2020/0118886 | A1* | 4/2020 | Miao | H01L 21/823821 |
| 2020/0381545 | A1* | 12/2020 | Chiang | H01L 29/0673 |
| 2021/0408289 | A1* | 12/2021 | Guha | H01L 29/0847 |
| 2022/0013521 | A1* | 1/2022 | Zhang | H10D 86/011 |

* cited by examiner 200
240-1
240-2
288
282
275
B
B'
C
C'
D
D'
X
Y
Z
230
202
262
215
280
277A
240
270
247
255
260As
260Ad
260Bs
260Bd
204A
204B
264
t1'

DEVICE STRUCTURE WITH REDUCED LEAKAGE CURRENT

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs. However, such scaling has also increased complexity of the IC manufacturing processes. Thus, realizing continued advances in IC devices and their performance requires similar advances in IC manufacturing processes and technology.

Recently, multigate devices have been introduced to improve gate control. Multigate devices have been observed to increase gate-channel coupling, reduce OFF-state current, and/or reduce short-channel effects (SCEs). One such multigate device is the nano-sheet-based device, which includes a gate structure that can extend, partially or fully, around a channel layer and between adjacent channel layers to provide access to the channel layer on at least two sides. Nano-sheet-based devices enable aggressive scaling down of IC technologies, maintaining gate control and mitigating SCEs, while seamlessly integrating with conventional IC manufacturing processes. As nano-sheet-based devices continue to scale, maintaining a leakage current below a critical threshold has become increasingly challenging. Such challenges impede the overall optimization of device performances and increase processing complexity. Accordingly, although existing devices and methods for fabricating such have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
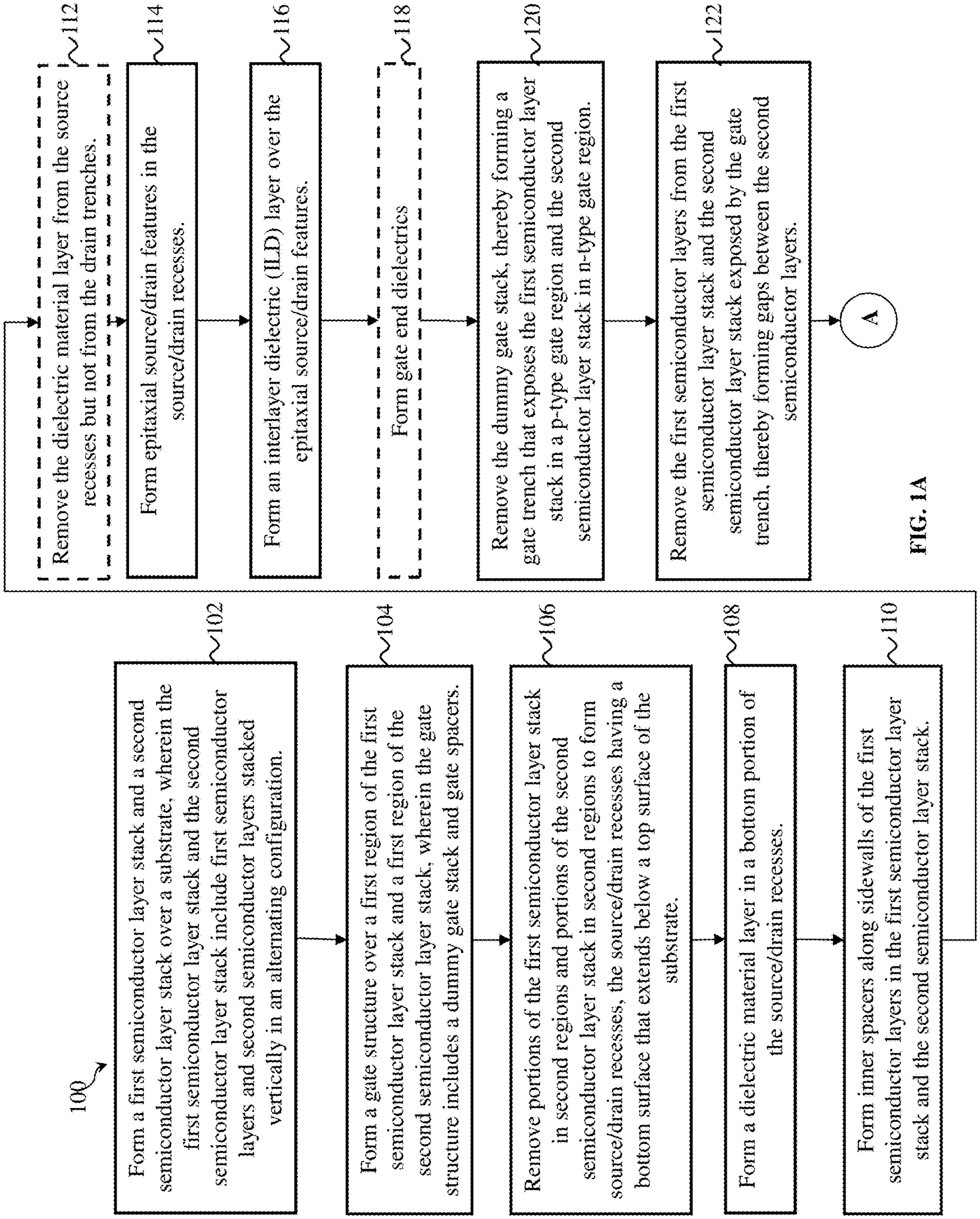
FIGS. 1A, 1B, 26A, and 26B are flow charts of methods for fabricating multigate devices according to various aspects of the present disclosure.

The following disclosure provides many different embodiments, or examples, for implementing different features. Reference numerals and/or letters may be repeated in the various examples described herein. This repetition is for the purpose of simplicity and clarity and does not in itself dictate a relationship between the various disclosed embodiments and/or configurations. Further, specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Moreover, the formation of a feature on, connected to, and/or coupled to another feature in the present disclosure may include embodiments in which the features are formed in direct contact, and may also include embodiments in which additional features may be formed interposing the features, such that the features may not be in direct contact.

Further, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used herein for ease of description to describe one element or feature's relationship to another element(s) or feature(s). The spatially relative terms are intended to encompass different orientations than as depicted of a device (or system or apparatus) including the element(s) or feature(s), including orientations associated with the device's use or operation. The apparatus may be otherwise oriented (rotated 90 degrees or at other orientations) and the spatially relative descriptors used herein may likewise be interpreted accordingly.

The present disclosure relates generally to integrated circuit devices, and more particularly, to multigate devices, such as nano-sheet-based devices. A nano-sheet-based device includes any device that has a stack of suspended channel layers (also referred to as suspended channels) (and, in some embodiments, only one suspended channel layer) that are at least partially surrounded by a gate structure. Nano-sheet-based devices include gate-all-around (GAA) devices, multi-bridge-channel (MBC) devices, and other similar devices. Furthermore, the nano-sheet-based devices may include channel layers of any suitable shapes and/or configurations. For example, the channel layers may be in one of many different shapes, such as wire (or nanowire), sheet (or nanosheet), bar (or nano-bar), and/or other suitable shapes. In other words, the term nano-sheet-based devices broadly encompasses devices having channel layers in nanowire, nano-bars, and any other suitable shapes. The nano-sheet based devices presented herein may be a complementary metal-oxide-semiconductor (CMOS) device, a p-type metal-oxide-semiconductor (PMOS) device, or an n-type metal-oxide-semiconductor (NMOS) device. Further, the channel layers of the nano-sheet-based devices may engage with a single, contiguous gate structure, or multiple gate structures. One of ordinary skill may recognize other examples of semiconductor devices that may benefit from aspects of the present disclosure. For example, other types of metal-oxide semiconductor field effect transistors (MOSFETs), such as planar MOSFETs, FinFETs, or other multigate FETs may benefit from the present disclosure.

During the fabrication of the nano-sheet-based devices, source/drain features (or epitaxial source/drain features) are sometimes formed to extend below a top surface of the semiconductor substrate. Accordingly, a portion of the semiconductor substrate interposes between the source/drain features. This portion of the substrate may function as a transistor channel during operation, and is referred to herein as the bottom channel 246. As compared to suspended channels, the bottom channel 246 is subject to gate control only from its top surface. As a result, the gate control of the bottom channel 246 is substantially weaker than the gate control of the suspended channel layers. In other words, charge carriers in the bottom portions of the source/drain features may migrate through the bottom channel 246 even when the transistor is turned OFF, thereby forming the leakage current. In some approaches, anti-punch-through (APT) dopants are implemented in the bottom channel 246 to prevent or mitigate such leakage current. Such APT dopants, however, may induce junction leakage at the interface between the source/drain features and the APT junction region. Moreover, the dopants in the APT region may further out-diffuse into adjacent bottom channel 246s thereby impacting the operation current $I_{on}$ and/or causing threshold voltage mismatches. As a result, various performance issues may arise. Accordingly, this present disclosure provides schemes and methods that replace portions of the source/drain features below the lowest transistor channel and/or the bottom channel 246, with a dielectric material, thereby mitigating the above-described issue. Device performances are therefore improved.

Figure 1B:
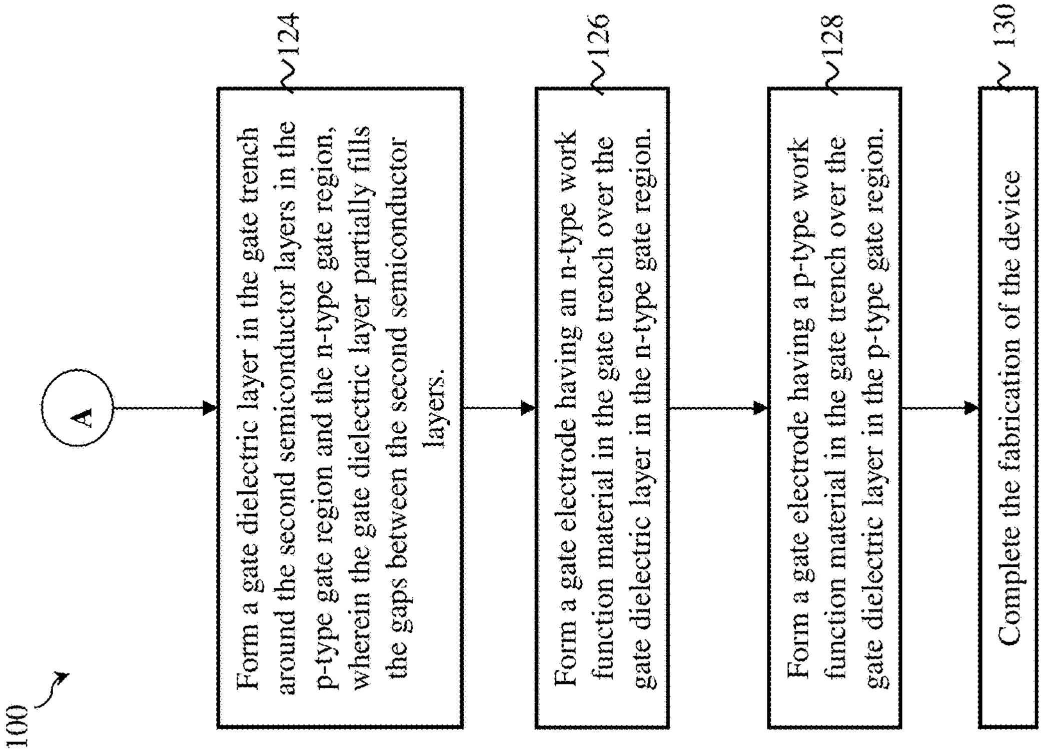
Figure 2A:
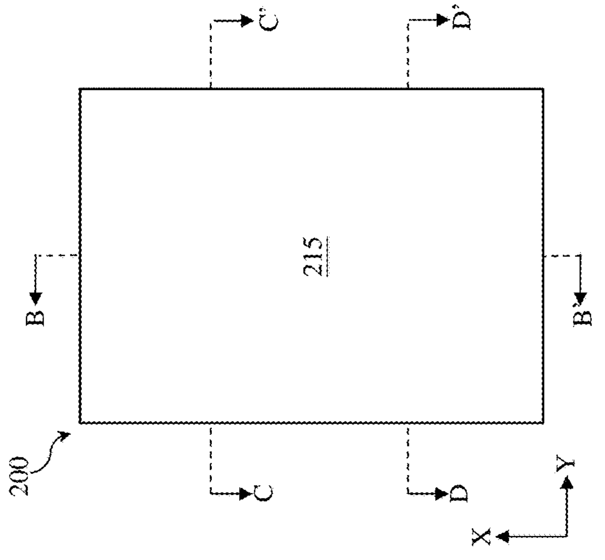
FIGS. 2A, 3A, 4A, 5A, 6A, 7A, 8A, 9A, 10A, 11A, 12A, 13A, 14A, 15A, 16A, 16A', 17A, 18A, 19A, 20A, 21A, 22A, 23A, 24A, 25A, 25A', 27A, 28A, 29A, 30A, 30A', 31A, 32A, 33A, 34A, 35A, 36A, 37A, 38A, 39A, 40A, 41A, 42A, 43A, 44A, 45A, 46A, 47A, 48A, 49A, 50A, 51A are top views of a multigate device in an X-Y plane at different fabrication stages according to some embodiments of the present disclosure.
Figure 2B:
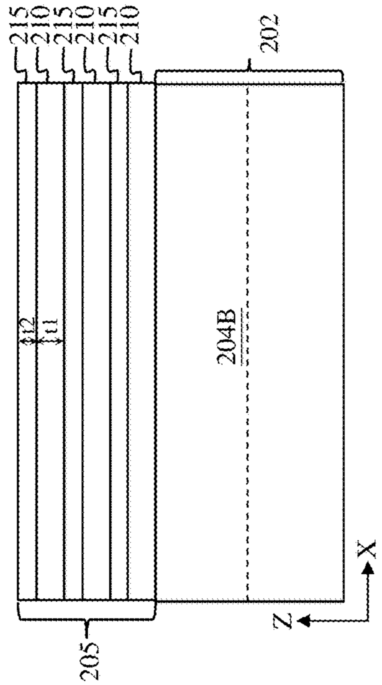
FIGS. 2B, 3B, 4B, 5B, 6B, 7B, 8B, 9B, 10B, 11B, 12B, 13B, 14B, 15B, 16B, 16B', 17B, 18B, 19B, 20B, 21B, 22B, 23B, 24B, 25B, 25B', 27B, 28B, 29B, 30B, 30B', 31B, 32B, 33B, 34B, 35B, 36B, 37B, 38B, 39B, 40B, 41B, 42B, 43B, 44B, 45B, 46B, 47B, 48B, 49B, 50B, 51B are diagrammatic cross-sectional views of the multigate device in an X-Z plane along lines B-B' of the respective FIGS. 2A, 3A, 4A, 5A, 6A, 7A, 8A, 9A, 10A, 11A, 12A, 13A, 14A, 15A, 16A, 16A', 17A, 18A, 19A, 20A, 21A, 22A, 23A, 24A, 25A, 25A', 27A, 28A, 29A, 30A, 30A', 31A, 32A, 33A, 34A, 35A, 36A, 37A, 38A, 39A, 40A, 41A, 42A, 43A, 44A, 45A, 46A, 47A, 48A, 49A, 50A, 51A, according to some embodiments of the present disclosure.
Figure 2C:
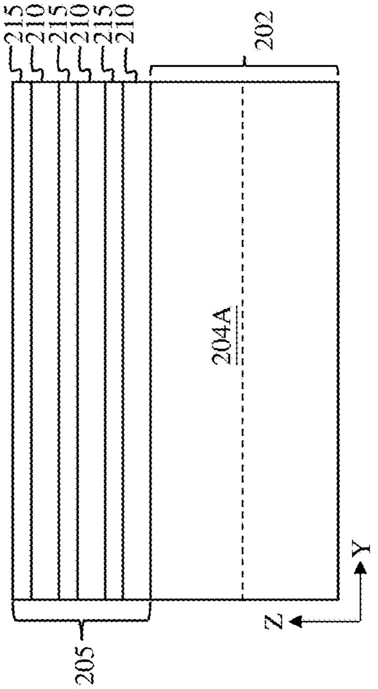
FIGS. 2C, 3C, 4C, 5C, 6C, 7C, 8C, 9C, 10C, 11C, 12C, 13C, 14C, 15C, 16C, 16C', 17C, 18C, 19C, 20C, 21C, 22C, 23C, 24C, 25C, 25C', 27C, 28C, 29C, 30C, 30C', 31C, 32C, 33C, 34C, 35C, 36C, 37C, 38C, 39C, 40C, 41C, 42C, 43C, 44C, 45C, 46C, 47C, 48C, 49C, 50C, 51C are diagrammatic cross-sectional views of the multigate device in a Y-Z plane along lines C-C' of the respective FIGS. 2A, 3A, 4A, 5A, 6A, 7A, 8A, 9A, 10A, 11A, 12A, 13A, 14A, 15A, 16A, 16A', 17A, 18A, 19A, 20A, 21A, 22A, 23A, 24A, 25A, 25A', 27A, 28A, 29A, 30A, 30A', 31A, 32A, 33A, 34A, 35A, 36A, 37A, 38A, 39A, 40A, 41A, 42A, 43A, 44A, 45A, 46A, 47A, 48A, 49A, 50A, 51A, according to some embodiments of the present disclosure.
Figure 2D:
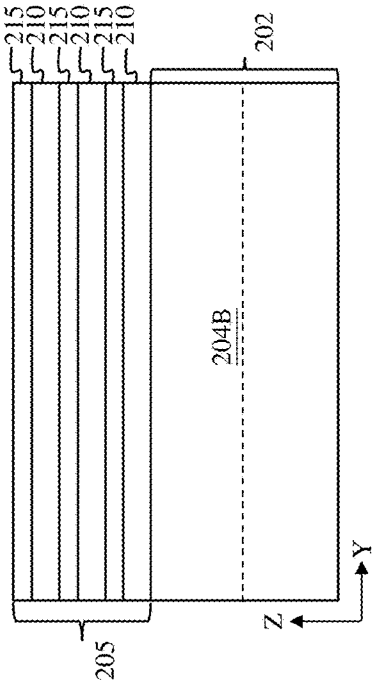
FIGS. 2D, 3D, 4D, 5D, 6D, 7D, 8D, 9D, 10D, 11D, 12D, 13D, 14D, 15D, 16D, 16D', 17D, 18D, 19D, 20D, 21D, 22D, 23D, 24D, 25D, 25D', 27D, 28D, 29D, 30D, 30D', 31D, 32D, 33D, 34D, 35D, 36D, 37D, 38D, 39D, 40D, 41D, 42D, 43D, 44D, 45D, 46D, 47D, 48D, 49D, 50D, 51D are diagrammatic cross-sectional views of the multigate device in the Y-Z plane along lines D-D' of the respective FIGS. 2A, 3A, 4A, 5A, 6A, 7A, 8A, 9A, 10A, 11A, 12A, 13A, 14A, 15A, 16A, 16A', 17A, 18A, 19A, 20A, 21A, 22A, 23A, 24A, 25A, 25A', 27A, 28A, 29A, 30A, 30A', 31A, 32A, 33A, 34A, 35A, 36A, 37A, 38A, 39A, 40A, 41A, 42A, 43A, 44A, 45A, 46A, 47A, 48A, 49A, 50A, 51A, according to some embodiments of the present disclosure.
Figure 3B:
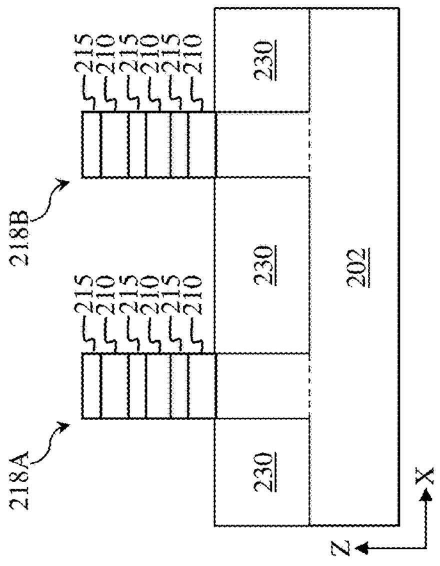
Figure 3D:
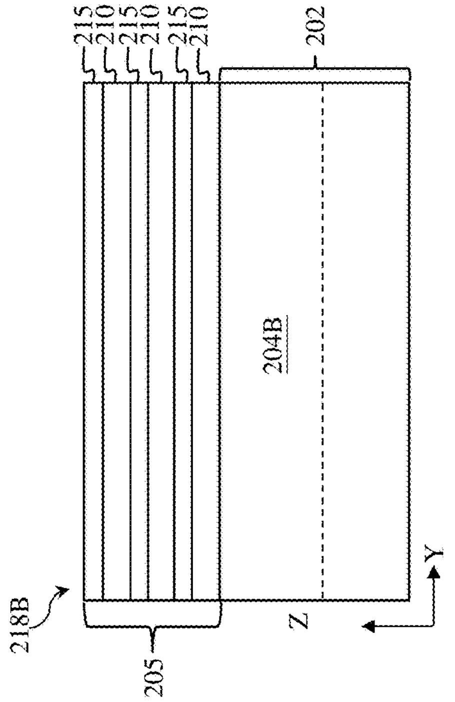
Figure 3A:
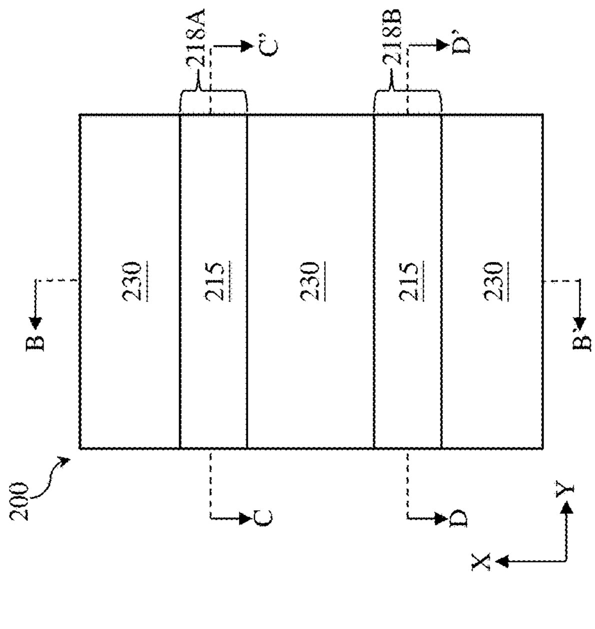
Figure 3C:
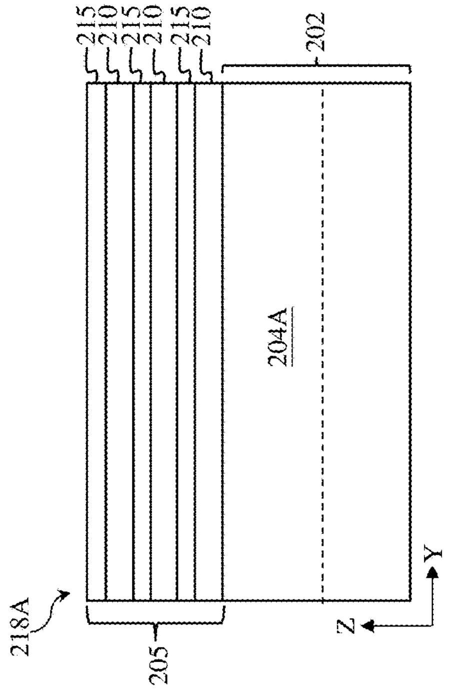
Figures 4A, 4B, 4C, 4D:
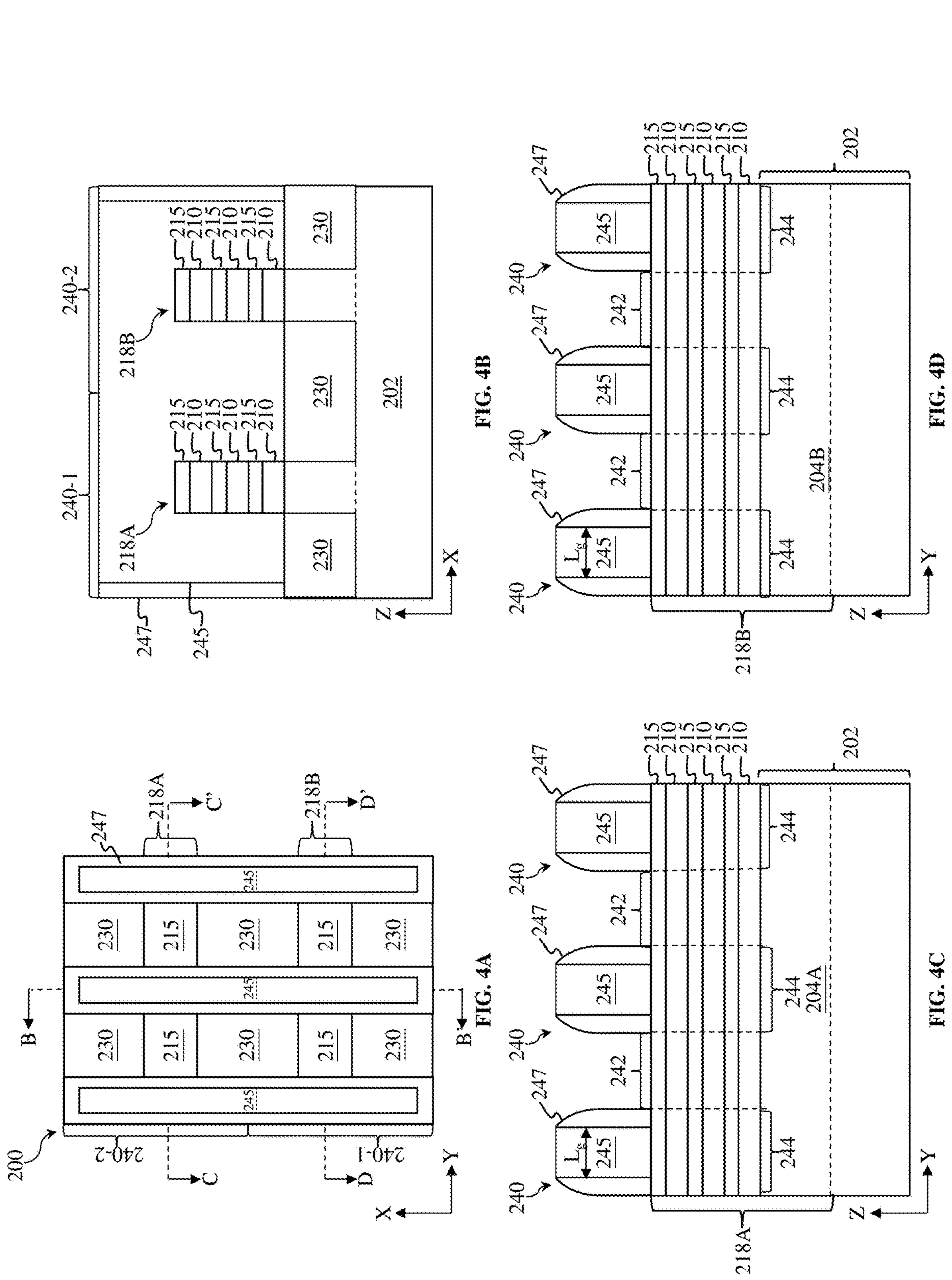
Figures 5A, 5B, 5C, 5D:
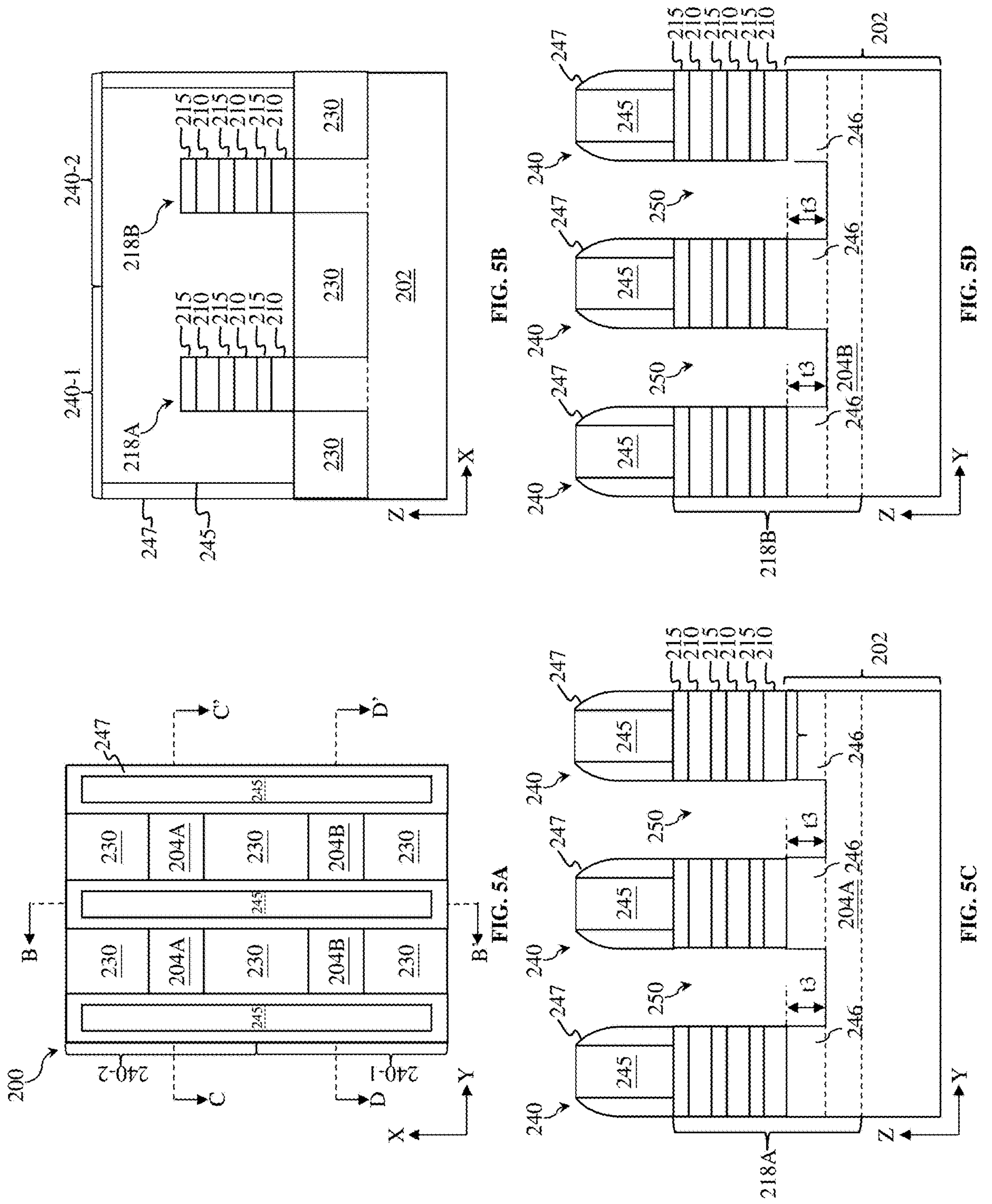
Figure 6B:
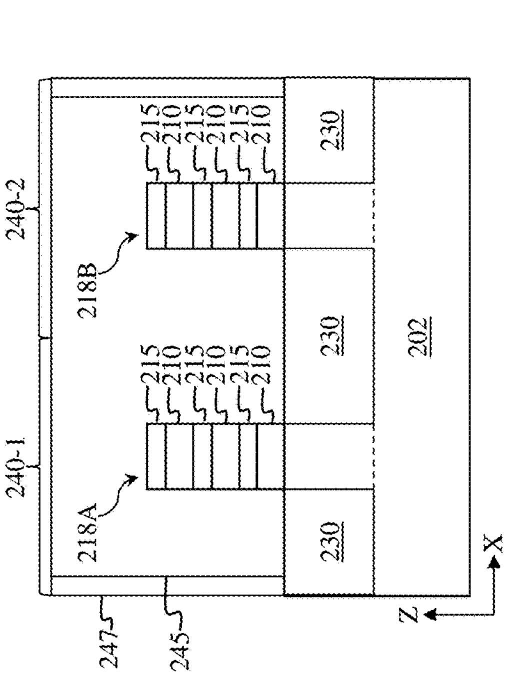
Figure 6A:
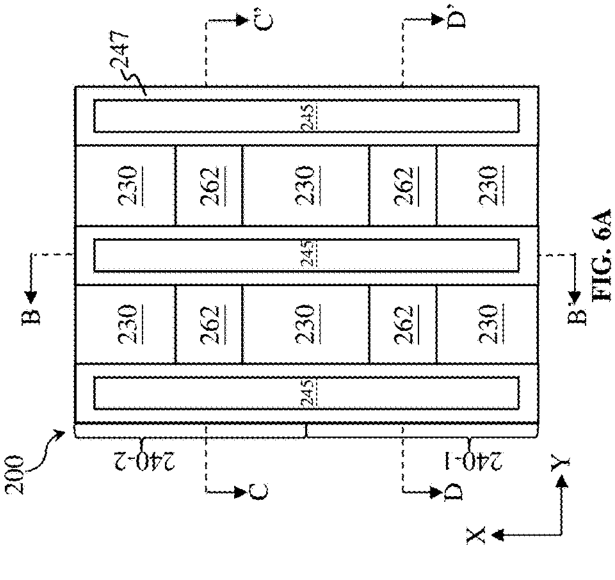
Figure 6D:
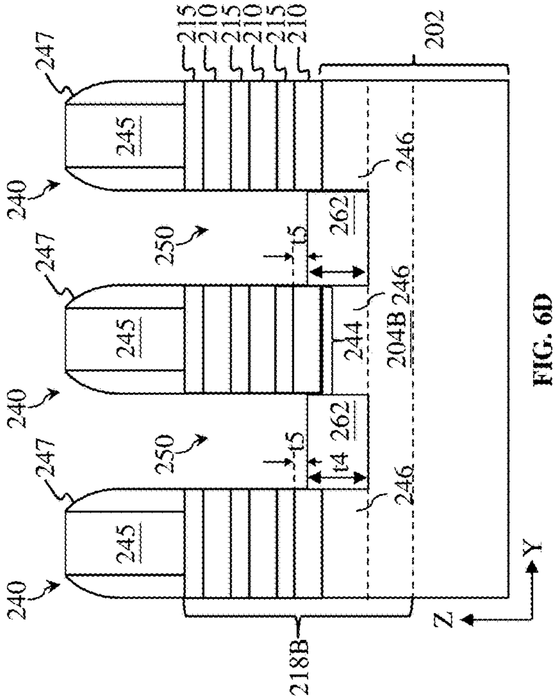
Figure 6C:
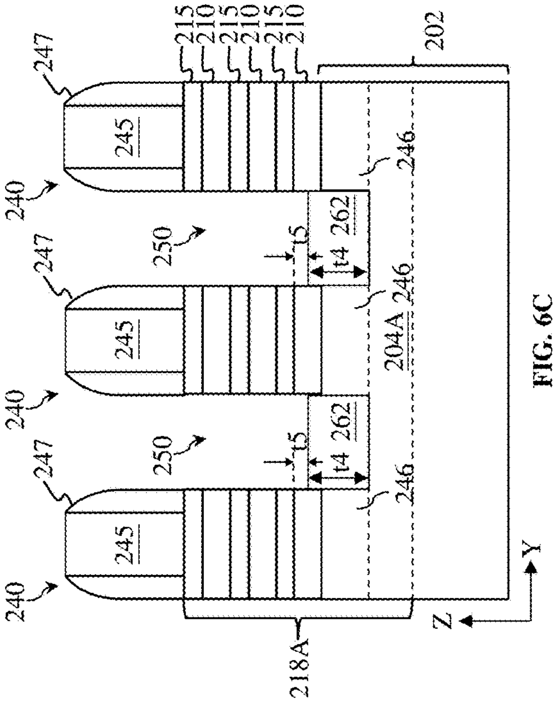
Figures 7A, 7B, 7C, 7D:
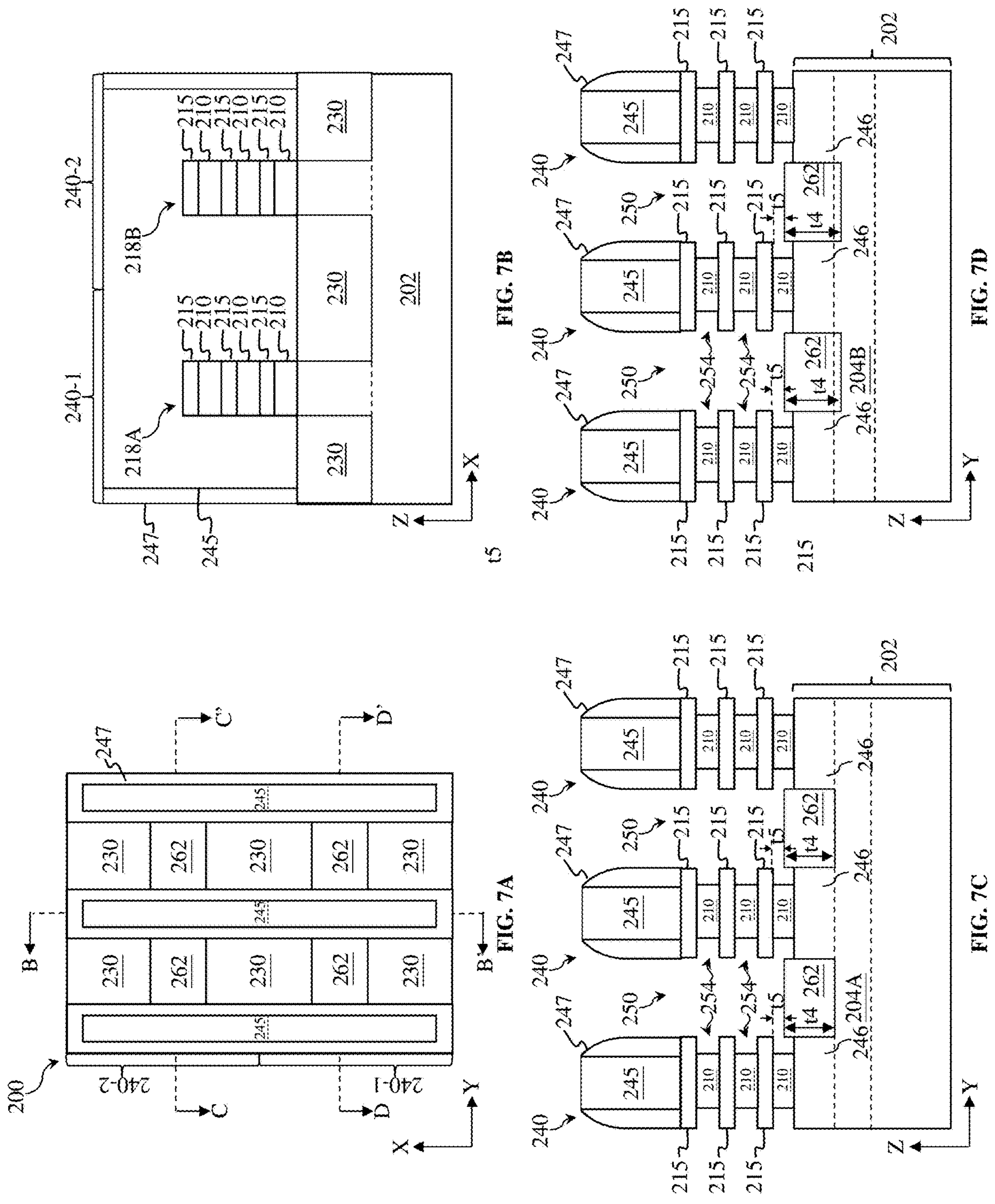
Figure 8A:
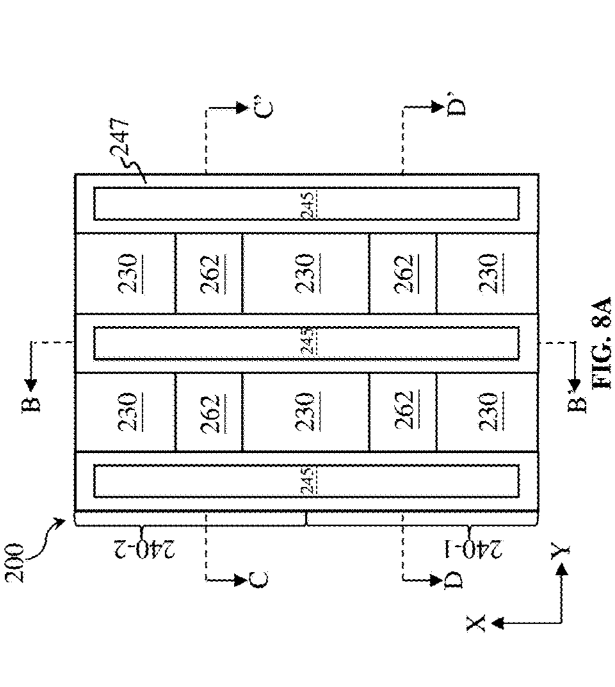
Figure 8B:
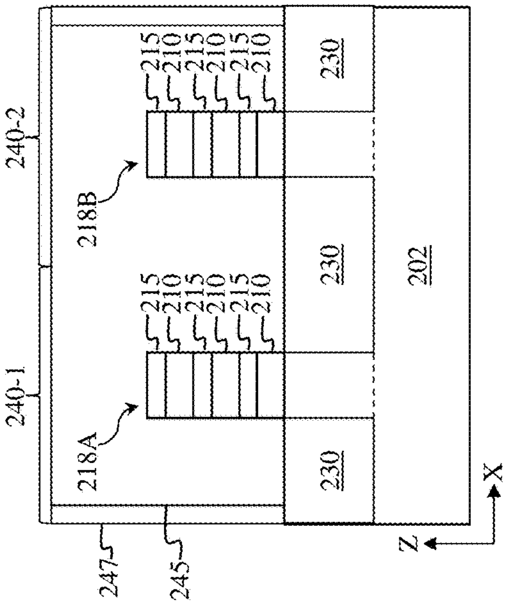
Figure 8C:
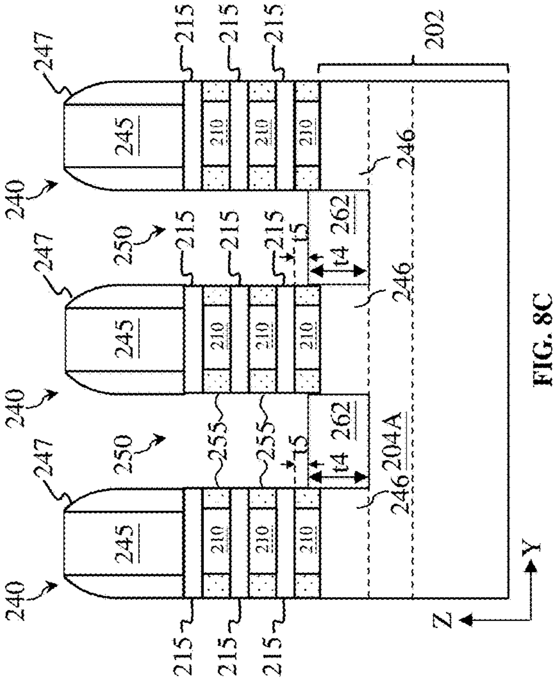
Figure 8D:
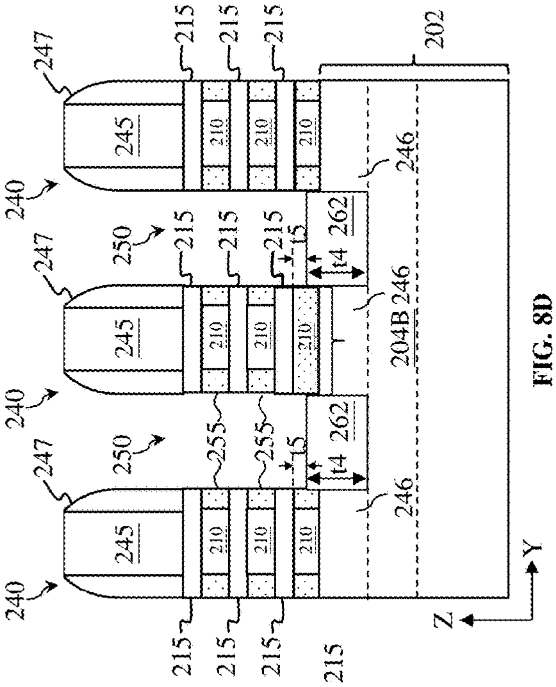
Figure 16B:
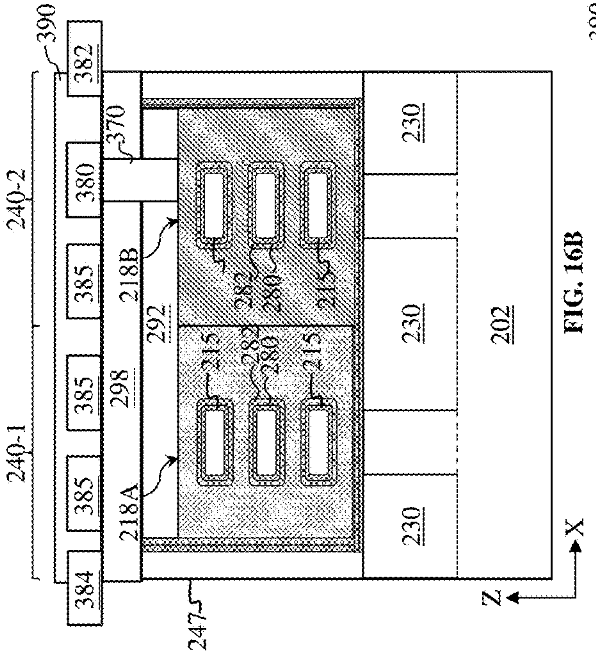
Figure 16D:
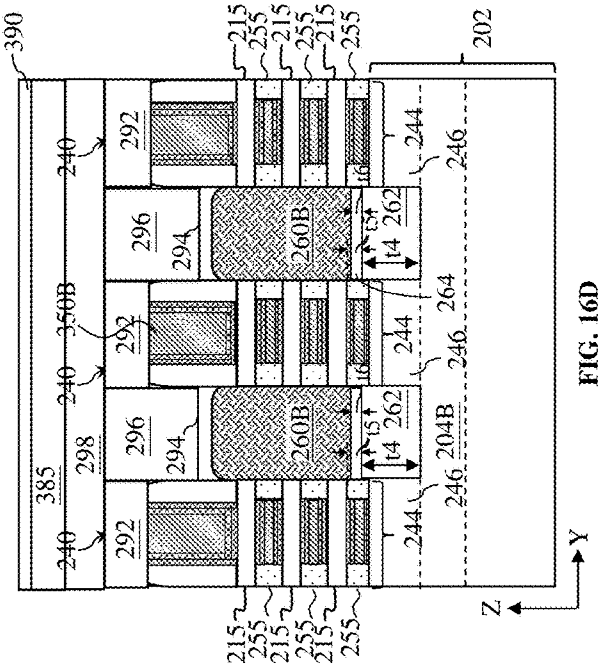
Figure 16A:
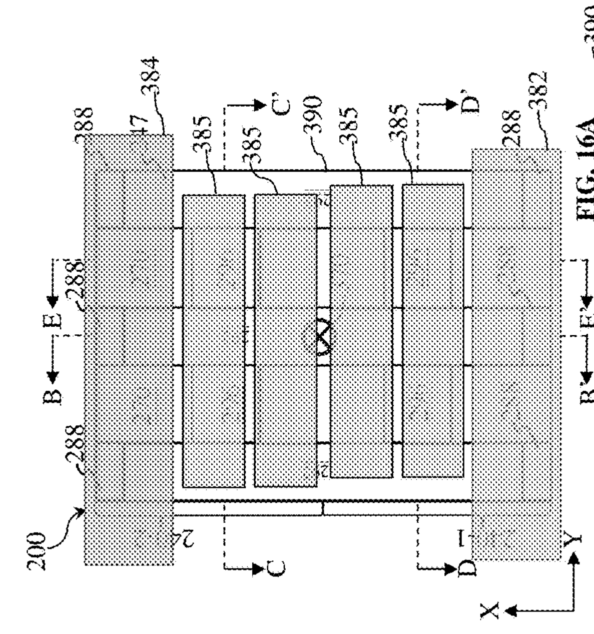
Figure 16C:
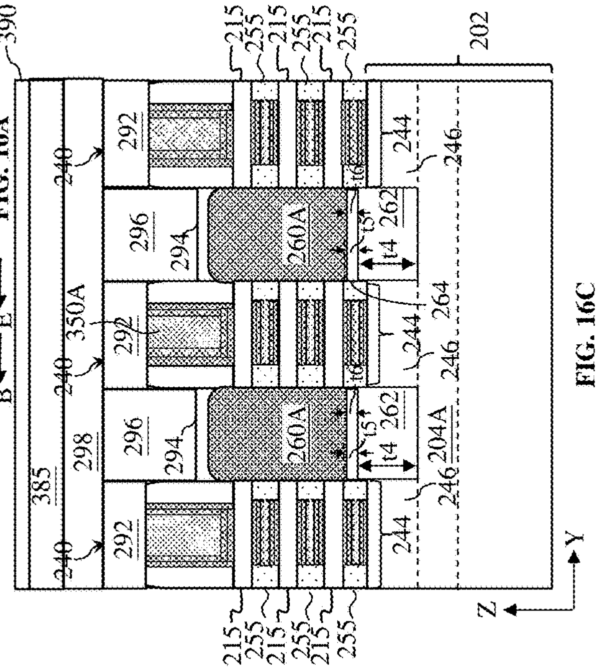
Figure 16E:
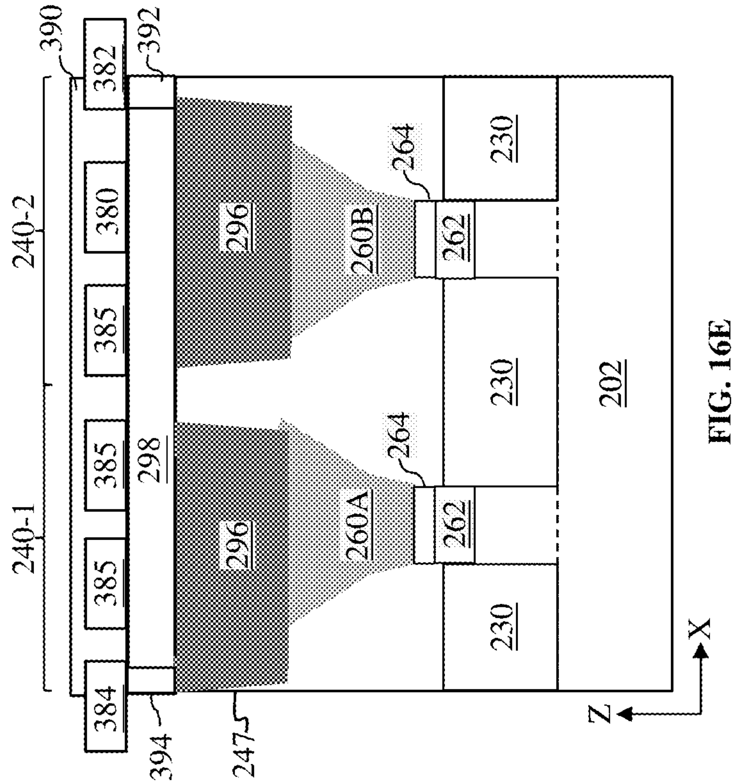
FIGS. 16E, 16E', 25E, 25E', 42E, and 51E are diagrammatic cross-sectional view of device 200 in the X-Z plane along line E-E' of the respective FIGS. 16A, 16A', 25A, 25A', 42A, and 51A, according to some embodiments of the present disclosure.
Figures 16A, 16B, 16C, 16D:
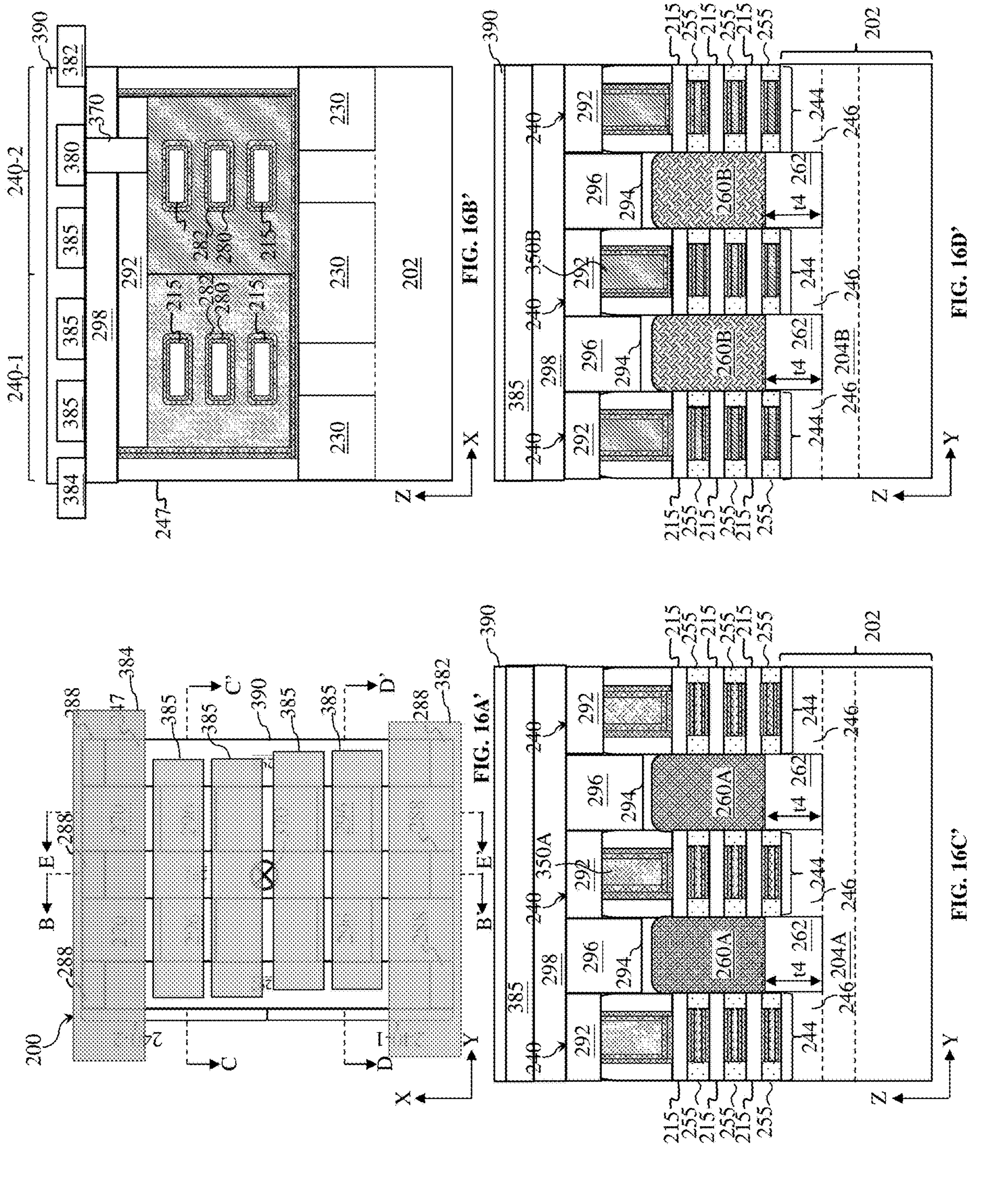
Figure 16E:
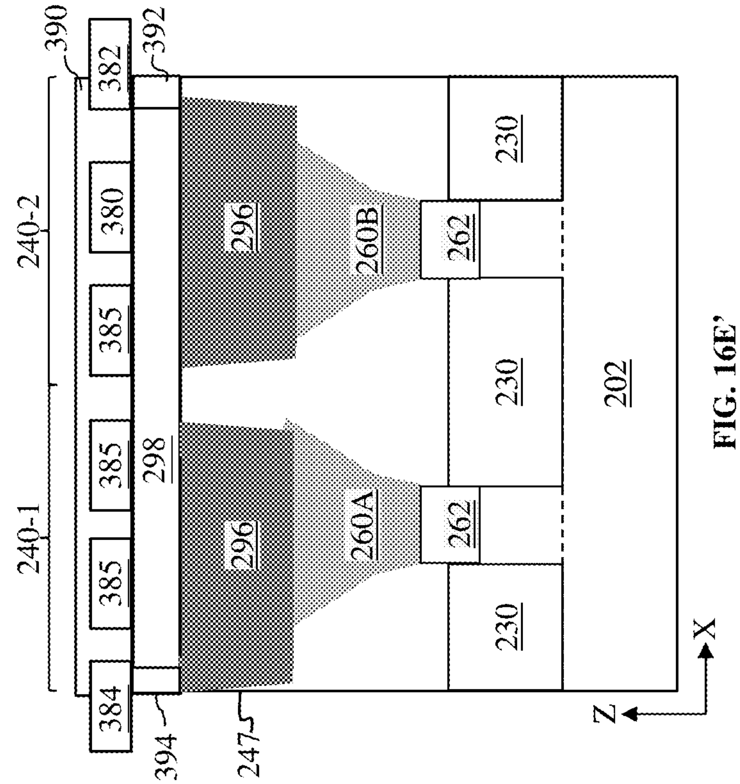
Figure 17A:
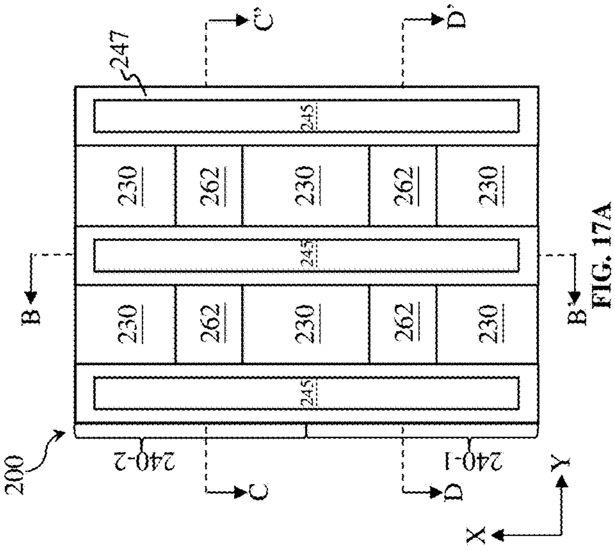
Figure 17B:
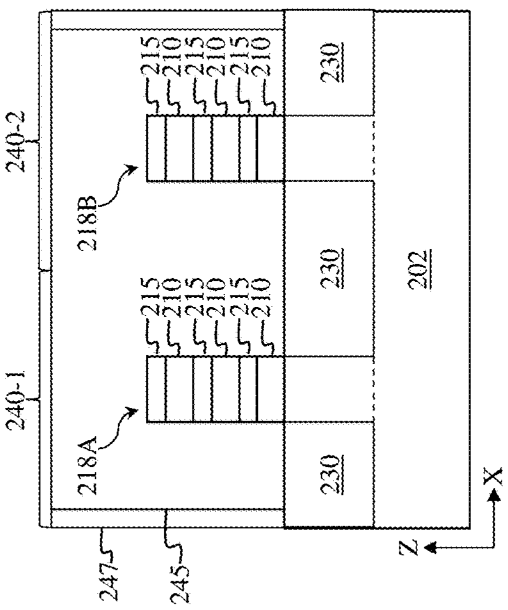
Figure 17C:
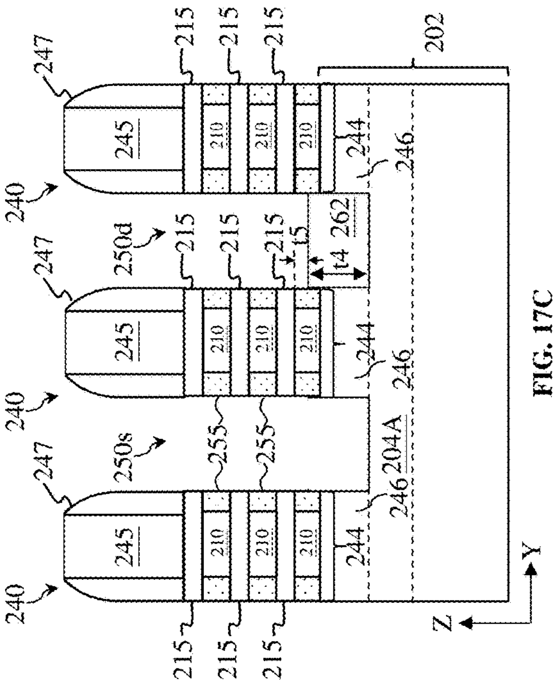
Figure 17D:
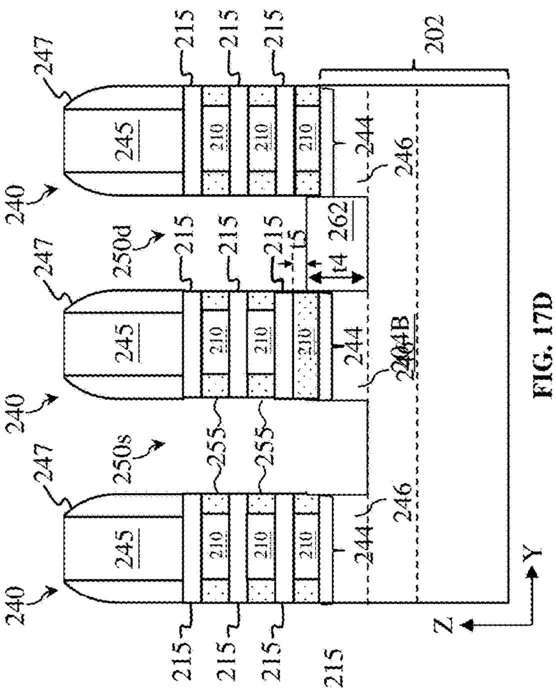
Figures 18A, 18B, 18C, 18D:
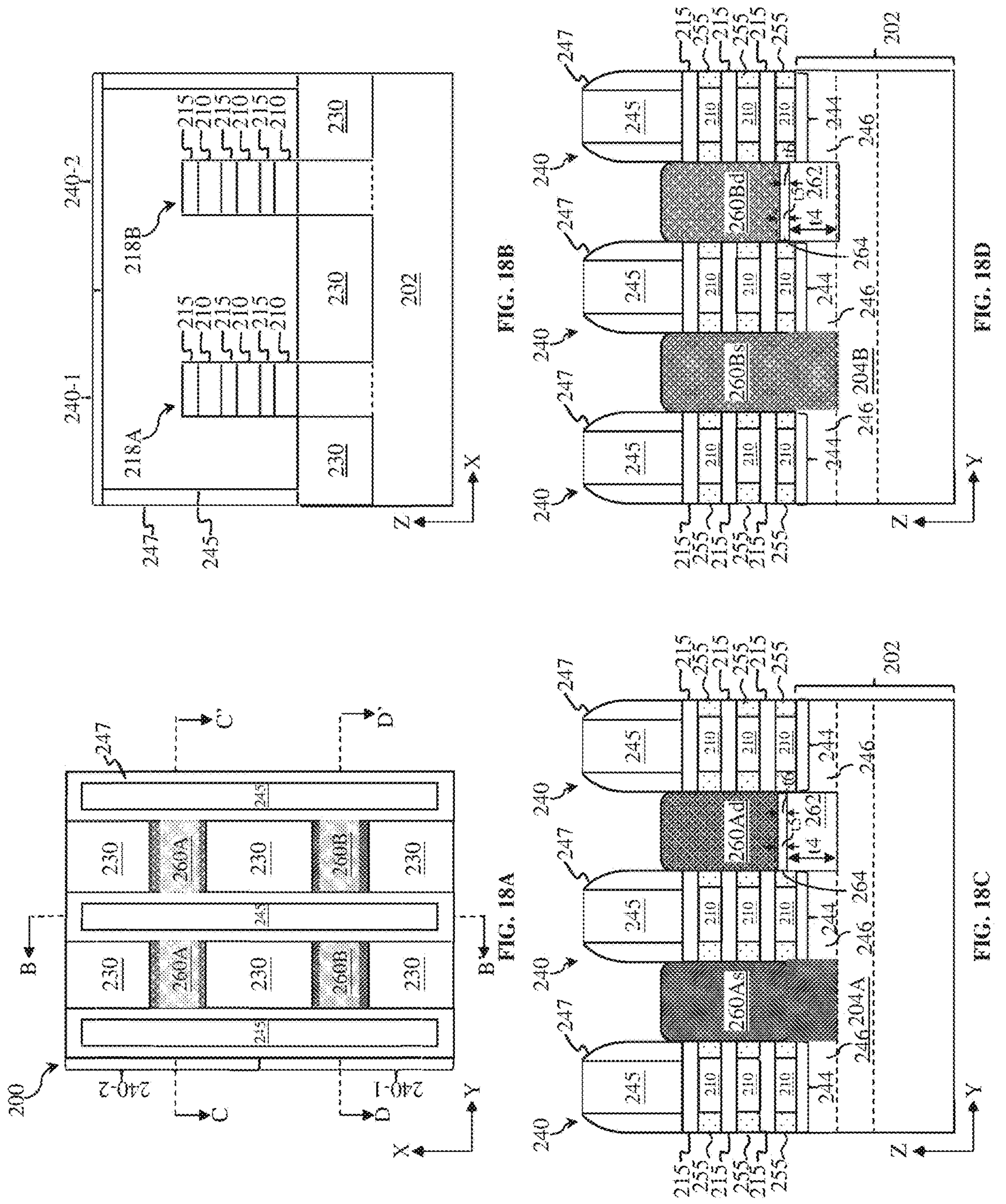
Figures 19A, 19B, 19C, 19D:
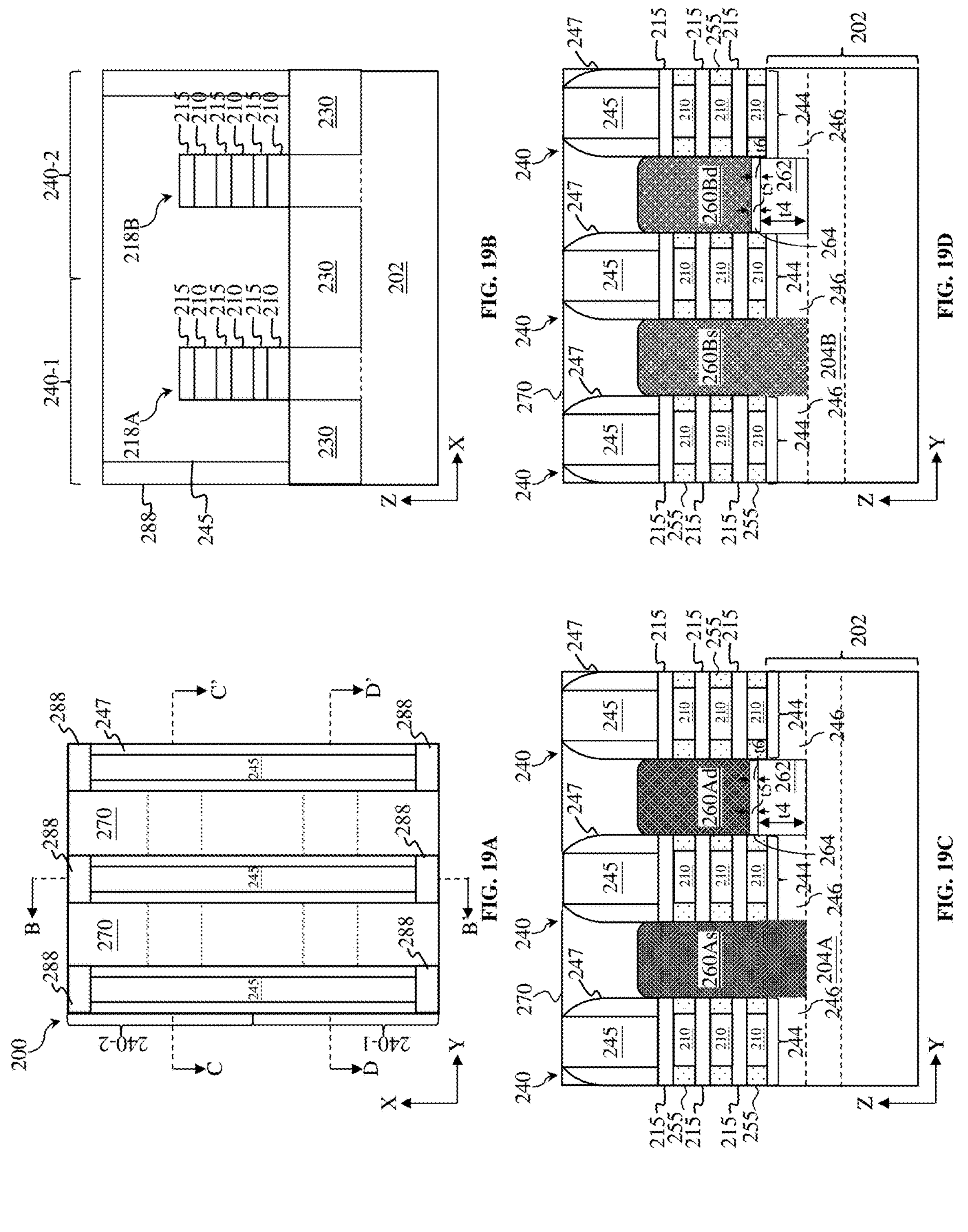
Figures 20A, 20B, 20C, 20D:
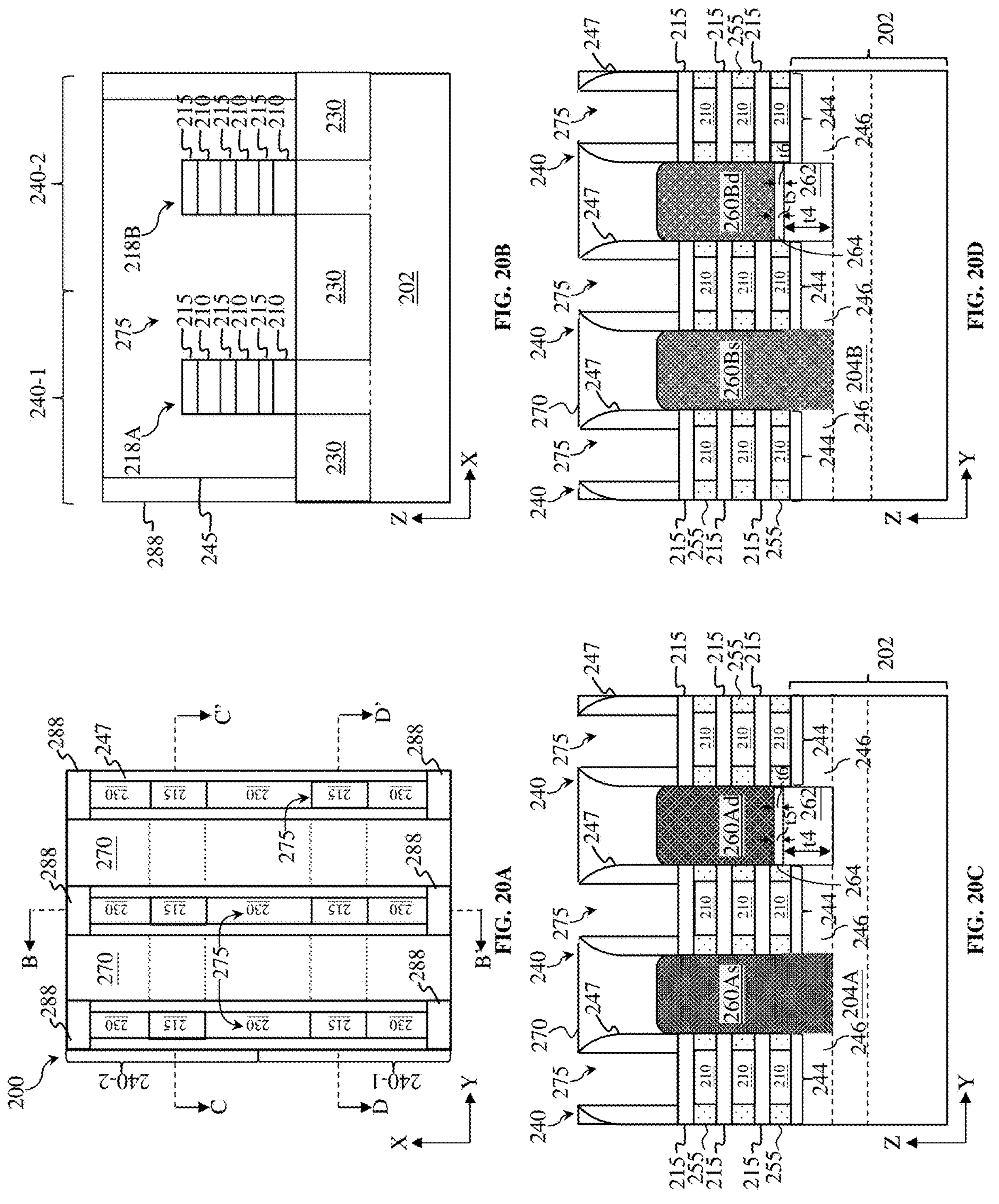
Figure 21A:
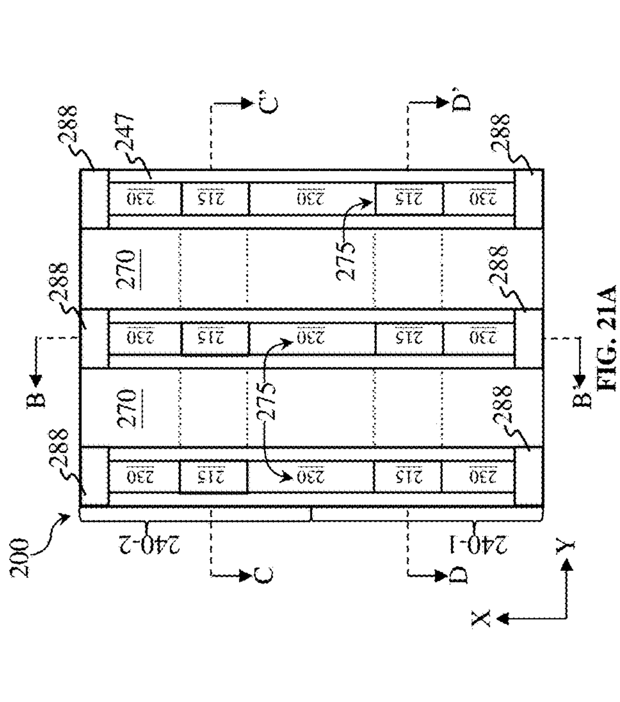
Figure 21B:
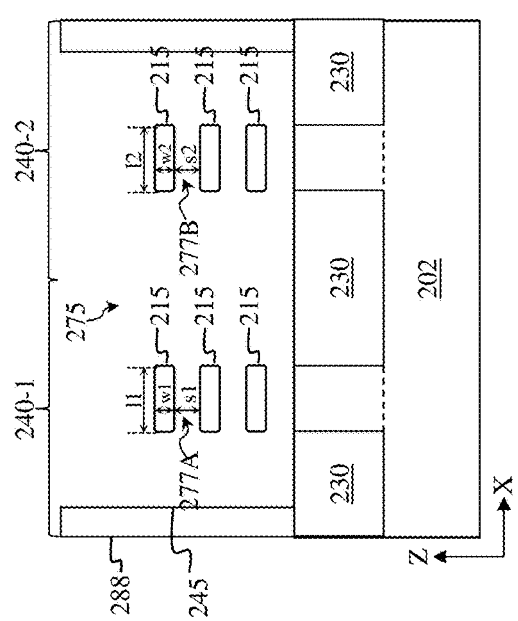
Figure 21C:
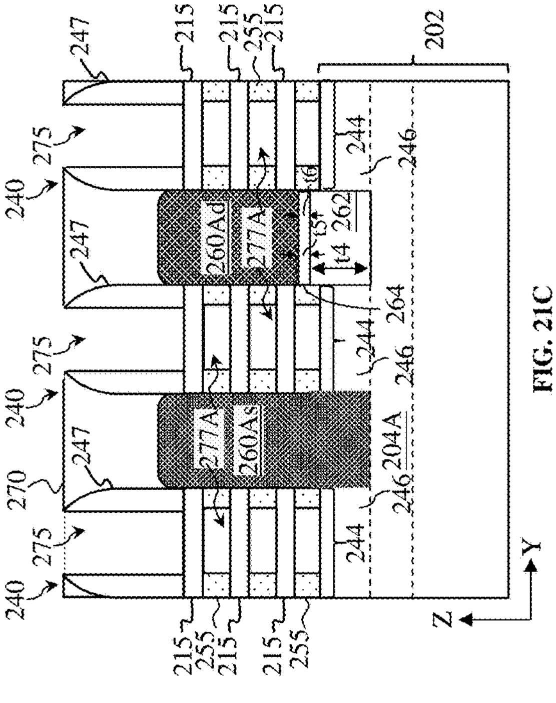
Figure 21D:
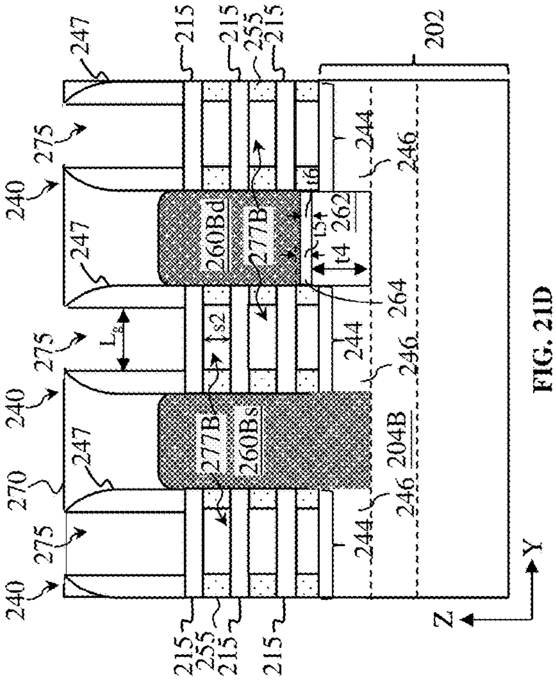
Figures 22A, 22B, 22C, 22D:
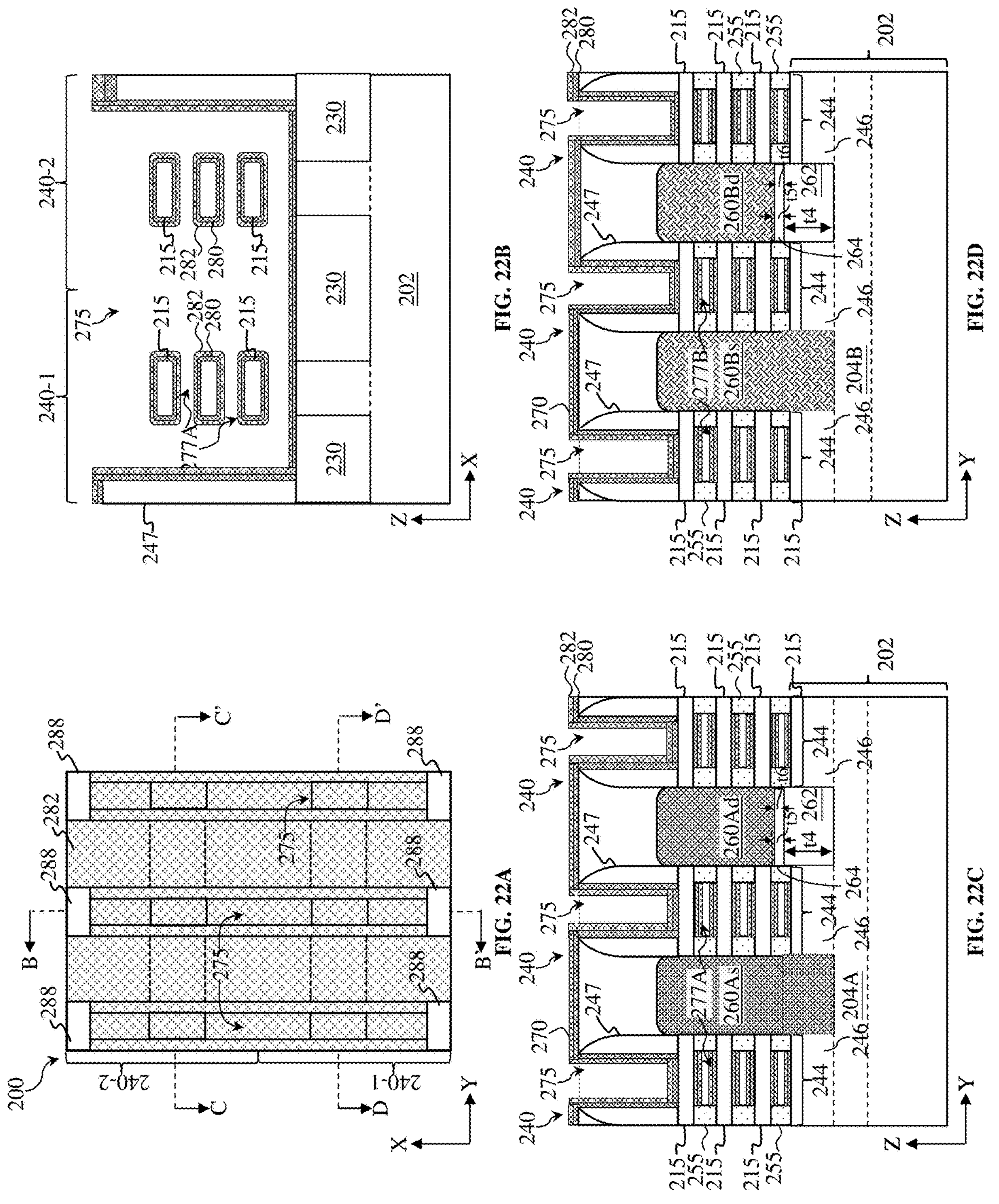
Figures 23A, 23B, 23C, 23D:
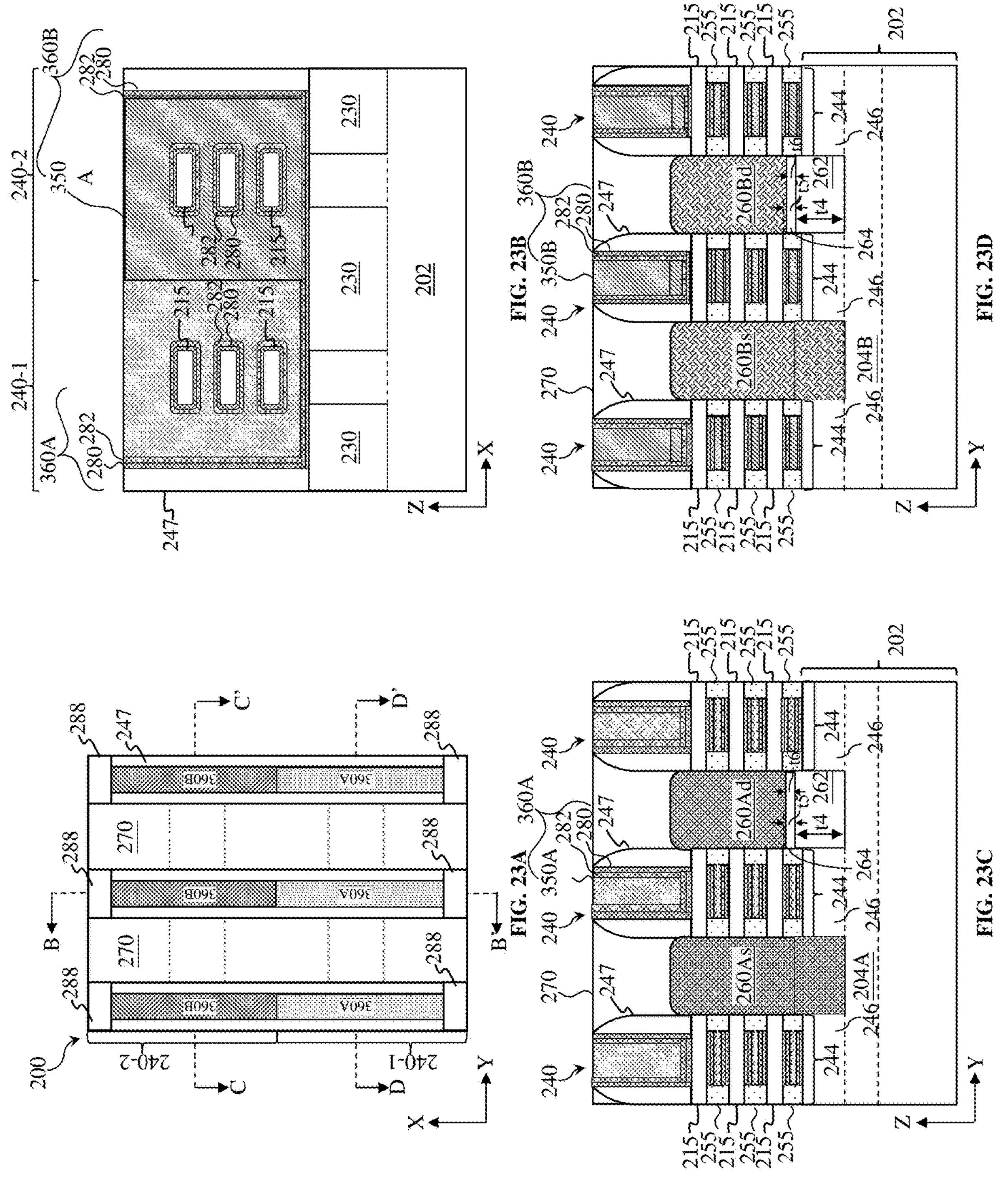
Figures 24A, 24B, 24C, 24D:
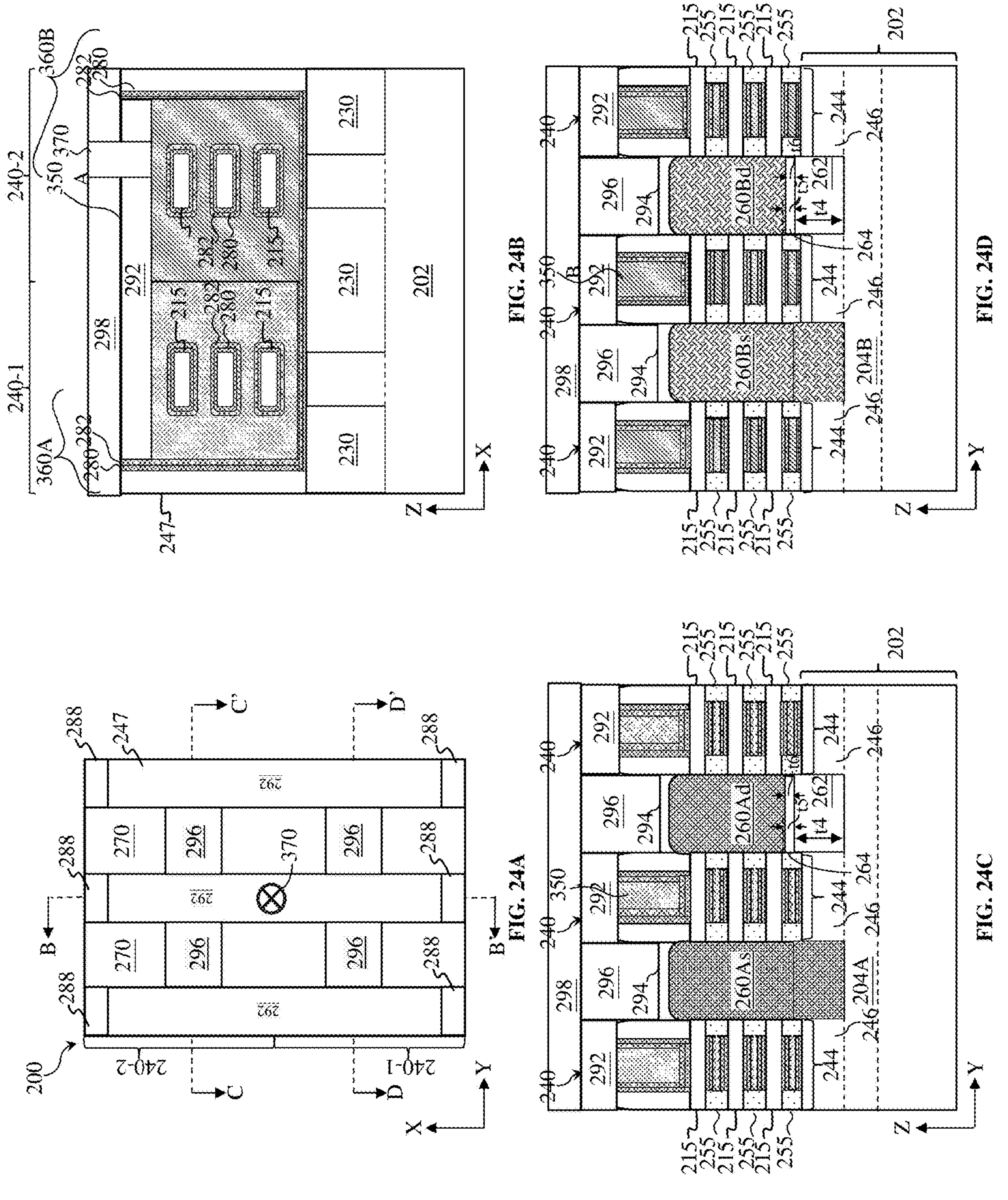

FIG. 1A and FIG. 1B are a flow chart of a method 100 for fabricating a nano-sheet-based device according to various aspects of the present disclosure. FIGS. 2A-16A, FIGS. 2B-16B, FIGS. 2C-16C, FIGS. 2D-16D, and 16E are fragmentary diagrammatic views of a multigate device 200 (or device 200), in portion or entirety, at various fabrication stages (such as those associated with method 100 in FIG. 1A and FIG. 1B) according to various aspects of the present disclosure. In particular, FIGS. 2A-16A are top views of device 200 in an X-Y plane; FIGS. 2B-16B are diagrammatic cross-sectional views of device 200 in an X-Z plane along lines B-B' of the respective FIGS. 2A-16A, FIGS. 2C-16C are diagrammatic cross-sectional views of device 200 in a Y-Z plane along lines C-C' of the respective FIGS. 2A-16A; FIGS. 2D-16D are diagrammatic cross-sectional views of device 200 in the Y-Z plane along lines D-D' of the respective FIGS. 2A-16A; and FIG. 16E is a diagrammatic cross-sectional view of device 200 in the X-Z plane along line E-E' of FIG. 16A. As described in more detail below, figures subsequent to FIGS. 16A-16E provide alternative embodiments of method 100.

Device 200 may be included in a microprocessor, a memory, and/or other IC device. In some embodiments, device 200 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. In some embodiments, device 200 is included in a non-volatile memory, such as a non-volatile random access memory (NVRAM), a flash memory, an electrically erasable programmable read only memory (EEPROM), an electrically programmable read-only memory (EPROM), other suitable memory type, or combinations thereof. FIGS. 2A-16A, FIGS. 2B-16B, FIGS. 2C-16C, and FIGS. 2D-16D have been simplified for the sake of clarity to better understand the inventive concepts of the present disclosure. Additional features can be added in device 200, and some of the features described below can be replaced, modified, or eliminated in other embodiments of device 200.

Turning to FIGS. 2A-2D, device 200 includes a substrate (wafer) 202. In the depicted embodiment, substrate 202 includes silicon. Alternatively or additionally, substrate 202 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 202 can include various doped regions depending on design requirements of device 200. In the depicted embodiment, substrate 202 includes a p-type doped region (referred to interchangeably as a p-well) 204A, which can be configured for n-type GAA transistors, and an n-type doped region (referred to interchangeably as an n-well) 204B, which can be configured for p-type GAA transistors. N-type doped regions, such as n-well 204B, are doped with n-type dopants, such as phosphorus, arsenic, other n-type dopant, or combinations thereof. P-type doped regions, such as p-well 204A, are doped with p-type dopants, such as boron, indium, other p-type dopant, or combinations thereof. In some implementations, substrate 202 includes doped regions formed with a combination of p-type dopants and n-type dopants. The various doped regions can be formed directly on and/or in substrate 202, for example, providing a p-well structure, an n-well structure, a dual-well structure, a raised structure, or combinations thereof. An ion implantation process, a diffusion process, and/or other suitable doping process can be performed to form the various doped regions.

Referring to block 102 of FIG. 1A and to FIGS. 2A-2D, a semiconductor layer stack 205 is formed over substrate 202, where semiconductor layer stack 205 includes semiconductor layers 210 and semiconductor layers 215 stacked vertically (e.g., along the z-direction) in an interleaving or alternating configuration from a surface of substrate 202. In some embodiments, semiconductor layers 210 and semiconductor layers 215 are epitaxially grown in the depicted interleaving and alternating configuration. For example, a first one of semiconductor layers 210 is epitaxially grown on the substrate, a first one of semiconductor layers 215 is epitaxially grown on the first one of semiconductor layers 215, a second one of semiconductor layers 210 is epitaxially grown on the first one of semiconductor layers 215, and so on until semiconductor layers stack 205 has a desired number of semiconductor layers 210 and semiconductor layers 215. In such embodiments, semiconductor layers 210 and semiconductor layers 215 can be referred to as epitaxial layers. In some embodiments, epitaxial growth of semiconductor layers 210 and semiconductor layers 215 is achieved by a molecular beam epitaxy (MBE) process, a chemical vapor deposition (CVD) process, a metalorganic chemical vapor deposition (MOCVD) process, other suitable epitaxial growth process, or combinations thereof.

A composition of semiconductor layers 210 is different than a composition of semiconductor layers 215 to achieve etching selectivity and/or different oxidation rates during subsequent processing. In some embodiments, semiconductor layers 210 have a first etch rate to an etchant and semiconductor layers 215 have a second etch rate to the etchant, where the second etch rate is less than the first etch rate. In some embodiments, semiconductor layers 210 have a first oxidation rate and semiconductor layers 215 have a second oxidation rate, where the second oxidation rate is less than the first oxidation rate. In the depicted embodiment, semiconductor layers 210 and semiconductor layers 215 include different materials, constituent atomic percentages, constituent weight percentages, thicknesses, and/or characteristics to achieve desired etching selectivity during an etching process, such as an etching process implemented to form suspended channel layers in channel regions of device 200. For example, where semiconductor layers 210 include silicon germanium and semiconductor layers 215 include silicon, a silicon etch rate of semiconductor layers 215 is less than a silicon germanium etch rate of semiconductor layers 210. In some embodiments, semiconductor layers 210 and semiconductor layers 215 can include the same material but with different constituent atomic percentages to achieve the etching selectivity and/or different oxidation rates. For example, semiconductor layers 210 and semiconductor layers 215 can include silicon germanium, where semiconductor layers 210 have a first silicon atomic percent and/or a first germanium atomic percent and semiconductor layers 215 have a second, different silicon atomic percent and/or a second, different germanium atomic percent. The present disclosure contemplates that semiconductor layers 210 and semiconductor layers 215 include any combination of semiconductor materials that can provide desired etching selectivity, desired oxidation rate differences, and/or desired performance characteristics (e.g., materials that maximize current flow), including any of the semiconductor materials disclosed herein.

As described further below, semiconductor layers 215 or portions thereof form channel regions of device 200. In the depicted embodiment, semiconductor layer stack 205 includes three semiconductor layers 210 and three semiconductor layers 215 configured to form three semiconductor layer pairs disposed over substrate 202, each semiconductor layer pair having a respective first semiconductor layer 210 and a respective second semiconductor layer 215. After undergoing subsequent processing, such configuration will result in device 200 having three channels. However, the present disclosure contemplates embodiments where semiconductor layer stack 205 includes more or fewer semiconductor layers, for example, depending on a number of channels desired for device 200 (e.g., a GAA transistor) and/or design requirements of device 200. For example, semiconductor layer stack 205 can include two to ten semiconductor layers 210 and two to ten semiconductor layers 215. In furtherance of the depicted embodiment, semiconductor layers 210 have a thickness t1 and semiconductor layers 215 have a thickness t2, where thickness t1 and thickness t2 are chosen based on fabrication and/or device performance considerations for device 200. For example, thickness t1 can be configured to define a desired distance (or gap) between adjacent channels of device 200 (e.g., between semiconductor layers 215), thickness t2 can be configured to achieve desired thickness of channels of device 200, and both thickness t1 and thickness t2 can be configured to achieve desired performance of device 200. In some embodiments, thickness t1 and thickness t2 are about 1 nm to about 10 nm. If the thickness t1 and thickness t2 are too small, such as less than about 1 nm, there may be insufficient dimension to form device features therein, or the formed device feature may be too narrow to have proper functionality. If the thickness t1 and thickness t2 are too large, such as greater than about 10 nm, the device features may unnecessarily occupy valuable chip spaces without substantial improvements to device performances.

Still referring to block 102 of FIG. 1A and to FIGS. 3A-3D, semiconductor layer stack 205 is patterned to form a fin 218A and a fin 218B (also referred to as fin structures, fin elements, etc.). Fins 218A, 218B include a substrate portion (i.e., a portion of substrate 202) and a semiconductor layer stack portion (i.e., a remaining portion of semiconductor layer stack 205 including semiconductor layers 210 and semiconductor layers 215). Fins 218A, 218B extend substantially parallel to one another along a y-direction, having a length defined in the y-direction, a width defined in an x-direction, and a height defined in a z-direction. In some implementations, a lithography and/or etching process is performed to pattern semiconductor layer stack 205 to form fins 218A, 218B. The lithography process can include forming a resist layer over semiconductor layer stack 205

(for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. The etching process removes portions of semiconductor layer stack 205 using the patterned resist layer as an etch mask. In some embodiments, the patterned resist layer is formed over a hard mask layer disposed over semiconductor layer stack 205, a first etching process removes portions of the hard mask layer to form a patterned hard mask layer, and a second etching process removes portions of semiconductor layer stack 205 using the patterned hard mask layer as an etch mask. The etching process can include a dry etching process, a wet etching process, other suitable etching process, or combinations thereof. In some embodiments, the etching process is a reactive ion etching (RIE) process. After the etching process, the patterned resist layer (and, in some embodiments, a hard mask layer) is removed, for example, by a resist stripping process or other suitable process. Alternatively, fins 218A, 218B are formed by a multiple patterning process, such as a double patterning lithography (DPL) process (for example, a lithography-etch-lithography-etch (LELE) process, a self-aligned double patterning (SADP) process, a spacer-is-dielectric (SID) SADP process, other double patterning process, or combinations thereof), a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof. In some embodiments, directed self-assembly (DSA) techniques are implemented while patterning semiconductor layer stack 205. Further, in some embodiments, the exposure process can implement maskless lithography, electron-beam (e-beam) writing, and/or ion-beam writing for patterning the resist layer.

An isolation feature(s) 230 is formed over and/or in substrate 202 to isolate various regions, such as various device regions, of device 200. For example, isolation features 230 surround a bottom portion of fins 218A, 218B, such that isolation features 230 separate and isolate fins 218A, 218B from each other. In the depicted embodiment, isolation features 230 surround the substrate portion of fins 218A, 218B (e.g., doped regions 204A, 204B of substrate 202) and partially surround the semiconductor layer stack portion of fins 218A, 218B (e.g., a portion of bottommost semiconductor layer 210). However, the present disclosure contemplates different configurations of isolation features 230 relative to fins 218A, 218B. Isolation features 230 include silicon oxide, silicon nitride, silicon oxynitride, other suitable isolation material (for example, including silicon, oxygen, nitrogen, carbon, or other suitable isolation constituent), or combinations thereof. Isolation features 230 can include different structures, such as shallow trench isolation (STI) structures, deep trench isolation (DTI) structures, and/or local oxidation of silicon (LOCOS) structures. For example, isolation features 230 can include STI features that define and electrically isolate fins 218A, 218B from other active device regions (such as fins) and/or passive device regions. STI features can be formed by etching a trench in substrate 202 (for example, by using a dry etching process and/or a wet etching process) and filling the trench with insulator material (for example, by using a CVD process or a spin-on glass process). A chemical mechanical polishing (CMP) process may be performed to remove excessive insulator material and/or planarize a top surface of isolation features 230. In another example, STI features can be formed by depositing an insulator material over substrate 202 after forming fins 218A, 218B (in some implementations, such that the insulator material layer fills gaps (trenches) between fins 218A, 218B) and etching back the insulator material layer to form isolation features 230. In some embodiments, STI features include a multi-layer structure that fills the trenches, such as a silicon nitride comprising layer disposed over a thermal oxide comprising liner layer. In another example, STI features include a dielectric layer disposed over a doped liner layer (including, for example, boron silicate glass (BSG) or phosphosilicate glass (PSG)). In yet another example, STI features include a bulk dielectric layer disposed over a liner dielectric layer, where the bulk dielectric layer and the liner dielectric layer include materials depending on design requirements.

Referring to block 104 of FIG. 1A and to FIGS. 4A-4D, gate structures 240 are formed over portions of fins 218A, 218B and over isolation features 230. Gate structures 240 extend lengthwise in a direction that is different than (e.g., orthogonal to) the lengthwise direction of fins 218A, 218B. For example, gate structures 240 extend substantially parallel to one another along the x-direction. Gate structures 240 are disposed on portions of fins 218A, 218B and define source/drain regions 242 and channel regions 244 of fins 218A, 218B. In the X-Z plane, gate structures 240 wrap top surfaces and sidewall surfaces of fins 218A, 218B. In the Y-Z plane, gate structures 240 are disposed over top surfaces of respective channel regions 244 of fins 218A, 218B, such that gate structures 240 interpose respective source/drain features subsequently formed in the source/drain regions 242. Each gate structure 240 includes a gate region 240-1 in an n-type transistor region and a gate region 240-2 in a p-type transistor region. The gate region 240-1 corresponds with a portion of the gate structure 240 that will be configured for an n-type transistor and is thus referred to as n-type gate region 240-1; while the gate region 240-2 corresponds with a portion of the gate structure 240 that will be configured for a p-type transistor and is thus referred to as p-type gate region 240-2. As described further below, each of the subsequently formed functional gate stack of gate structures 240 spans both gate region 240-1 and gate region 240-2 and is configured differently in gate region 240-1 and gate region 240-2 to optimize performance of the n-type transistors (having n-gate electrodes in gate regions 240-1) and the p-type transistors (having p-gate electrodes in gate regions 240-2).

In FIGS. 4A-4D, each gate structure 240 includes a dummy gate stack 245. In the depicted embodiment, a width of dummy gate stacks 245 defines a gate length ($L_g$) of gate structures 240 (here, in the y-direction), where the gate length defines a distance (or length) that current (e.g., carriers, such as electrons or holes) travels between source/drain regions 242 when the n-type transistor and/or the p-type transistor are switched (turned) on. In some embodiments, the gate length is about 5 nm to about 250 nm. Gate length can be tuned to achieve desired operation speeds of the transistors and/or desired packing density of the transistors. For example, when a transistor is switched on, current flows between source/drain regions of the transistor. Increasing the gate length increases a distance required for current to travel between the source/drain regions, increasing a time it takes for the transistor to switch fully on. Conversely, decreasing the gate length decreases the distance required for current to travel between the source/drain regions, decreasing a time it takes for the transistor to switch fully on. Smaller gate lengths provide transistors that switch on/off more quickly, facilitating faster, high speed operations. Smaller gate lengths also facilitate tighter packing density (i.e., more transistors can be fabricated in a given area of an IC chip), increasing a number of functions and applications that can be fabricated on the IC chip. In the depicted embodiment, the gate length of one or more of gate structures 240 is configured to provide transistors having short-length (SC) channels. For example, the gate length of SC transistors is about 5 nm to about 20 nm. In some embodiments, device 200 can include transistors having different gate lengths. For example, a gate length of one or more of gate structures 240 can be configured to provide transistors having mid-length or long-length channels (M/LC). In some embodiments, the gate length of M/LC transistors is about 20 nm to about 250 nm.

Dummy gate stacks 245 include a dummy gate electrode, and in some embodiments, a dummy gate dielectric. The dummy gate electrode includes a suitable dummy gate material, such as polysilicon layer. In embodiments where dummy gate stacks 245 include a dummy gate dielectric disposed between the dummy gate electrode and fins 218A, 218B, the dummy gate dielectric includes a dielectric material, such as silicon oxide, a high-k dielectric material, other suitable dielectric material, or combinations thereof. Examples of high-k dielectric material include $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, or combinations thereof. In some embodiments, the dummy gate dielectric includes an interfacial layer (including, for example, silicon oxide) disposed over fins 218A, 218B and a high-k dielectric layer disposed over the interfacial layer. Dummy gate stacks 245 can include numerous other layers, for example, capping layers, interface layers, diffusion layers, barrier layers, hard mask layers, or combinations thereof. For example, dummy gate stacks 245 can further include a hard mask layer disposed over the dummy gate electrode.

Dummy gate stacks 245 are formed by deposition processes, lithography processes, etching processes, other suitable processes, or combinations thereof. For example, a deposition process is performed to form a dummy gate electrode layer over fins 218A, 218B and isolation features 230. In some embodiments, a deposition process is performed to form a dummy gate dielectric layer over fins 218A, 218B and isolation features 230 before forming the dummy gate electrode layer. In such embodiments, the dummy gate electrode layer is deposited over the dummy gate dielectric layer. In some embodiment, a hard mask layer is deposited over the dummy gate electrode layer. The deposition process includes CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. A lithography patterning and etching process is then performed to pattern the dummy gate electrode layer (and, in some embodiments, the dummy gate dielectric layer and the hard mask layer) to form dummy gate stacks 245, such that dummy gate stacks 245 (including the dummy gate electrode layer, the dummy gate dielectric layer, the hard mask layer, and/or other suitable layers) is configured as depicted in FIGS. 4A-4D. The lithography patterning processes include resist coating (for example, spin-on coating), soft baking, mask aligning, exposure, post-exposure baking, developing the resist, rinsing, drying (for example, hard baking), other suitable lithography processes, or combinations thereof. The etching processes include dry etching processes, wet etching processes, other etching methods, or combinations thereof.

Each gate structure 240 further includes gate spacers 247 disposed adjacent to (i.e., along sidewalls of) respective dummy gate stacks 245. Gate spacers 247 are formed by any suitable process and include a dielectric material. The dielectric material can include silicon, oxygen, carbon, nitrogen, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)). For example, a dielectric layer including silicon and nitrogen, such as a silicon nitride layer, can be deposited over dummy gate stacks 245 and subsequently etched (e.g., anisotropically etched) to form gate spacers 247. In some embodiments, gate spacers 247 include a multi-layer structure, such as a first dielectric layer that includes silicon nitride and a second dielectric layer that includes silicon oxide. In some embodiments, more than one set of spacers, such as seal spacers, offset spacers, sacrificial spacers, dummy spacers, and/or main spacers, are formed adjacent to dummy gate stacks 245. In such implementations, the various sets of spacers can include materials having different etch rates. For example, a first dielectric layer including silicon and oxygen (e.g., silicon oxide) can be deposited and etched to form a first spacer set adjacent to dummy gate stacks 245, and a second dielectric layer including silicon and nitrogen (e.g., silicon nitride) can be deposited and etched to form a second spacer set adjacent to the first spacer set.

Referring to block 106 of FIG. 1A and to FIGS. 5A-5D, exposed portions of fins 218A, 218B (i.e., source/drain regions 242 of fins 218A, 218B that are not covered by gate structures 240, see FIGS. 4A-4D) are at least partially removed to form source/drain recesses (trenches) 250. In the depicted embodiment, an etching process completely removes semiconductor layer stack 205 in source/drain regions 242 of fins 218A, 218B. Moreover, the etching process further removes some, but not all, of the substrate portion of fins 218A, 218B, such that bottom surfaces of the source/drain recesses 250 extend below a topmost surface of substrate 202. Source/drain recesses 250 thus have sidewalls defined collectively by remaining portions of semiconductor layer stack 205 and remaining portions of the substrate 202, which are disposed in channel regions 244 under gate structures 240 (see FIGS. 4A-4D). The source/drain recesses 250 further have bottom surfaces defined by the remaining portions of the substrate 202, such as top surfaces of p-well 204A and n-well 204B in source/drain regions 242. In some embodiments, forming the source/drain recesses 250 that extends into the substrate 202 allows relatively facile formation of the inner spacers between the topmost surface of the substrate and the lowest suspended channel layer, as described later. In some embodiments, the portion of the substrate 202 removed during the etching process has a thickness of t3. In other words, a distance between the bottom surface of the source/drain recess 250 and the top surface of the substrate 202 is the thickness (or distance) t3. In some embodiments, the distance t3 may be about 5 nm to about 40 nm. If the distance t3 is too small, such as less 5 nm, it may be challenging to reliably form inner spacers between the topmost surface of the substrate and the lowest suspended channel layer. Moreover, subsequently formed dielectric material layer may not sufficiently block leakage current. Conversely, if the distance t3 is too large, such as greater than 40 nm, the additional dielectric material provides does not benefit sufficient to justify their costs. The etching process can include a dry etching process, a wet etching process, other suitable etching process, or combinations thereof. In some embodiments, the etching process is a multi-step etch process. For example, the etching process may alternate etchants to separately and alternately remove semiconductor layers 210 and semiconductor layers 215. In some embodiments, parameters of the etching process are configured to selectively etch semiconductor layer stack with minimal (to no) etching of gate structures 240 (i.e., dummy gate stacks 245 and gate spacers 247) and/or isolation features 230. In some embodiments, a lithography process, such as those described herein, is performed to form a patterned mask layer that covers gate structures 240 and/or isolation features 230, and the etching process uses the patterned mask layer as an etch mask. As illustrated, the source/drain recesses 250 expose sidewall surfaces of a portion of fins 218A, 218B. This portion is referred to as the bottom channel 246.

Referring to block 108 of FIG. 1A and to FIGS. 6A-6D, a dielectric material layer 262 is formed in the bottom portions of the source/drain recesses 250. In some embodiments, the dielectric material covers the entire sidewall surface of the bottom channel 246. Accordingly, the bottom channel 246 is isolated by the dielectric material layer 262 from any subsequently formed conductive features (such as source/drain features). As a result, charge carrier migration from the source/drain features into the bottom channel 246 is minimized. In some embodiments, the dielectric material layer 262 has a thickness t4. In other words, a distance between the top surface of the dielectric material layer 262 and the bottom surface of the source/drain recesses 250 is the thickness (or distance) t4. Moreover, a distance between the bottom surface of the lowest semiconductor layer 215 is the distance t5. The sum of the distance t4 and distance t5 equals the sum of the distance t3 and the thickness t1. In some embodiments, the thickness t4 may be about 5 nm to about 50 nm. In some embodiments, the distance t5 is about 5 nm to about 20 nm. If the thickness t4 is too small, such as less than t3, or if the distance t5 is too large, such as greater than thickness t1, sidewall surfaces of a portion of the bottom channel 246 (as described in detail later) may be exposed and not covered by the dielectric material layer 262. Consequently, subsequently formed source/drain features may interface with the bottom channel 246 and cause increase in the leakage current through the bottom channel 246. If the thickness t4 is too large, such as greater than 50 nm, or if the distance t5 is too small, such as less than 5 nm, there may be insufficient opening space between the dielectric material layer 262 and the semiconductor layer 215 to form inner spacer recesses during a subsequent lateral etching process. Additionally, as described later, an air gap may be formed between the top surface of the dielectric material layer 262 and the subsequently formed source/drain features. The distance t5 determines the maximum thickness of the air gap formed along the Z-direction.

Referring to block 110 of FIG. 1A and to FIGS. 7A-7D, a lateral etching operation is conducted to remove a portion of the semiconductor layers 210 from the sidewall surfaces of the semiconductor layers 210 exposed in the source/drain recesses 250. For example, a first etching process is performed that selectively etches semiconductor layers 210 exposed by source/drain recesses 250 with minimal (to no) etching of semiconductor layers 215, such that gaps 254 are formed between end portions of the semiconductor layers 215 and between the end portion of the lowest semiconductor layer 215 and substrate 202 under gate spacers 247. The end portions (edges) of semiconductor layers 215 are thus suspended in the channel regions 244 under gate spacers 247 (see FIGS. 4A-4D). In some embodiments, the gaps 254 extend partially under dummy gate stacks 245. The first etching process is configured to laterally etch (e.g., along the y-direction) semiconductor layers 210, thereby reducing a length of semiconductor layers 210 along the y-direction. The first etching process is a dry etching process, a wet etching process, other suitable etching process, or combinations thereof.

Still referring to block 110 of FIG. 1A and further referring to FIGS. 8A-8D, a deposition process then forms a spacer layer over gate structures 240 and over features defining source/drain recesses 250 (e.g., semiconductor layers 215, semiconductor layers 210, and substrate 202), such as CVD, PVD, ALD, HDPCVD, MOCVD, RPCVD, PECVD, LPCVD, ALCVD, APCVD, plating, other suitable methods, or combinations thereof. The spacer layer partially (and, in some embodiments, completely) fills the source/drain recesses 250. The deposition process is configured to ensure that the spacer layer fills the gaps 254 between semiconductor layers 215 and between semiconductor layers 215 and substrate 202 under gate spacers 247. A second etching process is then performed that selectively etches the spacer layer to form inner spacers 255 as depicted in FIGS. 8A-8D with minimal (to no) etching of semiconductor layers 215, dummy gate stacks 245, gate spacers 247, or the dielectric material layer 262. In some embodiments, the spacer layer is removed from sidewalls of gate spacers 247, sidewalls of semiconductor layers 215, dummy gate stacks 245, and top surfaces of the dielectric material layer 262. The inner spacers 255 are thus formed in channel regions 244 along sidewalls of the recessed semiconductor layers 210 (see FIGS. 4A-4D).

The spacer layer (and thus inner spacers 255) includes a material that is different than a material of semiconductor layers 215, a material of gate spacers 247, and a material of the dielectric material layer 262 to achieve desired etching selectivity during the second etching process. In some embodiments, the spacer layer includes a dielectric material that includes silicon, oxygen, carbon, nitrogen, other suitable material, or combinations thereof (for example, silicon oxide, silicon nitride, silicon oxynitride, silicon carbide, or silicon oxycarbonitride). In some embodiments, the spacer layer includes a low-k dielectric material, such as those described herein. In some embodiments, dopants (for example, p-type dopants, n-type dopants, or combinations thereof) are introduced into the dielectric material, such that spacer layer includes a doped dielectric material.

Referring to block 114 of FIG. 1A and to FIGS. 9A-9D, epitaxial source/drain features 260A and 260B are formed in source/drain recesses 250. For example, a semiconductor material is epitaxially grown from the semiconductor layers 215 exposed by source/drain recesses 250, forming epitaxial source/drain features 260A in source/drain regions 242 of the n-type transistor regions and epitaxial source/drain features 260B in source/drain regions 242 of p-type transistor regions (see FIGS. 4A-4D). An epitaxy process can use CVD deposition techniques (for example, VPE and/or UHV-CVD), molecular beam epitaxy, other suitable epitaxial growth processes, or combinations thereof. The epitaxy process can use gaseous and/or liquid precursors, which interact with the composition of the semiconductor layer stack 205 (in particular, semiconductor layers 215). Epitaxial source/drain features 260A, 260B are doped with n-type dopants and/or p-type dopants. In some embodiments, for the n-type transistors, epitaxial source/drain features 260A include silicon. Epitaxial source/drain features 260A can be doped with carbon, phosphorous, arsenic, other n-type dopant, or combinations thereof (for example, forming Si:C epitaxial source/drain features, Si:P epitaxial source/drain features, or Si:C:P epitaxial source/drain features). In some embodiments, for the p-type transistors, epitaxial source/drain features 260B include silicon germanium or germanium. Epitaxial source/drain features 260B can be doped with boron, other p-type dopant, or combinations thereof (for example, forming Si:Ge:B epitaxial source/drain features). In some embodiments, epitaxial source/drain features 260A and/or epitaxial source/drain features 260B include more than one epitaxial semiconductor layer, where the epitaxial semiconductor layers can include the same or different materials, same or different dopants, and same or different dopant concentrations. In some embodiments, epitaxial source/drain features 260A, 260B include materials and/or dopants that achieve desired tensile stress and/or compressive stress in respective channel regions 244 (see FIGS. 4A-4D). In some embodiments, epitaxial source/drain features 260A, 260B are doped during deposition by adding impurities to a source material of the epitaxy process (i.e., in-situ). In some embodiments, epitaxial source/drain features 260A, 260B are doped by an ion implantation process subsequent to a deposition process. In some embodiments, annealing processes (e.g., rapid thermal annealing (RTA) and/or laser annealing) are performed to activate dopants in epitaxial source/drain features 260A, 260B and/or other source/drain regions (for example, heavily doped source/drain regions and/or lightly doped source/drain (LDD) regions). In some embodiments, epitaxial source/drain features 260A, 260B are formed in separate processing sequences that include, for example, masking p-type transistor regions when forming epitaxial source/drain features 260A in n-type transistor regions and masking n-type transistor regions when forming epitaxial source/drain features 260B in p-type transistor regions.

Figure 9A:
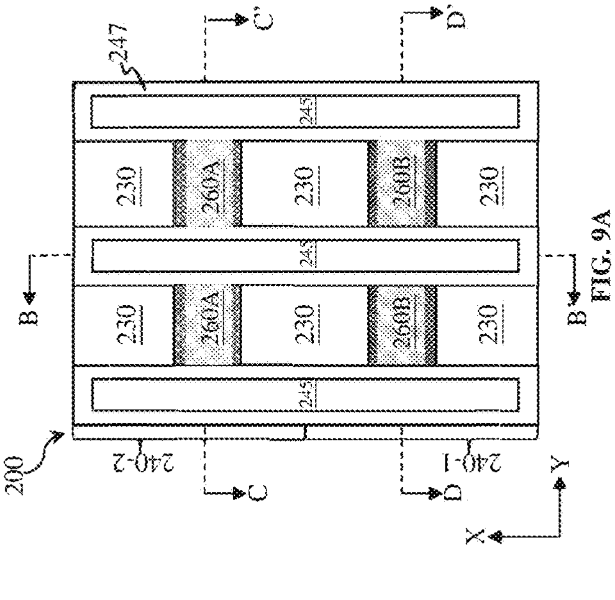
Figure 9B:
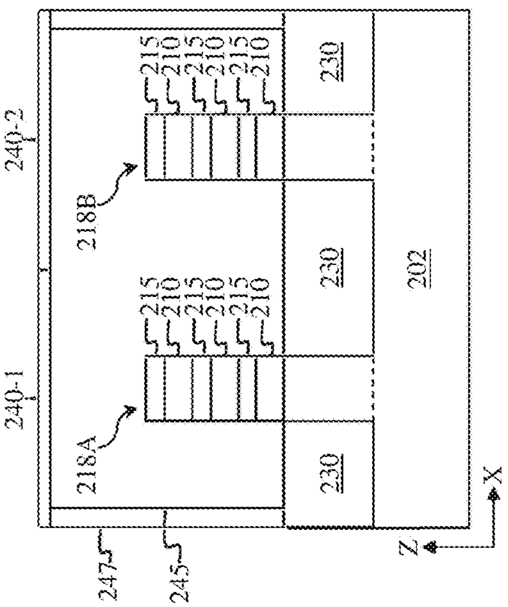
Figure 9C:
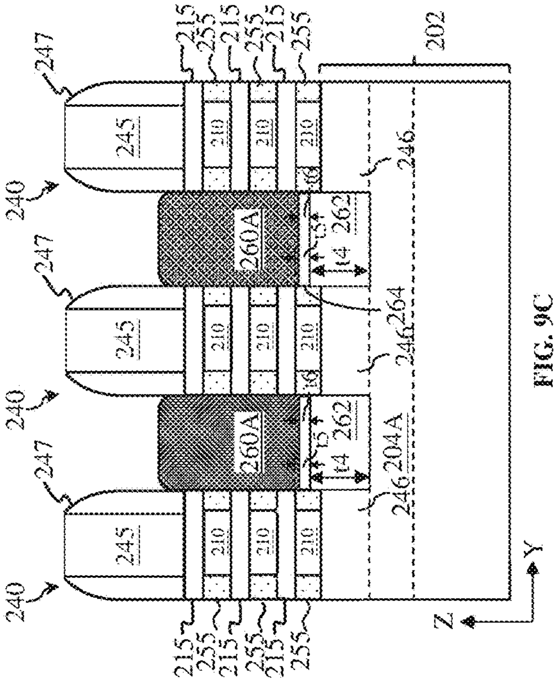
Figure 9D:
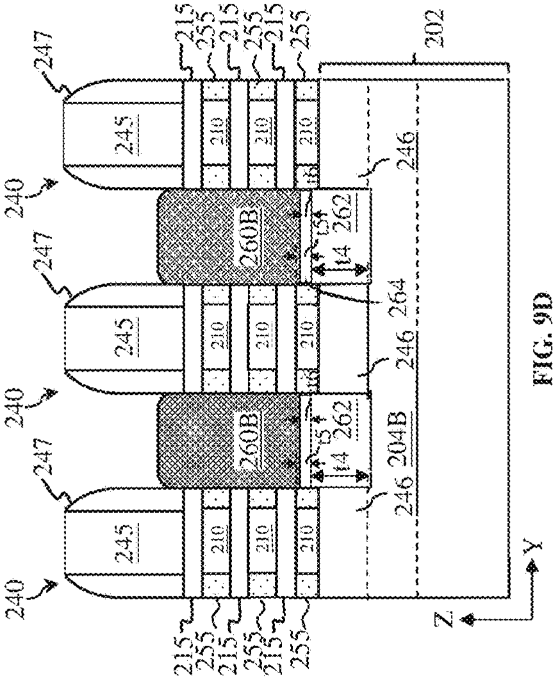
Figure 9E:
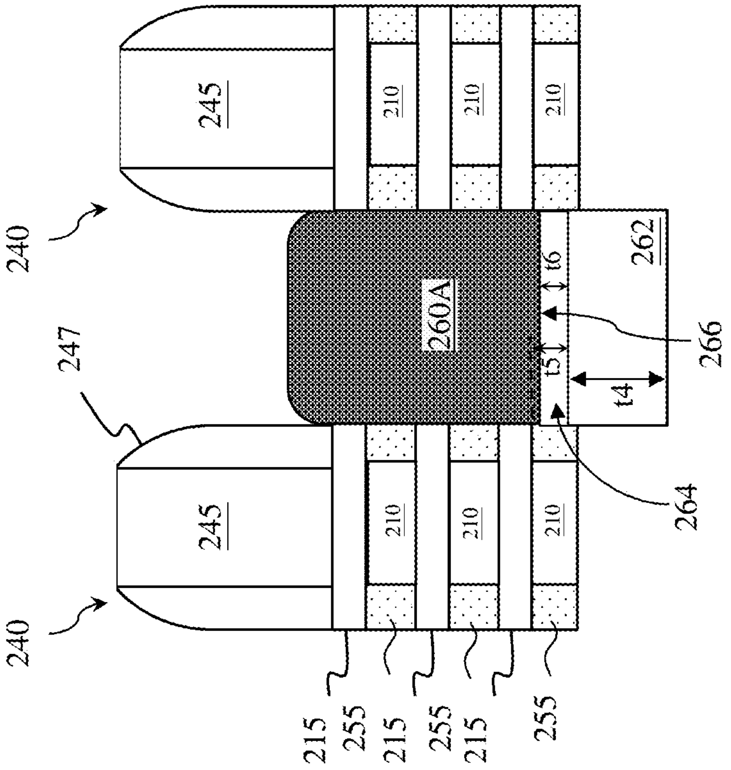
FIG. 9E is an expanded view illustrating air gap of the multigate device of FIG. 9A.
Figure 9F:
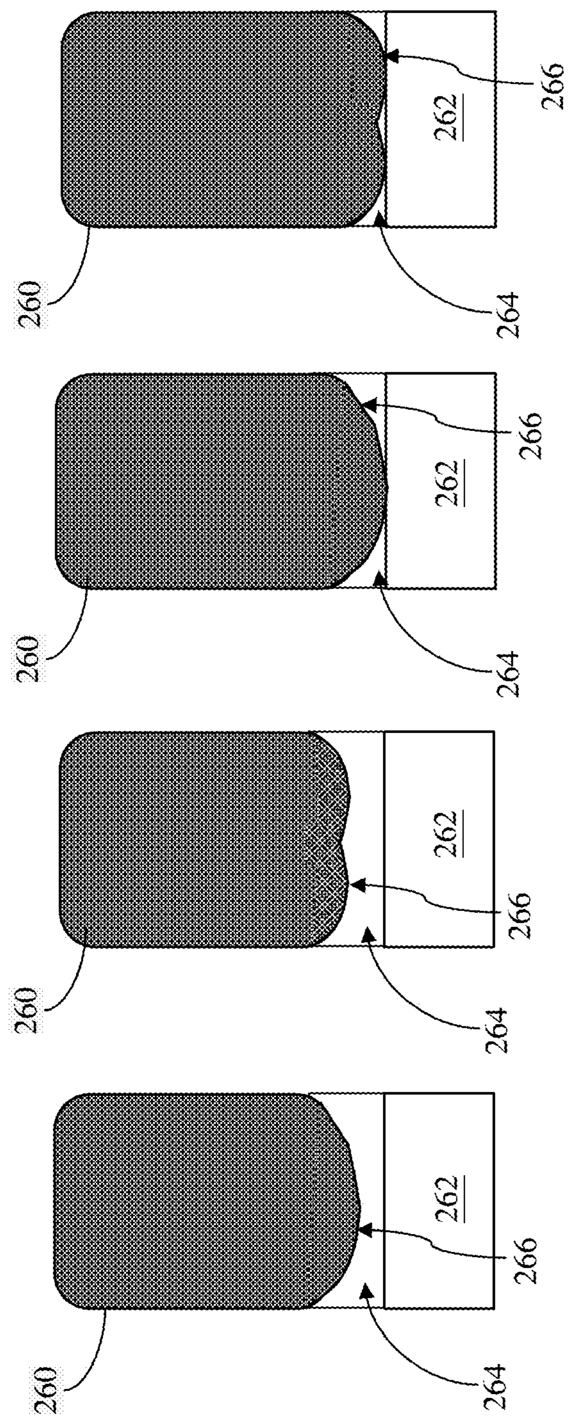
FIG. 9F illustrate profiles of the bottom surface of the air gap of the multigate device of FIG. 9A.
Figure 10A:
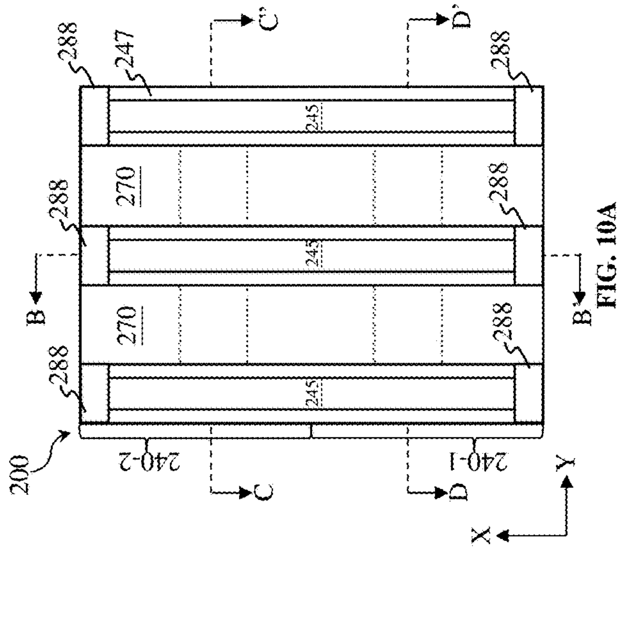
Figure 10B:
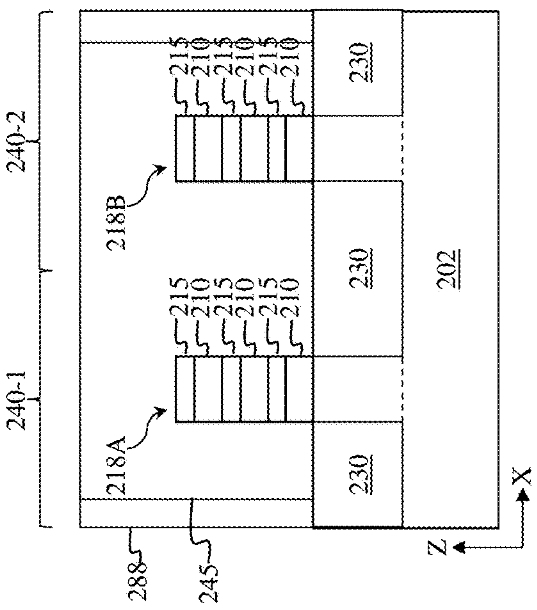
Figure 10C:
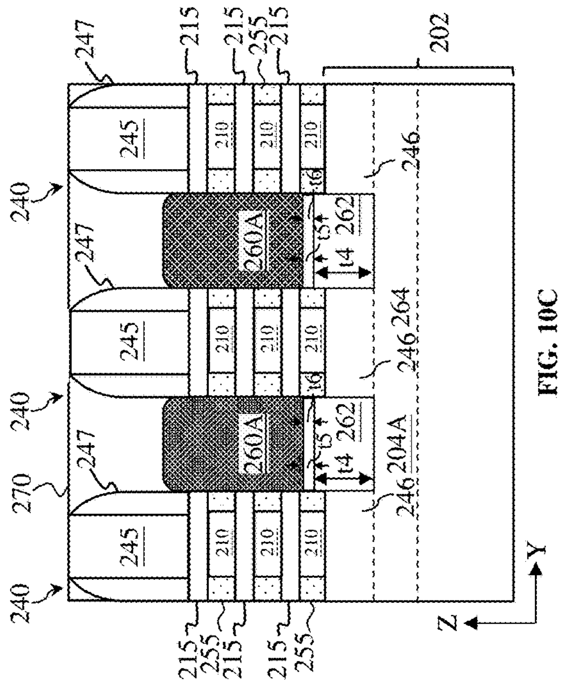
Figure 10D:
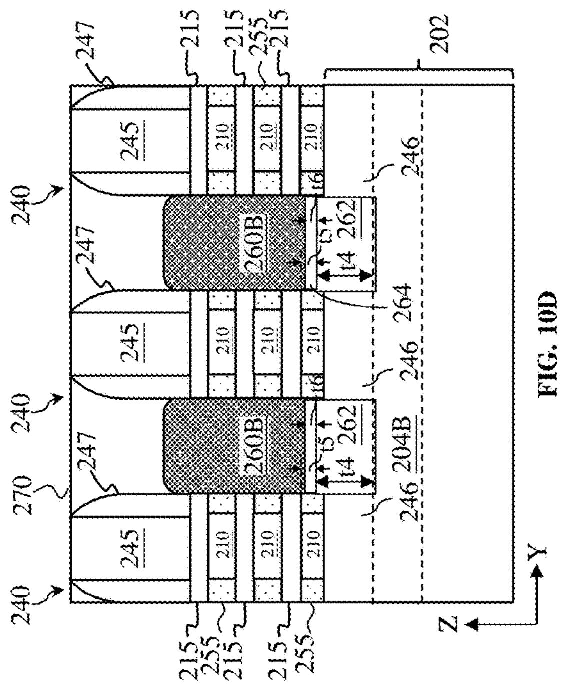
Figures 11A, 11B, 11C, 11D:
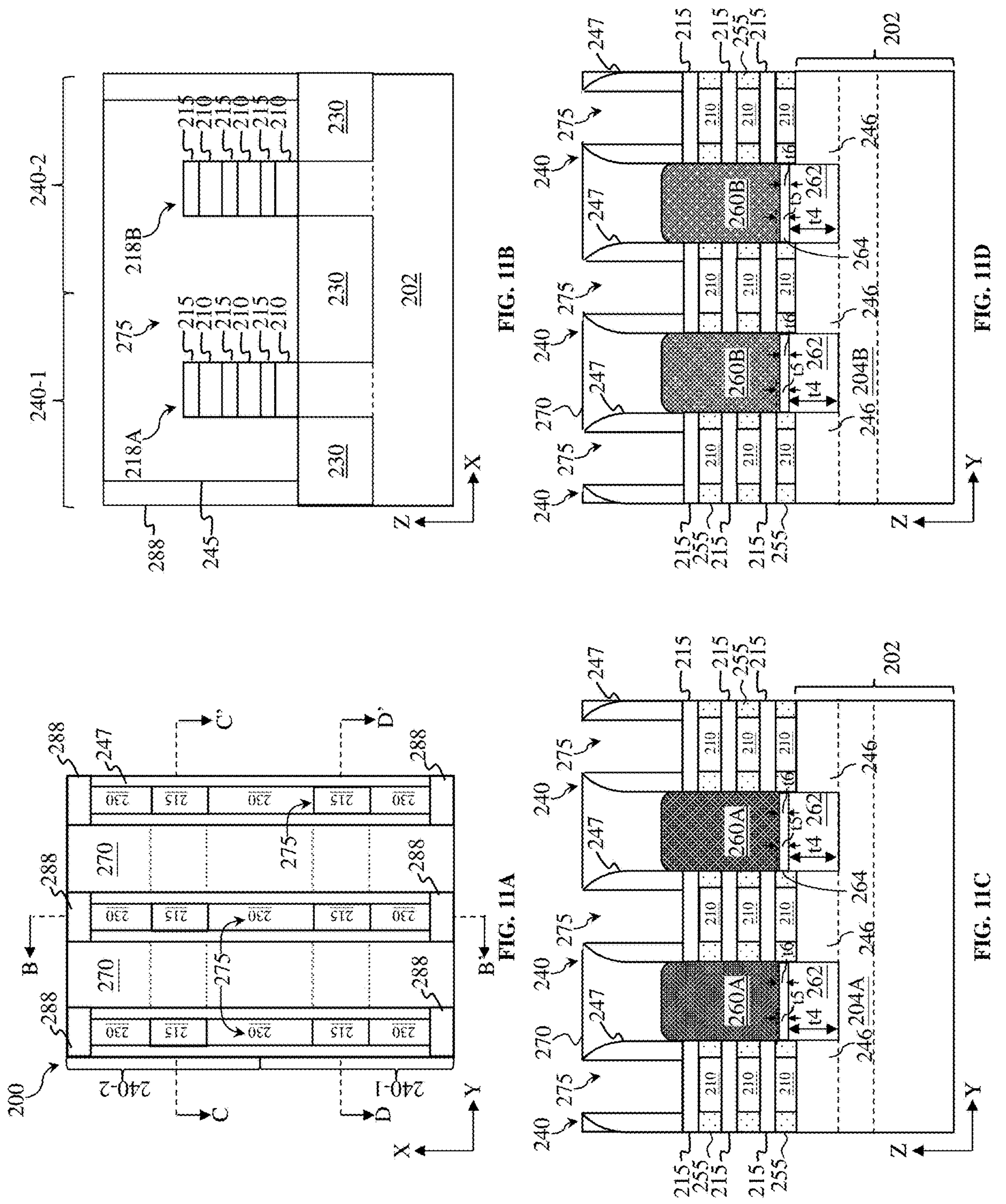
Figures 12A, 12B, 12C, 12D:
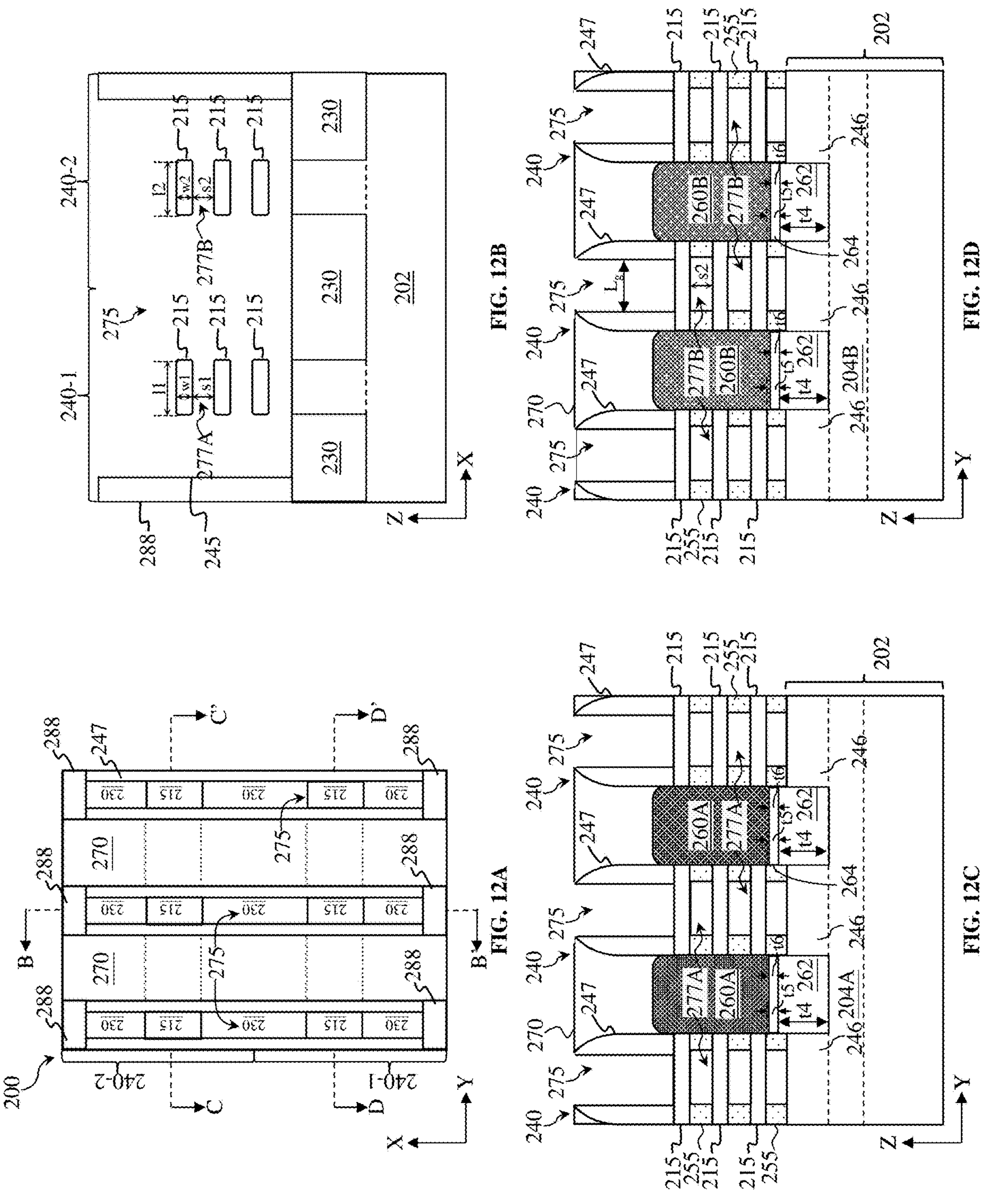
Figure 13A:
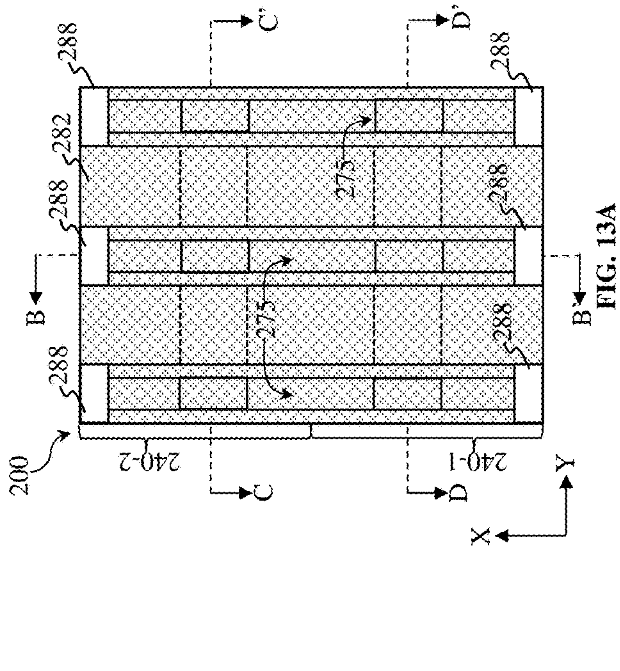
Figure 13B:
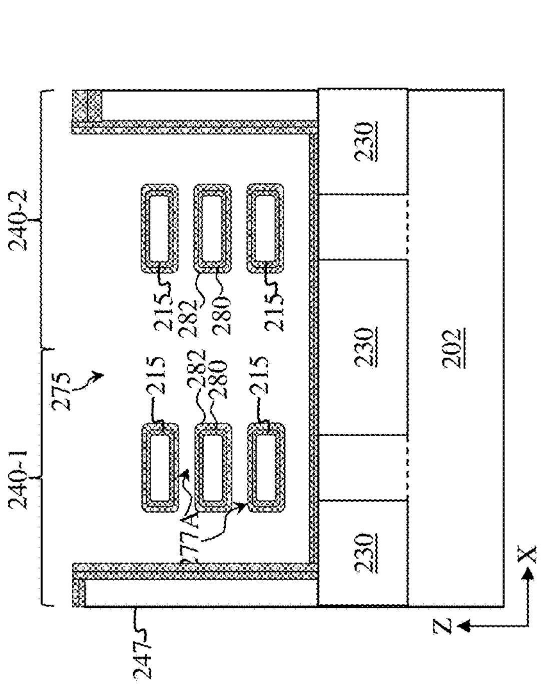
Figure 13C:
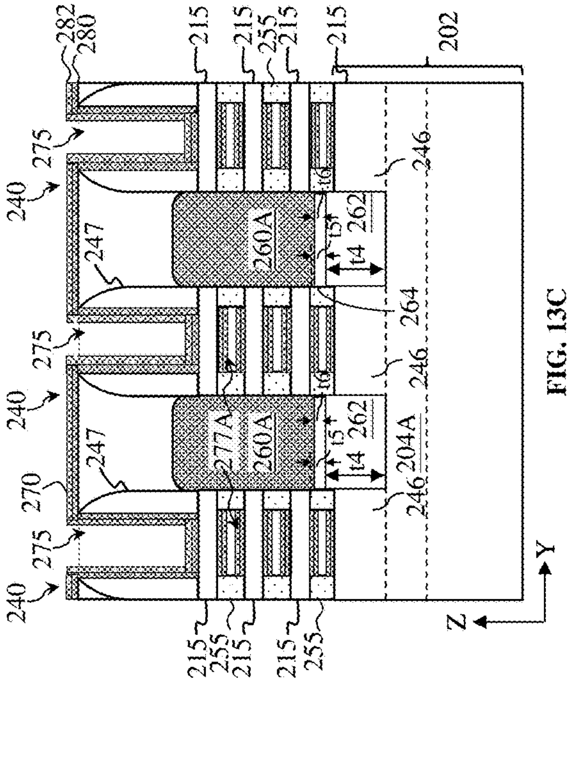
Figure 13D:
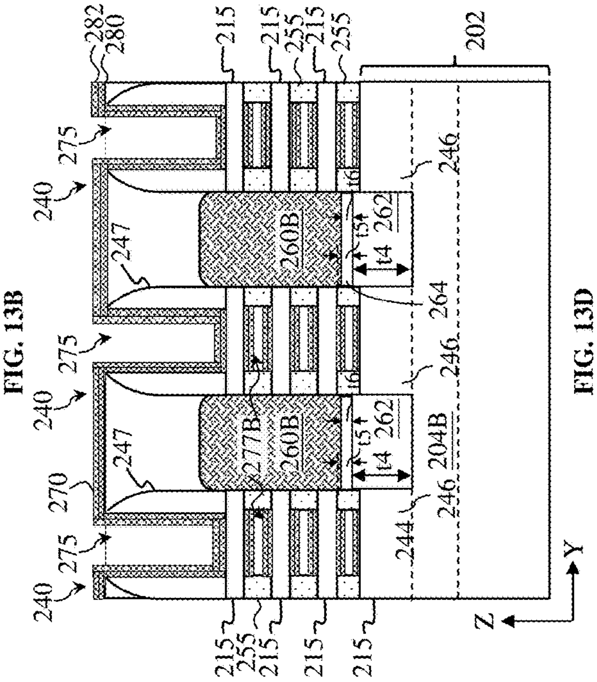
Figures 14A, 14B, 14C, 14D:
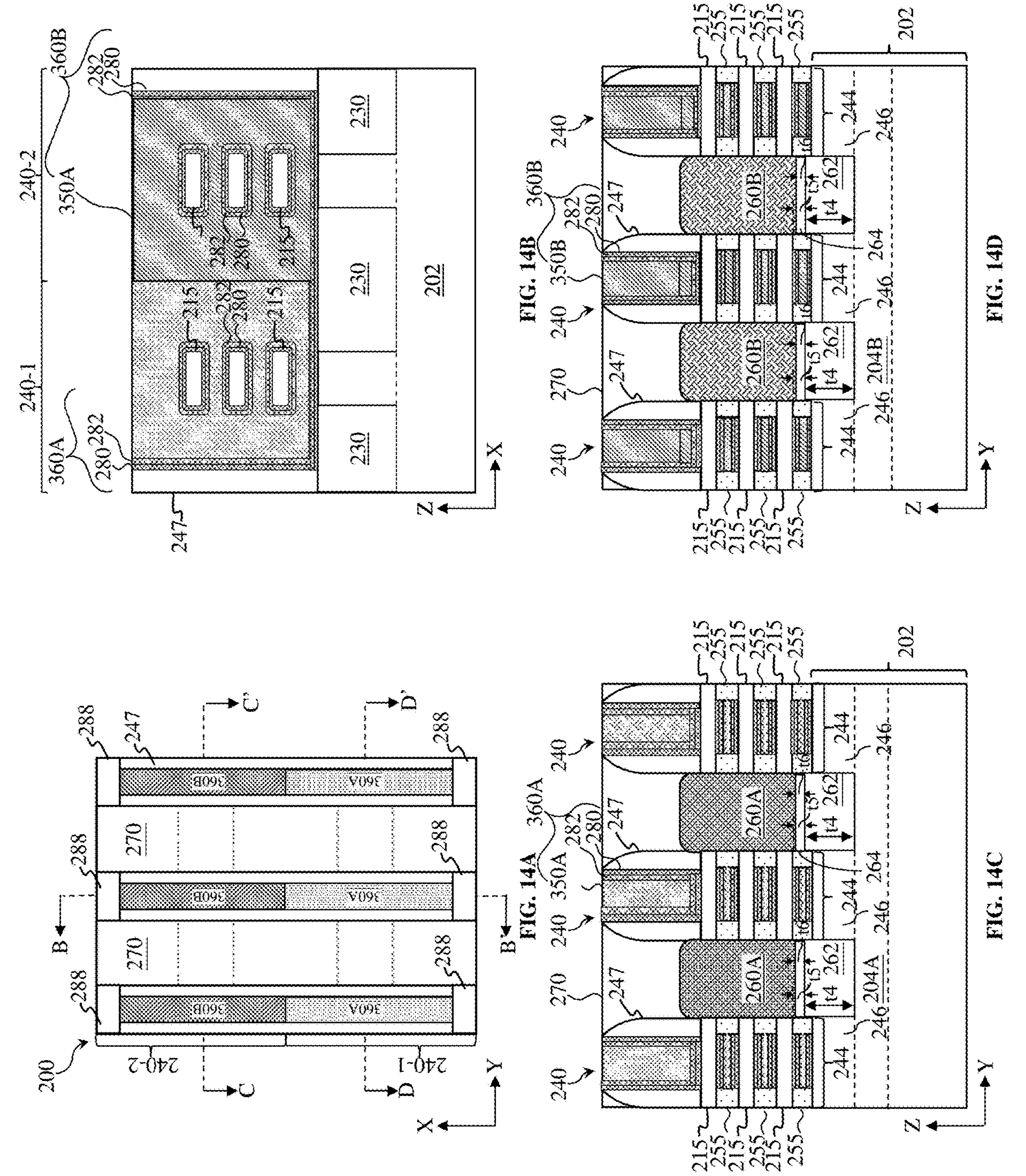
Figures 15A, 15B, 15C, 15D:
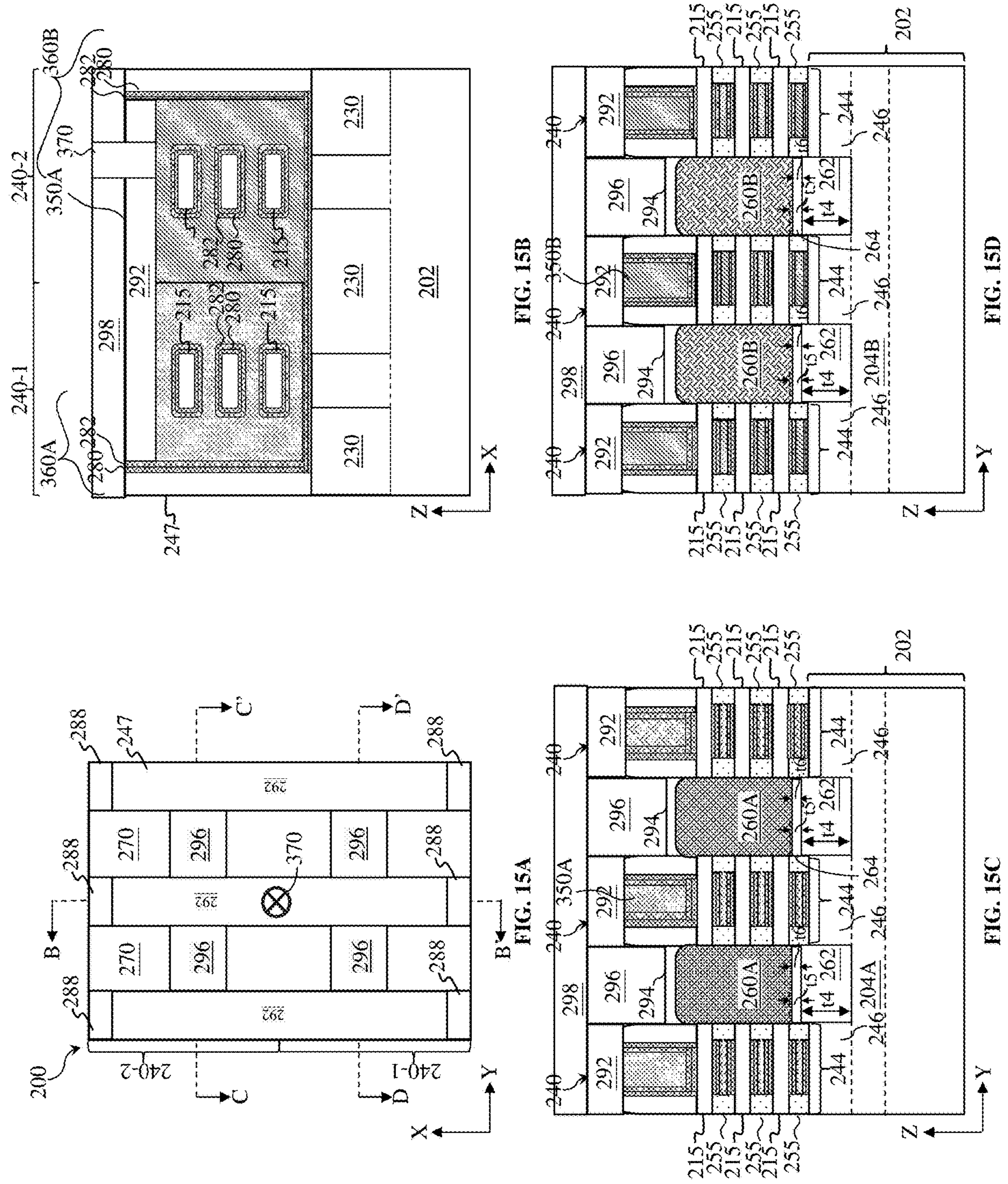

As illustrated in FIGS. 9A-9D, the epitaxy process described above may leave an air gap between the top surface of the dielectric material layer 262 and the bottom surface of the source/drain features 260A, 260B. For example, the epitaxy process grows selectively from a semiconductor material surface (such as the sidewall surfaces of the exposed semiconductor layers 215), and not from a dielectric material surface (such as the top surface of the dielectric material layer 262 and the sidewall surfaces of the exposed inner spacers 255). Accordingly, the growth process initiates from sidewall surfaces of the semiconductor layers 215 (e.g. at discrete sections of the two opposing sides of the source/drain recesses 250) and merges in the middle of the source/drain recesses 250. In some embodiments, the precursors for the epitaxy process are provided from above the source/drain recesses 250. As a result, the growth downwards (e.g. from a bottom edge of the semiconductor layers 215 towards the dielectric material layer 262) may be limited. Accordingly, the space between the bottom surface of the lowest semiconductor layers 215 and the dielectric material layer 262 may not be filled entirely. Air gaps 264 are formed therein. In some embodiments, the air gaps 264 vertically interpose between the source/drain features 260A, 260B and the top surface of the bottom channel 246. Accordingly, charge carriers are prevented from migrating from the source/drain features 260A, 260B into the bottom channel 246. Because air has a much smaller dielectric constant as compared to the dielectric material layer 262, the air gap may provide further and better electric insulation than the dielectric material layer 262 alone. As a result, the leakage current described above is largely mitigated. In some embodiments, by adjusting the parameters of the epitaxy processes, the bottom surface of the source/drain features 260A, 260B (or the top surface of the air gap 264) may be configured with suitable profiles. FIG. 9E is an expanded view of the relevant region illustrating the air gap 264. Although FIGS. 9C-9E depicts the source/drain features 260A, 260B as having a flat bottom surface and the air gap 264 as having a flat top surface, they may alternatively have various other profiles. Referring to FIG. 9F, the bottom surface of the source/drain features 260A, 260B (collectively source/drain features 260) may have a profile that resembles the letter U or the letter W. In some embodiments, the source/drain features 260 do not interface with the dielectric material layer 262. In some other embodiments, the source/drain features 260 interface with the dielectric material layer 262 at one or more points. Moreover, although not specifically depicted, the disclosure contemplates a bottom surface of the source/drain features 260 having a profile different from those of FIG. 9F. In the depicted embodiments, the gap has a thickness (or averaged thickness) t6. Accordingly, the thickness t6 may be constrained by and is less than the thickness t5. In some embodiments, the thickness t6 is about 2 nm to about 15 nm. If the thickness t6 is too small, such as less than 2 nm, the effectiveness of the air gap in preventing the current leakage may be reduced.

Referring to block 116 of FIG. 1A and to FIGS. 10A-10D, an inter-level dielectric (ILD) layer 270 is formed over isolation features 230, epitaxial source/drain features 260A, 260B, and gate spacers 247, for example, by a deposition process (such as CVD, PVD, ALD, HDPCVD, MOCVD, RPCVD, PECVD, LPCVD, ALCVD, APCVD, plating, other suitable methods, or combinations thereof). ILD layer 270 is disposed between adjacent gate structures 240. In some embodiments, ILD layer 270 is formed by a flowable CVD (FCVD) process that includes, for example, depositing a flowable material (such as a liquid compound) over device 200 and converting the flowable material to a solid material by a suitable technique, such as thermal annealing and/or ultraviolet radiation treating. ILD layer 270 includes a dielectric material including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SILK (Dow Chemical, Midland, Mich.), polyimide, other low-k dielectric material, or combinations thereof. In the depicted embodiment, ILD layer 270 is a dielectric layer that includes a low-k dielectric material (generally referred to as a low-k dielectric layer). ILD layer 270 can include a multilayer structure having multiple dielectric materials. In some embodiments, a contact etch stop layer (CESL) is disposed between ILD layer 270 and isolation features 230, epitaxial source/drain features 260A, 260B, and gate spacers 247. The CESL includes a material different than ILD layer 270, such as a dielectric material that is different than the dielectric material of ILD layer 270. For example, where ILD layer 270 includes a low-k dielectric material, the CESL includes silicon and nitrogen, such as silicon nitride or silicon oxynitride. Subsequent to the deposition of ILD layer 270 and/or the CESL, a CMP process and/or other planarization process can be performed until reaching (exposing) a top portion (or top surface) of dummy gate stacks 245. In some embodiments, the planarization process removes hard mask layers of dummy gate stacks 245 to expose underlying dummy gate electrodes of dummy gate stacks 245, such as polysilicon gate electrode layers.

ILD layer 270 may be a portion of a multilayer interconnect (MLI) feature disposed over substrate 202. The MLI feature electrically couples various devices (for example, p-type transistors and/or n-type transistors of device 200, transistors, resistors, capacitors, and/or inductors) and/or components (for example, gate structures and/or epitaxial source/drain features of p-type transistors and/or n-type transistors), such that the various devices and/or components can operate as specified by design requirements of device 200. The MLI feature includes a combination of dielectric layers and electrically conductive layers (e.g., metal layers) configured to form various interconnect structures. The conductive layers are configured to form vertical interconnect features, such as device-level contacts and/or vias, and/or horizontal interconnect features, such as conductive lines. Vertical interconnect features typically connect horizontal interconnect features in different layers (or different planes) of the MLI feature. During operation, the interconnect features are configured to route signals between the devices and/or the components of device 200 and/or distribute signals (for example, clock signals, voltage signals, and/or ground signals) to the devices and/or the components of device 200. Referring to block 118 of FIG. 1A and still to FIGS. 10A-10D, in some embodiments, gate end dielectrics 288 are formed on both ends of the gate structures 240 using any suitable methods. However, in some embodiments, the gate end dielectrics 288 are omitted.

Referring to block 120 of FIG. 1A and to FIGS. 11A-11D, dummy gate stacks 245 are removed from gate structures 240, thereby exposing semiconductor layer stacks 205 of fins 218A, 218B in n-type gate regions 240-1 and p-type gate regions 240-2. In the depicted embodiment, an etching process completely removes dummy gate stacks 245 to expose semiconductor layers 215 and semiconductor layers 210 in channel regions 244 (see FIGS. 4A-4D). The etching process is a dry etching process, a wet etching process, other suitable etching process, or combinations thereof. In some embodiments, the etching process is a multi-step etch process. For example, the etching process may alternate etchants to separately remove various layers of dummy gate stacks 245, such as the dummy gate electrode layers, the dummy gate dielectric layers, and/or the hard mask layers. In some embodiments, the etching process is configured to selectively etch dummy gate stacks 245 with minimal (to no) etching of other features of device 200, such as ILD layer 270, gate spacers 247, isolation features 230, semiconductor layers 215, and semiconductor layers 210. In some embodiments, a lithography process, such as those described herein, is performed to form a patterned mask layer that covers ILD layer 270 and/or gate spacers 247, and the etching process uses the patterned mask layer as an etch mask. In the depicted embodiments, the removal of the dummy gate stacks 245 forms gate trenches 275.

Referring to block 122 of FIG. 1A and to FIGS. 12A-12D, semiconductor layers 210 of semiconductor layer stack 205 (exposed by gate trenches 275) are selectively removed from channel regions 244 (see FIGS. 4A-4D), thereby forming suspended semiconductor layers 215 in channel regions 244. In the depicted embodiment, an etching process selectively etches semiconductor layers 210 with minimal (to no) etching of semiconductor layers 215 and, in some embodiments, minimal (to no) etching of gate spacers 247 and/or inner spacers 255. Various etching parameters can be tuned to achieve selective etching of semiconductor layers 210, such as etchant composition, etching temperature, etching solution concentration, etching time, etching pressure, source power, RF bias voltage, RF bias power, etchant flow rate, other suitable etching parameters, or combinations thereof. For example, an etchant is selected for the etching process that etches the material of semiconductor layers 210 (in the depicted embodiment, silicon germanium) at a higher rate than the material of semiconductor layers 215 (in the depicted embodiment, silicon) (i.e., the etchant has a high etch selectivity with respect to the material of semiconductor layers 210). The etching process is a dry etching process, a wet etching process, other suitable etching process, or combinations thereof. In some embodiments, a dry etching process (such as an RIE process) utilizes a fluorine-containing gas (for example, $SF_6$) to selectively etch semiconductor layers 210. In some embodiments, a ratio of the fluorine-containing gas to an oxygen-containing gas (for example, $O_2$), an etching temperature, and/or an RF power may be tuned to selectively etch silicon germanium or silicon. In some embodiments, a wet etching process utilizes an etching solution that includes ammonium hydroxide ($NH_4OH$) and water ($H_2O$) to selectively etch semiconductor layers 210. In some embodiments, a chemical vapor phase etching process using hydrochloric acid (HCl) selectively etches semiconductor layers 210.

At least one suspended semiconductor layer 215 is thus exposed in n-type gate regions 240-1 and p-type gate regions 240-2 by gate trenches 275. In the depicted embodiment, each n-type gate region 240-1 and each p-type gate region 240-2 includes three suspended semiconductor layers 215 vertically stacked that will provide three channels through which current will flow between respective epitaxial source/drain features (epitaxial source/drain features 260A or epitaxial source/drain features 260B) during operation of the transistors. Suspended semiconductor layers 215 are thus interchangeably referred to as channel layers 215 hereinafter. Channel layers 215 in n-type gate regions 240-1 are separated by gaps 277A, and channel layers 215 in p-type gate regions 240-2 are separated by gaps 277B. Channel layers 215 in n-type gate regions 240-1 are also separated from substrate 202 by gaps 277A, and channel layers 215 in p-type gate regions 240-2 are also separated by gaps 277B. A spacing s1 is defined between channel layers 215 along the z-direction in n-type gate regions 240-1, and a spacing s2 is defined between channel layers 215 along the z-direction in p-type gate regions 240-2. Spacing s1 and spacing s2 correspond with a width (or height) of gaps 277A and gaps 277B along the Z-direction, respectively. In the depicted embodiments, spacing s1 is about equal to s2, though the present disclosure contemplates embodiments where spacing s1 is different than spacing s2. In some embodiments, spacing s1 and spacing s2 are both about equal to thickness t1 of semiconductor layers 210. Further, channel layers 215 in n-type gate regions 240-1 have a length l1 along the x-direction and a width w1 along the y-direction, and channel layers 215 in p-type gate regions 240-2 have a length l2 along the y-direction and a width w2 along the x-direction. In the depicted embodiment, length l1 is about equal to length l2, and width w1 is about equal to width w2, though the present disclosure contemplates embodiments where length l1 is different than length l2 and/or width w1 is different than width w2. In some embodiments, length l1 and/or length l2 is about 10 nm to about 50 nm. In some embodiments, width w1 and/or width w2 is about 4 nm to about 10 nm. In some embodiments, each channel layer 215 has nanometer-sized dimensions and can be referred to as a "nanowire," which generally refers to a channel layer suspended in a manner that will allow a metal gate to physically contact at least two sides of the channel layer, and in GAA transistors, will allow the metal gate to physically contact at least four sides of the channel layer (i.e., surround the channel layer). In such embodiments, a vertical stack of suspended channel layers can be referred to as a nanostructure, and the process depicted in FIGS. 10A-10D can be referred to as a channel nanowire release process. In some embodiments, after removing semiconductor layers 210, an etching process is performed to modify a profile of channel layers 215 to achieve desired dimensions and/or desired shapes (e.g., cylindrical-shaped (e.g., nanowire), rectangular-shaped (e.g., nanobar), sheet-shaped (e.g., nanosheet), etc.). The present disclosure further contemplates embodiments where the channel layers 215 (nanowires) have sub-nanometer dimensions depending on design requirements of device 200.

Referring to block 124 of FIG. 1B and to FIGS. 13A-13D, a gate dielectric layer is formed over device 200, where the gate dielectric layer partially fills gate trenches 275 and wraps (surrounds) channel layers 215 in n-type gate regions 240-1 and p-type gate regions 240-2 of the gate structures 240. In the depicted embodiments, the gate dielectric layer includes an interfacial layer 280 and a high-k dielectric layer 282, where interfacial layer 280 is disposed between the high-k dielectric layer 282 and channel layers 215. In furtherance of the depicted embodiment, interfacial layer 280 and high-k dielectric layer 282 partially fill gaps 277A between channel layers 215 and between channel layers 215 and substrate 202 in n-type gate regions 240-1 and partially fill gaps 277B between channel layers 215 and between channel layers 215 and substrate 202 in p-type gate regions 240-2. In some embodiments, interfacial layer 280 and/or high-k dielectric layer 282 are also disposed on substrate 202, isolation features 230, and/or gate spacers 247. Interfacial layer 280 includes a dielectric material, such as $SiO_2$, HfSiO, SiON, other silicon-comprising dielectric material, other suitable dielectric material, or combinations thereof. High-k dielectric layer 282 includes a high-k dielectric material, such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), (Ba,Sr)$TiO_3$ (BST), $Si_3N_4$, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide (k≈3.9). Interfacial layer 280 is formed by any of the processes described herein, such as thermal oxidation, chemical oxidation, ALD, CVD, other suitable process, or combinations thereof. In some embodiments, interfacial layer 280 has a thickness of about 0.5 nm to about 3 nm. High-k dielectric layer 282 is formed by any of the processes described herein, such as ALD, CVD, PVD, oxidation-based deposition process, other suitable process, or combinations thereof. In some embodiments, high-k dielectric layer 282 has a thickness of about 1 nm to about 2 nm.

Referring to blocks 126 and 128 of FIG. 1B and to FIGS. 14A-14D, a gate electrode layer is formed over the high-k gate dielectric layer 228 and fills the remaining spaces of the gate trenches. For example, the gate electrode layer may include any suitable materials, such as titanium nitride (TiN), tantalum nitride (TaN), titanium aluminide (TiAl), titanium aluminum nitride (TiAlN), tantalum aluminide (TaAl), tantalum aluminum nitride (TaAlN), tantalum aluminum carbide (TaAlC), tantalum carbonitride (TaCN), aluminum (Al), tungsten (W), copper (Cu), cobalt (Co), nickel (Ni), platinum (Pt), or combinations thereof. In some embodiments, the gate electrode layers include suitable materials to achieve desired work functions. Further, portions of the same gate electrode layers in different regions (such as an n-type device region or a p-type transistor region) may include different materials and thus may be formed in separate steps or sub-steps. For example, the gate electrode layers (or portions thereof) 350A in the p-type doped regions 204A include an n-type work function metal with a work function of about 4.0 eV to about 4.6 eV; and/or the gate electrode layers (or portions thereof) 350B in the n-type doped regions 204B include a p-type work function metal with a work function of about 4.5 eV to about 5.2 eV. In some embodiments, a CMP is performed to expose a top surface of the ILD 270. The gate dielectric layer (e.g. including the interfacial layer 280 and the high-k dielectric layer 282) and the gate electrode layer 350A collectively form the high-k metal gates (HKMG) 360A; the gate dielectric layer and the gate electrode layer 350B collectively form the HKMG 360B. The HKMG 360A, 360B each engage multiple channel layers 215 such that charge carriers may flow between the source/drain features 260A and between the source/drain features 260B through the respective channel layers 215. In the depicted embodiment, gate structures 240 are thus configured with two different metal gate portions—n-metal gates 360A in n-type gate regions 240-1 and p-metal gates 360B in p-type gate regions 240-2. A planarization process is performed to remove excess gate materials from device 200. For example, a CMP process is performed until a top surface of ILD layer 270 is reached (exposed), such that a top surface of gate structures 240 are substantially planar with a top surface of ILD layer 270 after the CMP process. Accordingly, device 200 includes n-type transistors having HKMG 360A wrapping respective channel layers 215, such that HKMG 360A are disposed between respective epitaxial source/drain features 260A, and p-type transistors having HKMG 360B wrapping respective channel layers 215, such that HKMG 360B are disposed between respective epitaxial source/drain features 260B. Although FIG. 1B illustrate processing the n-type gate region prior to the processing of the p-type gate region, the disclosure contemplates any other suitable sequences.

Referring to block 130 of FIG. 1B and to FIGS. 15A-15D, processing proceeds to continue fabrication of device 200. For example, gate top hard mask layers 292 are formed on top of the gate structures 240, such that the gate top hard mask layer 292 overlays on the gate electrode layers 350A, 350B, respectively. In some embodiments, the gate top hard mask layer 292 includes a dielectric material such as silicon nitride or high-k dielectric material. In some embodiments, the gate top hard mask layer 292 protects the gate electrode layer in subsequent etching operations. Additionally, contacts 296 are formed on the source/drain features 260A, 260B, respectively. The contacts 296 can be formed to facilitate operation of the n-type transistors and the p-type transistors. For example, one or more ILD layers, similar to ILD layer 270, and/or CESL layers can be formed over substrate 202 (in particular, over ILD layer 270 and gate structures 240). Contacts can then be formed in ILD layer 270 and/or ILD layers disposed over ILD layer 270. For example, contacts are respectively electrically and/or physically coupled with gate structures 240 and contacts are respectively electrically and/or physically coupled to source/drain regions of the n-type transistors and the p-type transistors (particularly, epitaxial source/drain features 260A, 260B). Contacts include a conductive material, such as metal. Metals include aluminum, aluminum alloy (such as aluminum/silicon/copper alloy), copper, copper alloy, titanium, titanium nitride, tantalum, tantalum nitride, tungsten, polysilicon, other suitable metals, or combinations thereof. In the depicted embodiments, metal silicide layers 294 are formed between the contacts 296 and the respective source/drain features 260A and 260B, respectively. For example, the metal silicide layers 294 may include nickel silicide, cobalt silicide, tungsten silicide, tantalum silicide, titanium silicide, platinum silicide, erbium silicide, palladium silicide, or combinations thereof. In some implementations, ILD layers disposed over ILD layer 270 and the contacts (for example, extending through ILD layer 270 and/or the other ILD layers) are a portion of the MLI feature described above. Another ILD layer 298 is formed on top of the device 200. For example, the ILD layer 298 may be formed on top surfaces of the contacts 296 and on the gate top hard mask layer 292. A gate via 370 is formed on top of the gate electrode layer 350A. The gate via 370 is configured to extend through the gate top hard mask layers 292 and the ILD layer 298 to couple the gate electrode layer 350A to an overlaying conductive line 380.

Referring to FIGS. 16A-16E, conductive vias are formed in the ILD layer 298. For example, conductive vias 394 are formed on top of the contact 296 that connects to the source/drain feature 260A; and conductive vias 392 are formed on top of the contact 296 that connects to the source/drain feature 260B. Moreover, another ILD layer 390 may be formed on top of the ILD layer 298 and on top of the conductive vias 392, 394, and 370. The ILD layer 390 may sometimes be interchangeably referred to as the intermetal layer (IMD). Conductive lines 380, 382, 384, and 385 are formed in the ILD layer 390. In the depicted embodiments, the conductive linen 380 connects to the gate via 370; the conductive lines 384 connects to the conductive via 394 and to the source/drain feature 260A through the conductive via 394 and the contact 296; and the conductive lines 382 connects to the conductive via 392 and to the source/drain feature 260B through the conductive via 392 and the contact 296. In some embodiments, the conductive line 384 may be a Vss line; and the conductive line 382 may be a Vdd line.

The device 200 fabricated according to the methods 100 described above may have several distinct features. For example, referring to FIGS. 16C-16E, a dielectric material layer 262 interposes between the bottom surface of the source/drain features 260A, 260B and the top surface of the substrate 202. Moreover, an air gap 264 is formed vertically between the top surface of the substrate 202 and the bottom surface of the source/drain features 260A, 260B, for example, vertically between the top surface of the dielectric material layer 262 and the bottom surface of the source/drain features 260A, 260B. The dielectric material layer 262 and the air gap 264 (which is another dielectric material layer formed of air) each isolate the source/drain features 260A, 260B from the substrate 202.

The disclosure above provides a method of forming a dielectric material layer 262 along with an air gap 264, both at least partially for the purpose of isolating the bottom channel 246 from the adjacent source/drain features. Alternatively, however, referring to FIGS. 16A'-16D', the air gap 264 may be omitted. In such embodiments, the dielectric material layer 262 alone serves to provide the requisite isolation. In some embodiments, this may be achieved by increasing the thickness t4 such that it approaches the sum of t3 and t1, and/or reducing the distance t5 such that it approaches 0. This allows the epitaxial growth, which initiates from above the top surface of the dielectric material layer 262, to directly contact the dielectric material layer 262.

Figure 25B:
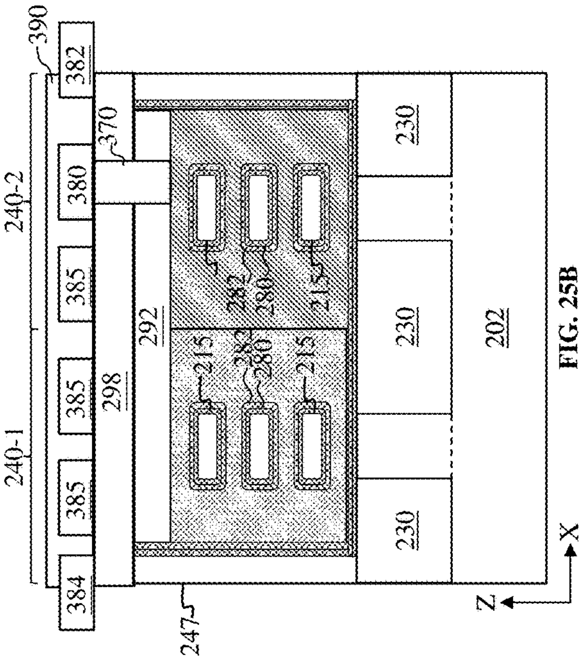
Figure 25D:
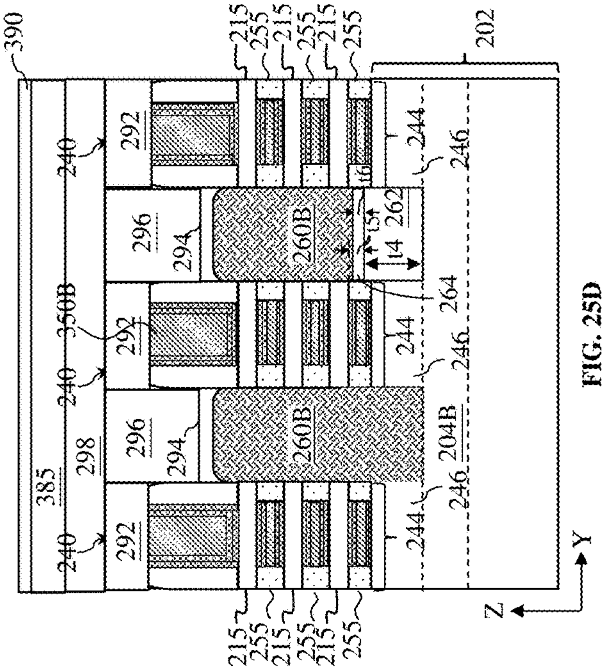
Figure 25A:
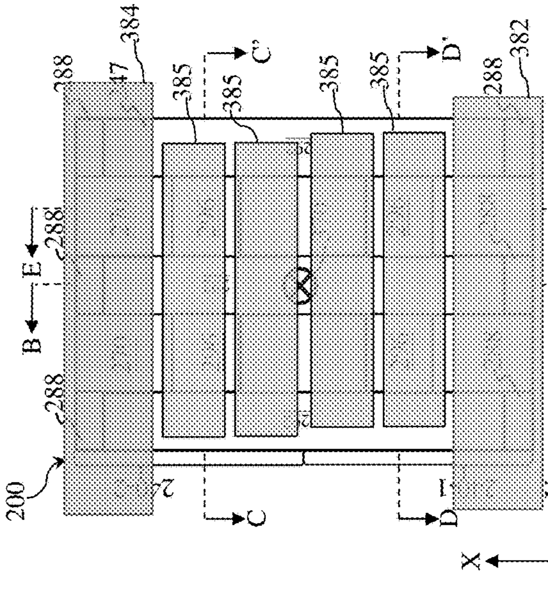
Figure 25C:
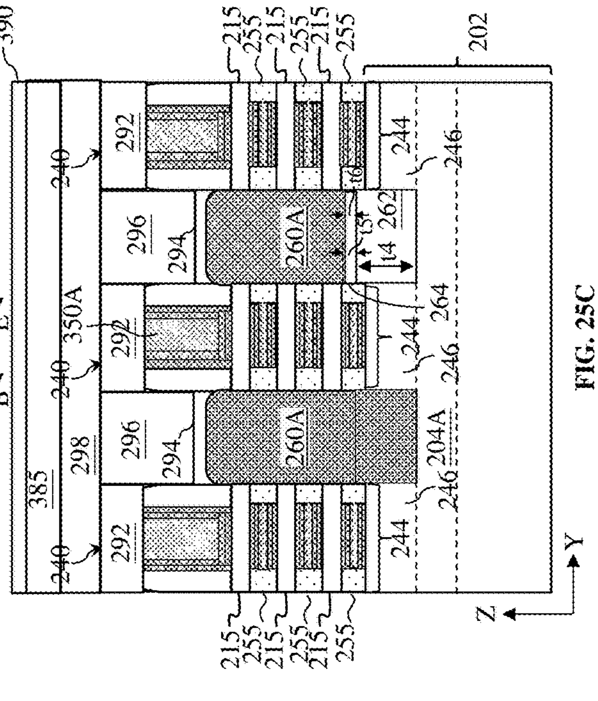
Figure 25E:
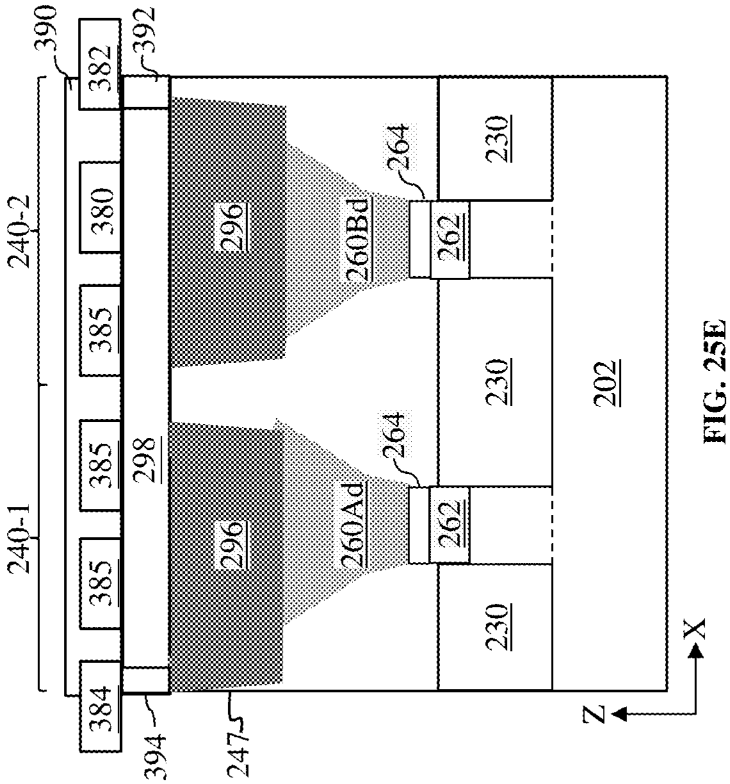
Figure 25B:
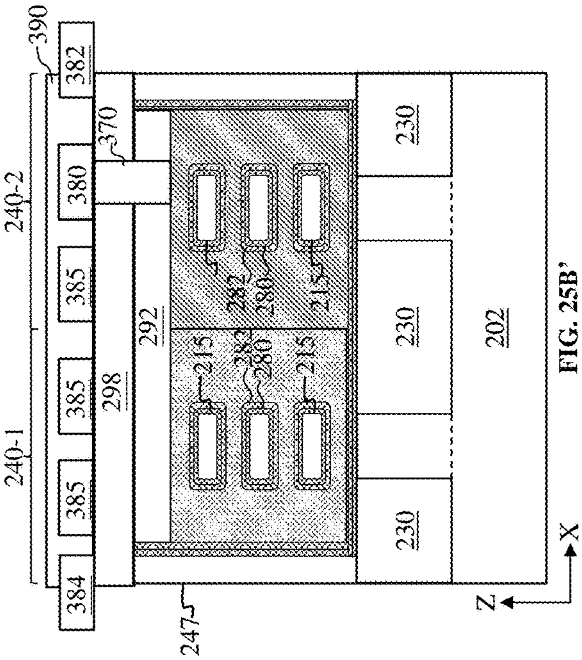
Figure 25D:
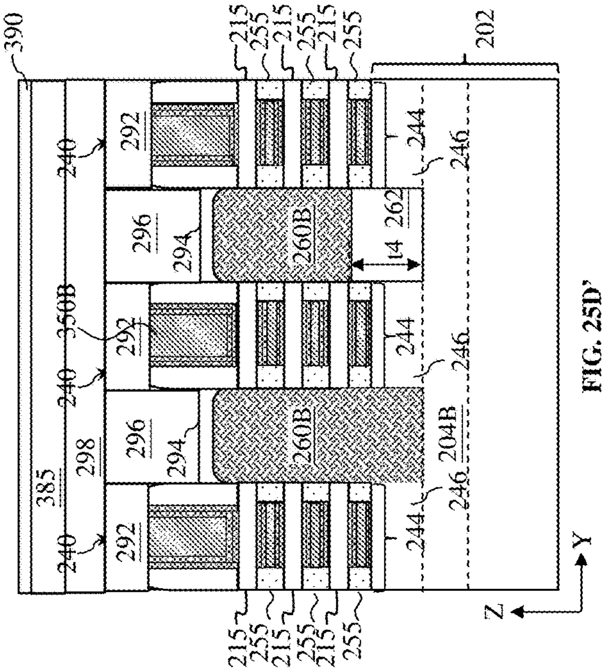
Figure 25A:
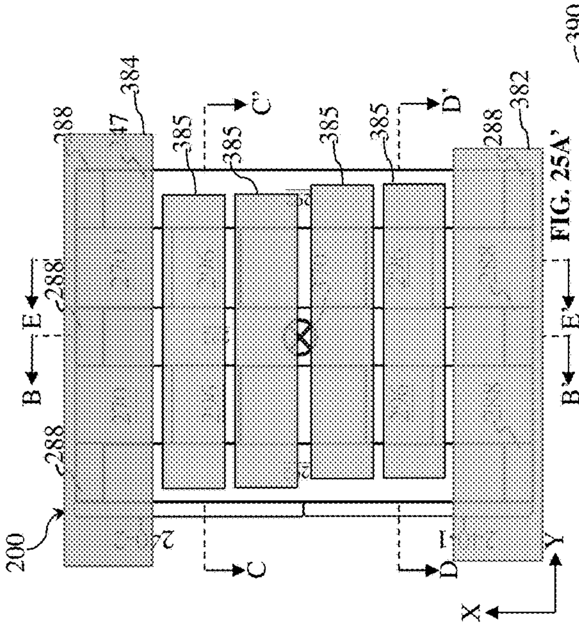
Figure 25C:
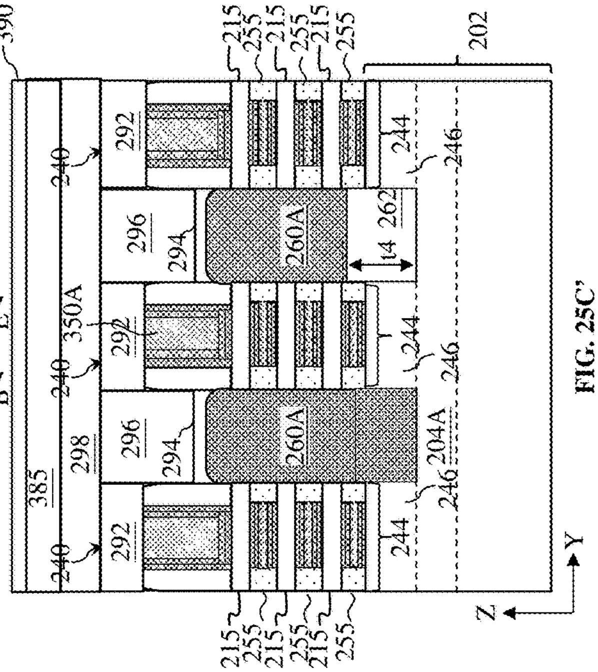
Figure 25E:
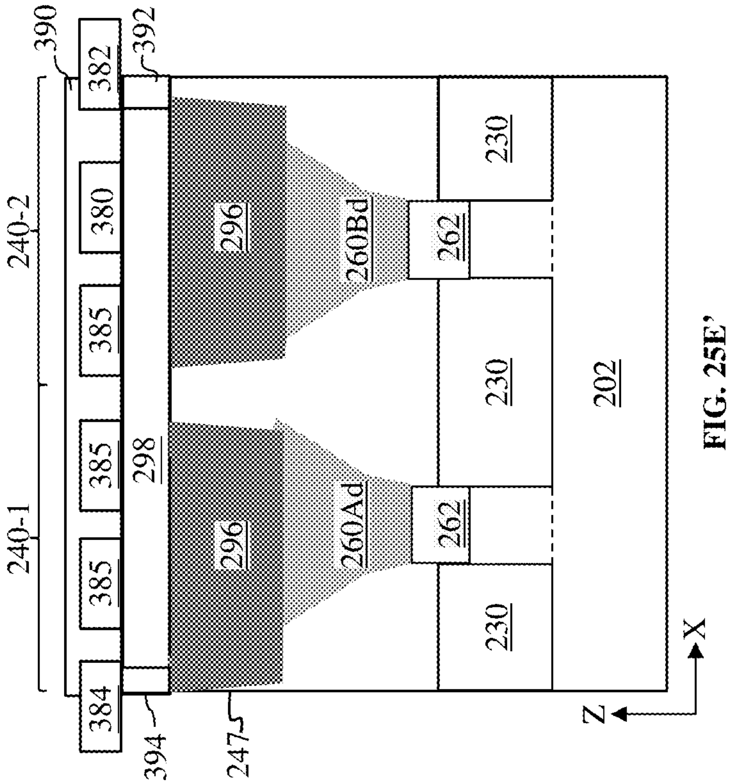

FIGS. 17A-25A, FIGS. 17B-25B, FIGS. 17C-25C, FIGS. 17D-25D, and 16E provide alternative embodiments of the method 100. FIGS. 17A-25A are top views of device 200 in an X-Y plane; FIGS. 17B-25B are diagrammatic cross-sectional views of device 200 in an X-Z plane along lines B-B' of the respective FIGS. 17A-25A, FIGS. 17C-25C are diagrammatic cross-sectional views of device 200 in a Y-Z plane along lines C-C' of the respective FIGS. 17A-25A; FIGS. 17D-25D are diagrammatic cross-sectional views of device 200 in the Y-Z plane along lines D-D' of the respective FIGS. 17A-25A; and FIG. 25E is a diagrammatic cross-sectional view of device 200 in the X-Z plane along lines E-E' of FIG. 25A.

The fabrication stage illustrated in FIGS. 17A-17D proceeds from the fabrication stage associated with FIGS. 5A-5D. Referring back to block 112 of FIG. 1A and to FIGS. 17A-17D, the dielectric material layer 262 previously formed is removed from the source recess 250 (specifically designated as source recess 250*s*) but not from the drain recess 250 (specifically designated as drain recess 250*d*). As a result, the pair of source/drain recesses 250 are asymmetric, where the source recess 250*s* is deeper than the drain recess 250*d*. Any suitable methods may be used to form the asymmetric pair of source/drain recesses 250. For example, a mask element may be formed to cover the drain regions of device 200 while having an opening exposing the source regions of device 200. Subsequently, an etching operation is conducted to remove the dielectric material layer 262 from the exposed source regions while not affecting the covered drain regions. This deepens the source recess 250*s* such that it extends into the substrate (for example, below a top surface of the substrate 202). The etching operation may implement any suitable etching chemical and/or any suitable etching method. In the depicted embodiments, the etching operation removes the dielectric material layer 262 in the source recess 250*s* in its entirety such that the top surface of the p-well 204A is exposed. However, in some embodiments, only a portion of the dielectric material layer 262 may be preserved by, for example, controlling a time duration of the etching operation. In such embodiments, while the source recess 250*s* is still deeper than the drain recess 250*d*, the top surface of the p-well 204A is not exposed. Furthermore, although the disclosure illustrates asymmetric source/drain recesses 250 where source recesses are deeper than the drain recesses; in some embodiments, the train recesses may alternatively be deeper than the source recesses. For example, the substrate may be exposed in the drain recesses but not in the source recesses.

Referring to block 114 of FIG. 1A and to FIGS. 18A-18D, an epitaxy process is conducted to form the source features 260As and 260Bs in the source recesses 250*s* and drain features 260Ad and 260Bd in the drain recesses 250*d*. As described above, the epitaxy process grows from semiconductor materials. For example, the exposed bottom surface of the source trenches 250*s* (see FIGS. 17C and 17D) include a semiconductor material. Accordingly, in the depicted embodiments, the semiconductor materials of the substrate is exposed in the source recesses 250*s*. Therefore, source features 260As and 260Bs each grow from the bottom surfaces of the source trenches 250*s*. Moreover, the epitaxy process grow from sidewall surfaces from the semiconductor layers 215 and merge with each other to form contiguous source features 260As and 260Bs, respectively. Furthermore, the drain trenches 250*d* include the dielectric material layer 262, similar to the embodiment described above with respect to FIGS. 8C and 8D. Accordingly, the epitaxy process proceeds similarly to that described above, and form drain features 260Ad and 260Bd that are similar to the drain features 260A and 260B of the FIGS. 9C and 9D. As illustrated, the drain features 260Ad and 260Bd each have a bottom surface that is spaced away from the top surface of the dielectric material layer 262, such that air gaps 264 are formed therebetween. In the depicted embodiments, the dielectric material layer 262 has the thickness t4, and the air gaps 264 have the thickness t6, similar to the embodiment described above with respect to FIGS. 9A-9F. Moreover, the drain features 260Ad and 260Bd each have a bottom surface having a profile that resembles the letter U, the letter V, or the letter W, depending on design requirements.

Accordingly, in the depicted embodiments, the source features 260As and 260Bs are different from the drain features 260Ad and 260Bd. For example, the height, the size, the surface profile of the source features 260As and 260Bs are different from those of the drain features 260Ad and 260Bd. For example, the source features 260As and 260Bs each directly contact the substrate while the drain features 260Ad and 260Bd are each spaced away from the substrate. In some embodiments where a portion of the dielectric material layer 262 remains in the source recesses 250*s*, the source features 260As and 260Bs are spaced away from the substrate by the remaining portions of the dielectric material layer 262, and by air gaps 264. However, the height, the size of the source features 260As and 260Bs differ from those of the corresponding drain features 260Ad and 260Bd, for example, due to the different thickness of the dielectric material layers 262 and/or whether portions of the bottom channel 246 are exposed in the source recesses 250*s*.

Referring to blocks 116-130 of FIGS. 1A and 1B and to FIGS. 19A-25A, 19B-25B, 19C-25C, 19D-25D, and 25E, the fabrication proceeds similarly to those already described with respect to FIGS. 10A-16A, 10B-16B, 10C-16C, 10D-16D, and 16E. For example, an ILD layer 270 is formed on the device 200 (FIGS. 19A-19D); the dummy gate stacks are removed (FIGS. 20A-20D); the remaining portions of the semiconductor layers 210 are removed (FIGS. 21A-21D); gate dielectric layers are formed (FIGS. 22A-22D); gate electrode layers are formed (FIGS. 23A-23D); gate top hard mask layers, silicide layers, and source/drain contacts are formed (FIGS. 24A-24D); source vias, drain vias, and gate vias are formed (FIGS. 25A-25E).

As can be seen, the device 200 fabricated according to these methods described with respect to FIGS. 17A-25A, 17B-25B, 17C-25C, 17D-25D, and 25E have several distinct features. For example, a dielectric material layer 262 interposes between the bottom surface of the drain features 260Ad, 260Bd and the top surface of the substrate 202. Moreover, an air gap 264 is formed vertically between the top surface of the substrate 202 and the bottom surface of the drain features 260Ad, 260Bd, for example, vertically between the top surface of the dielectric material layer 262 and the bottom surface of the drain features 260Ad, 260Bd. The dielectric material layer 262 and the air gap 264 each isolate the drain features 260A from the substrate 202. Meanwhile, no dielectric material layer 262 interposes between the bottom surface of the source features 260As, 260Bs and the top surface of the substrate 202. Rather, the source features 260As, 260Bs each directly grow from the top surface of the substrate 202. Accordingly, the source features 260As, 260Bs each have a thickness along the Z-direction that is greater than the drain features 260Ad, 260Bd. Referring to FIGS. 25A'-25E', similar to the embodiments described with respect to FIGS. 16A'-16E', in some embodiments, the device may be configured to have no air gap 264 between the top surface of the dielectric material layer 262 and the bottom surface of the drain features 260Ad, 260Bd. Accordingly, the dielectric material layer 262 alone separates and isolates the drain features the 260Ad, 260Bd from the substrate 202.

Figure 26A:
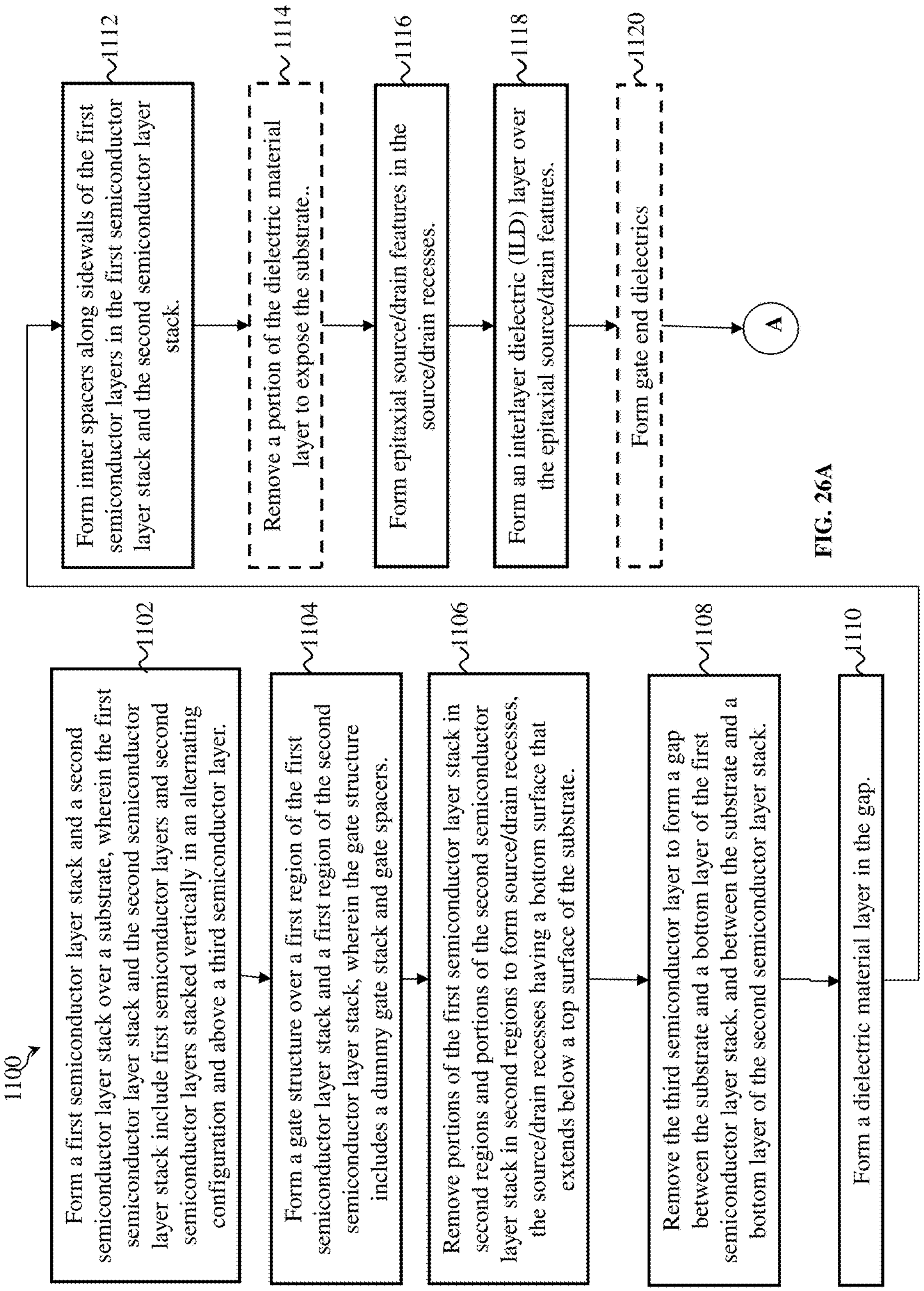
Figure 26B:
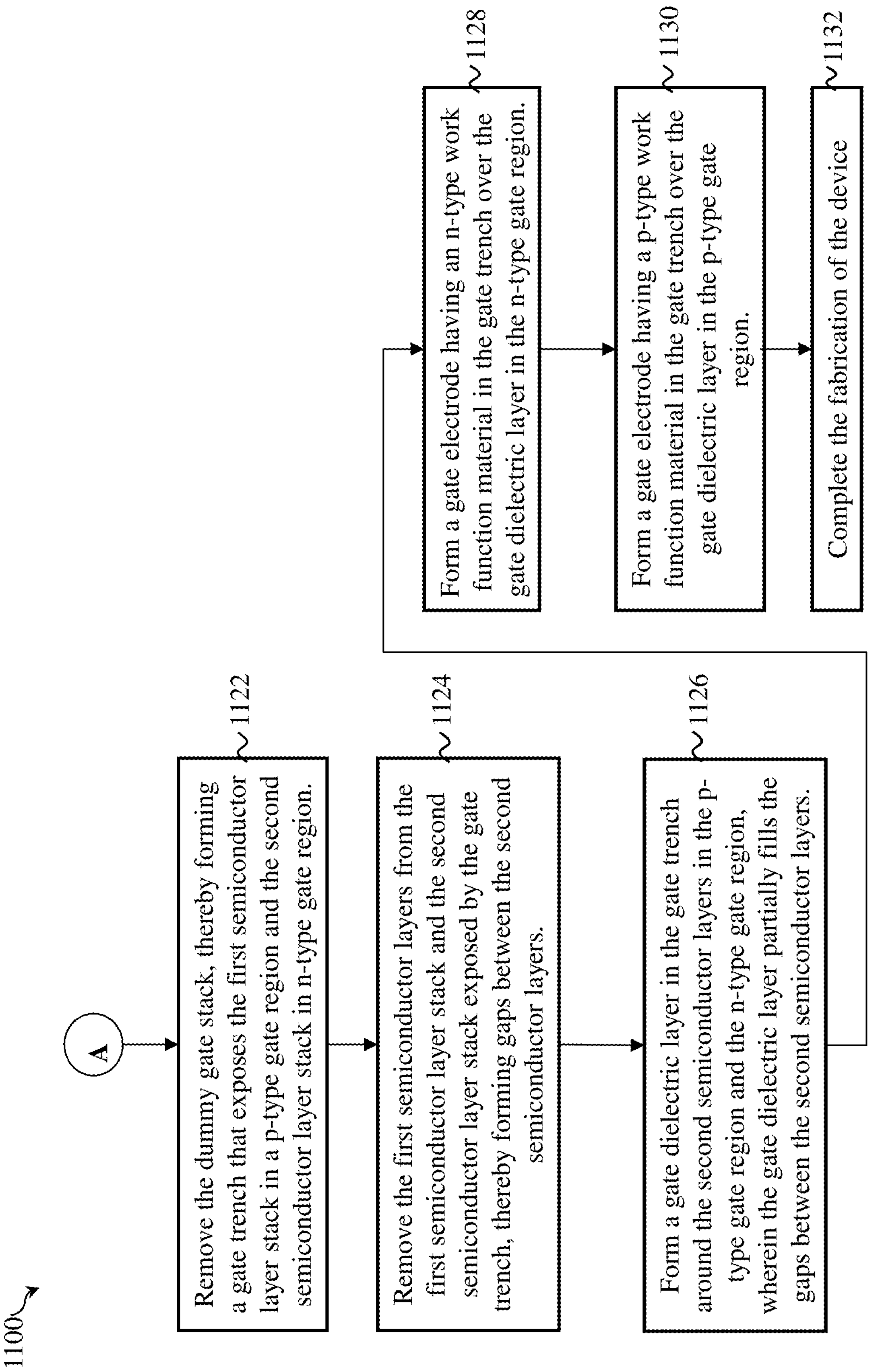
Figure 27A:
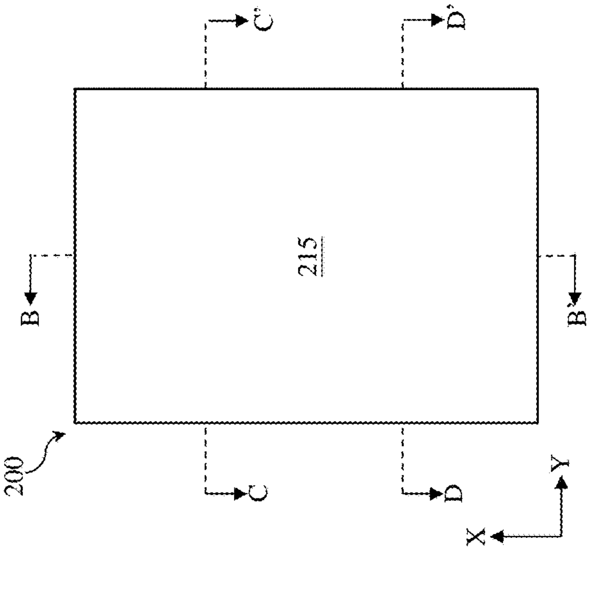
Figure 27B:
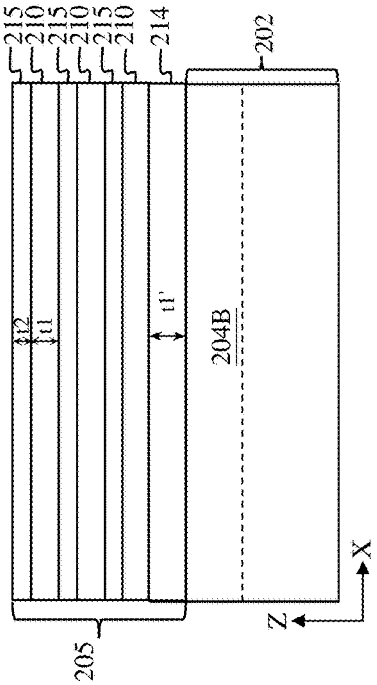
Figure 27C:
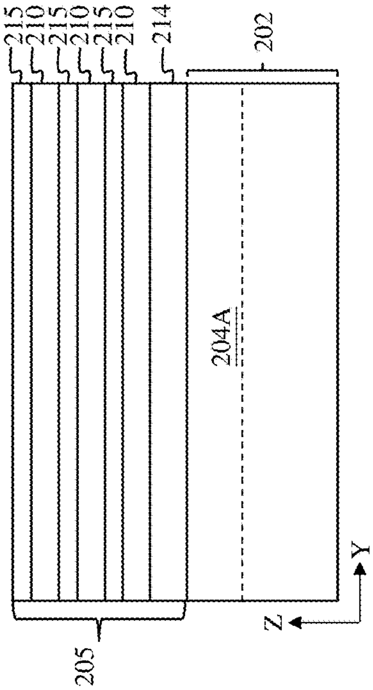
Figure 27D:
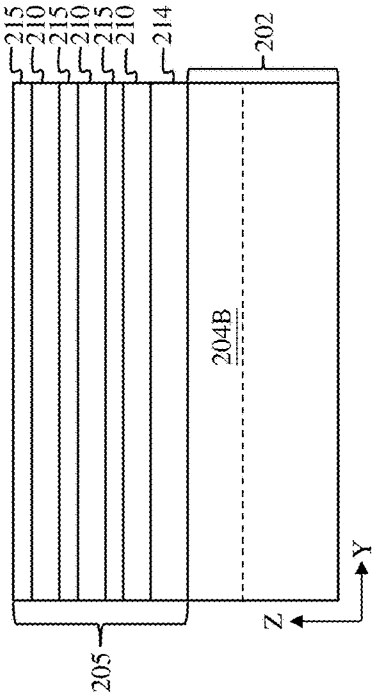
Figure 28B:
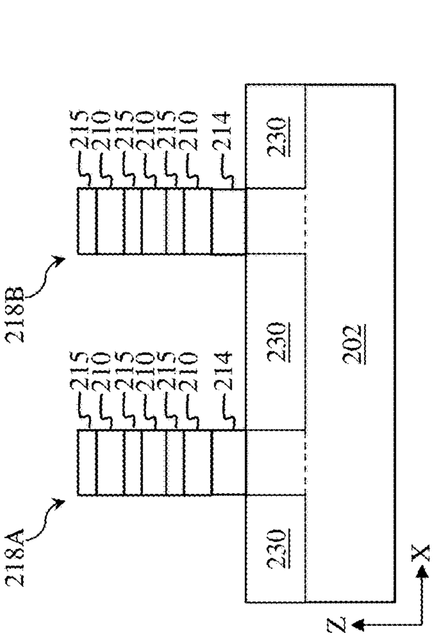
Figure 28D:
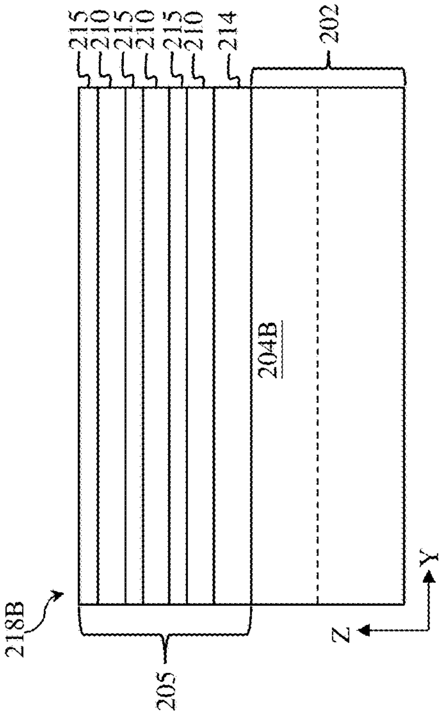
Figure 28A:
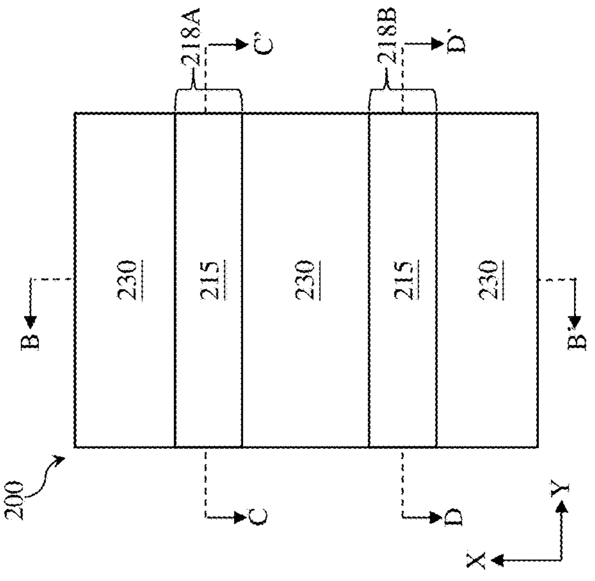
Figure 28C:
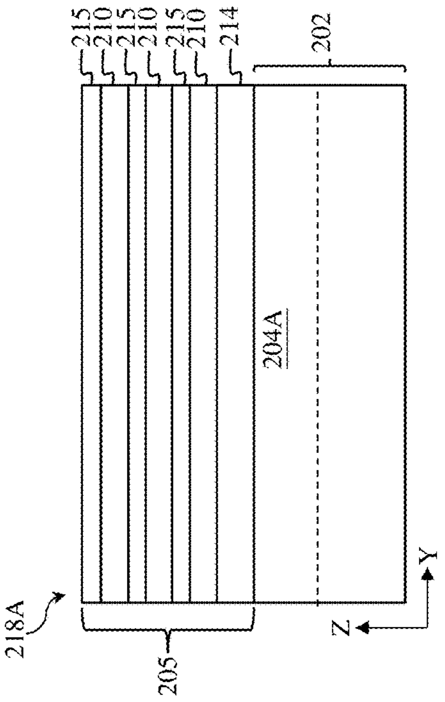
Figure 29A:
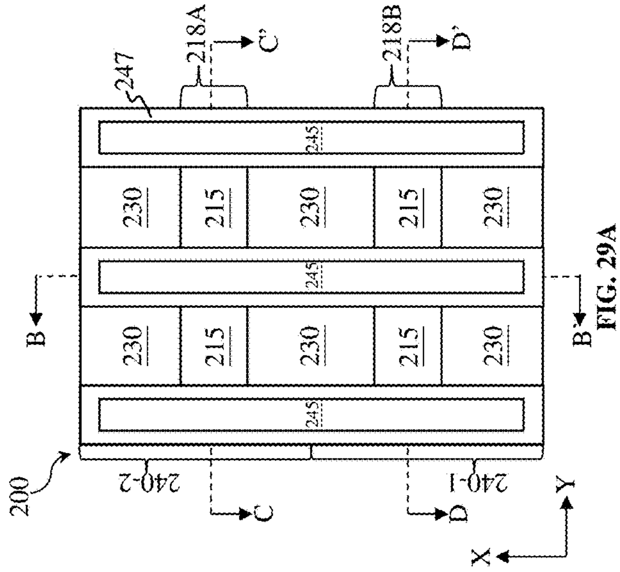
Figure 29B:
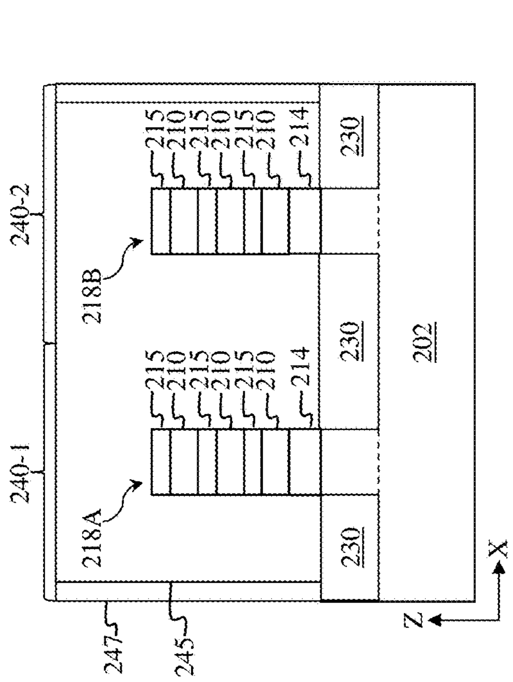
Figure 29C:
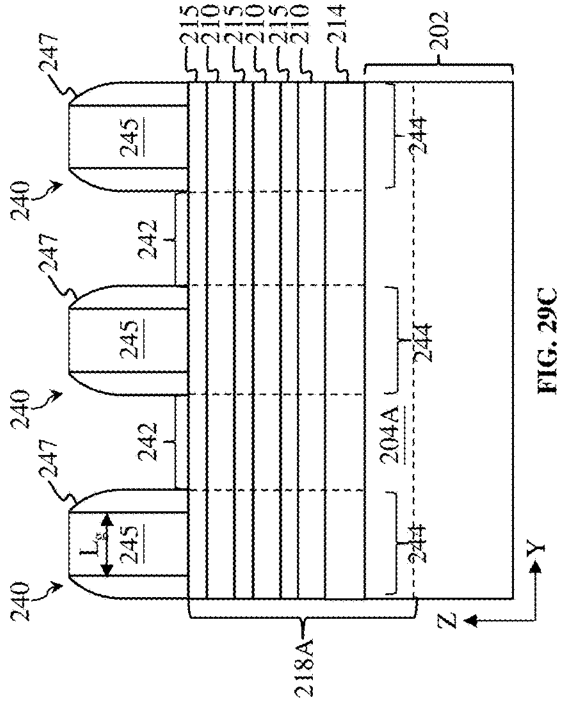
Figure 29D:
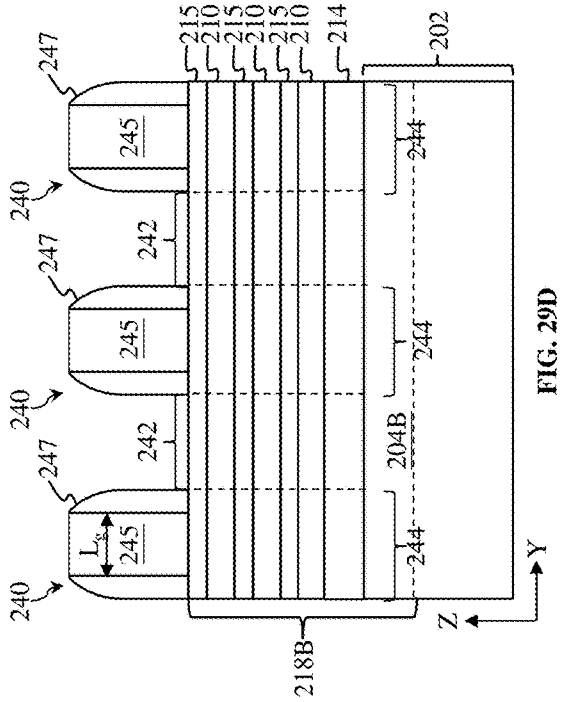
Figure 30A:
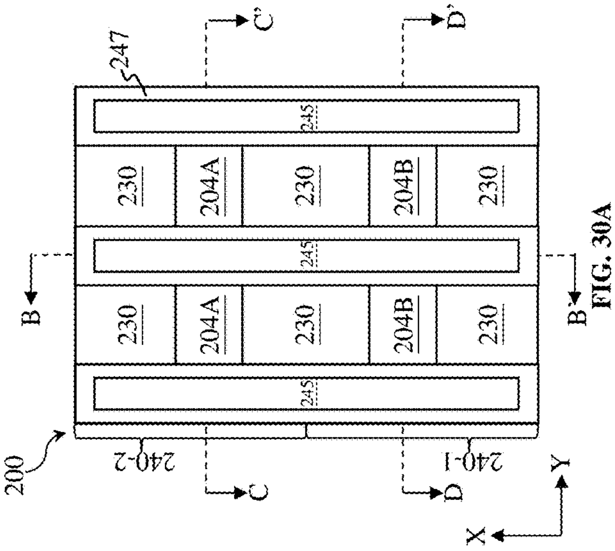
Figure 30B:
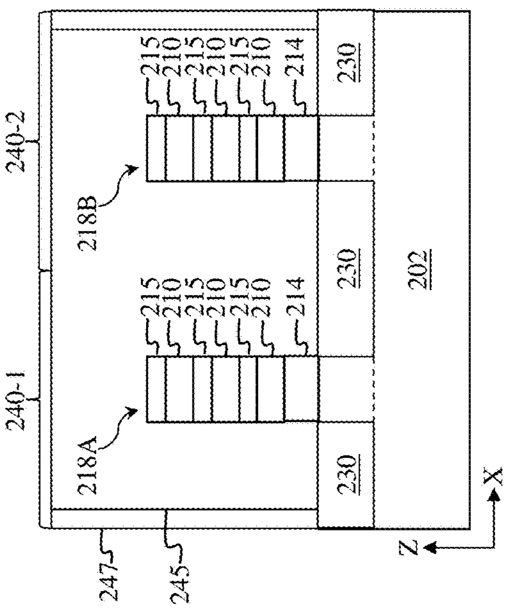
Figure 30C:
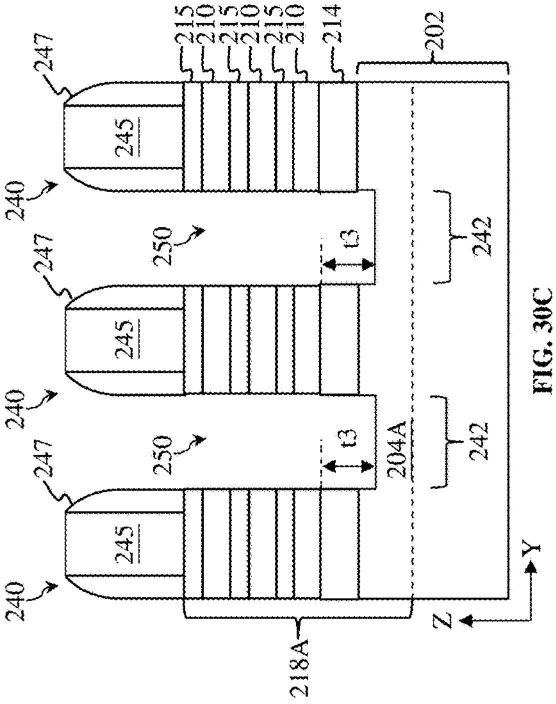
Figure 30D:
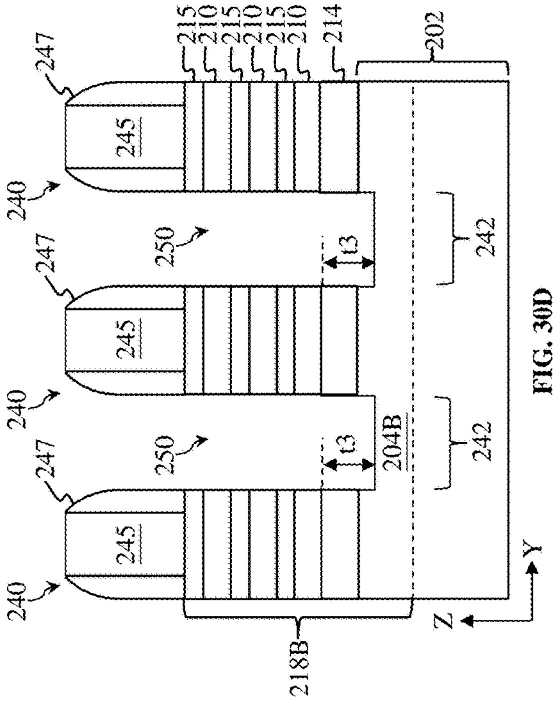
Figure 30A:
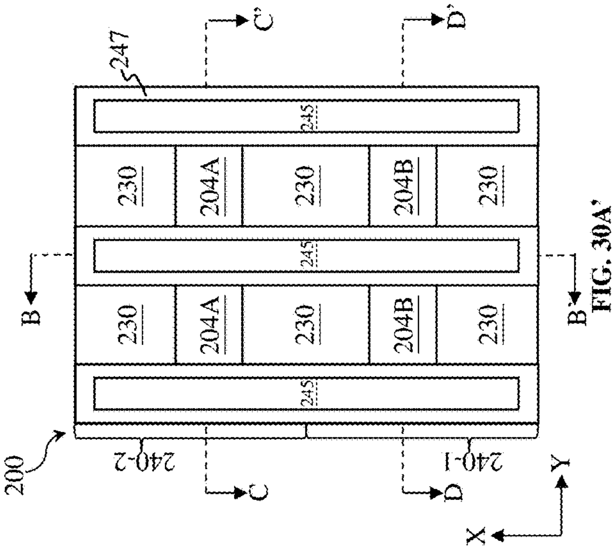
Figure 30B:
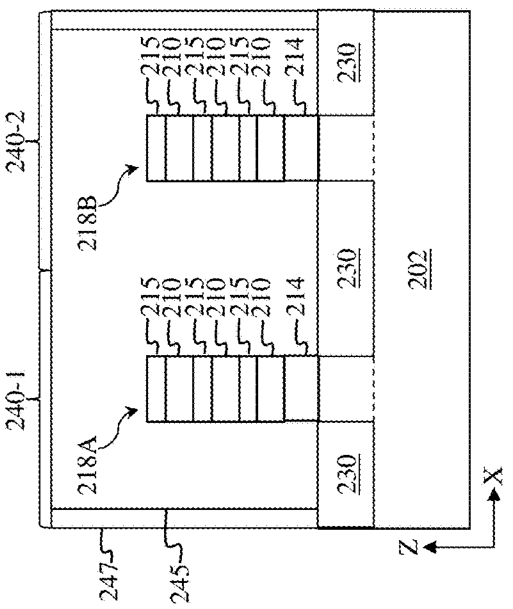
Figure 30C:
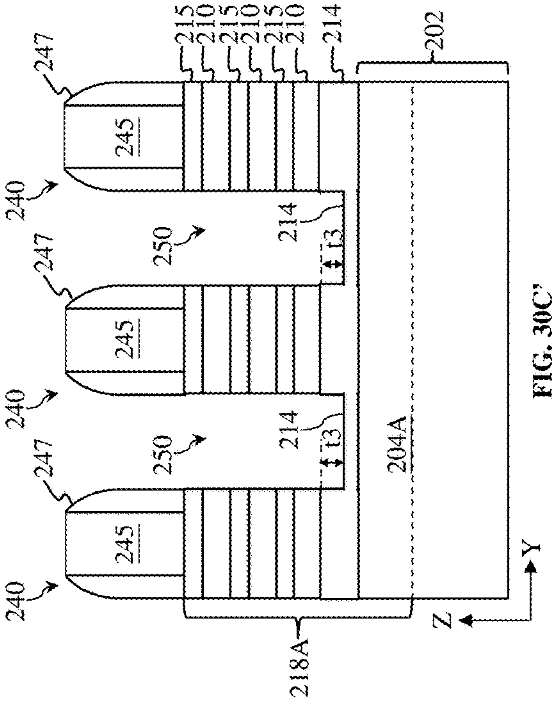
Figure 30D:
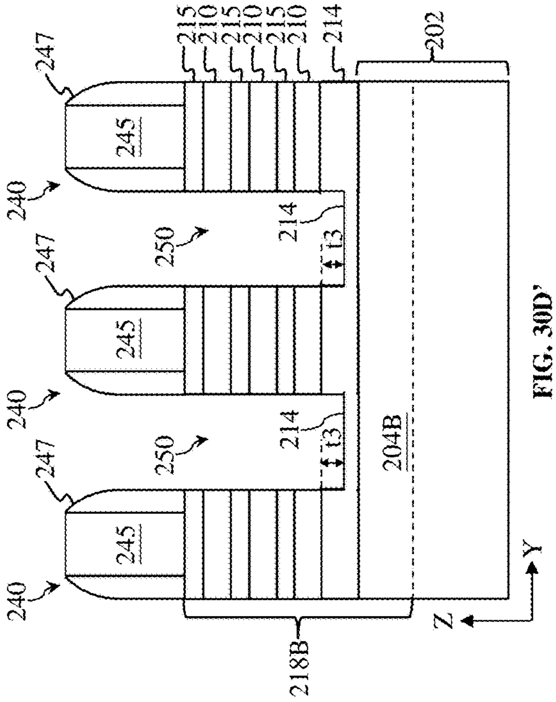
Figure 31A:
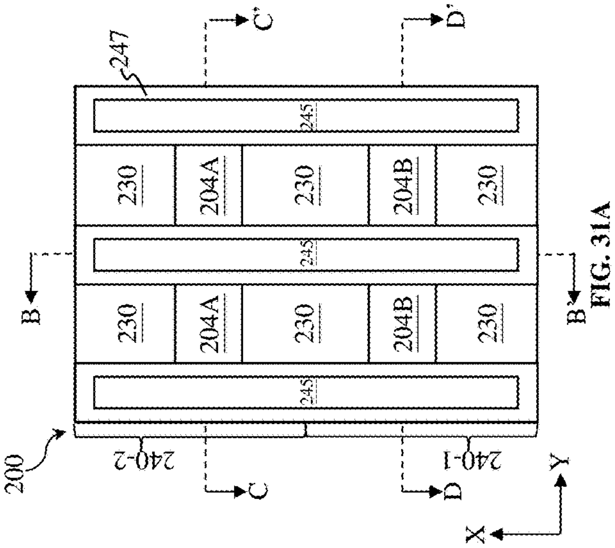
Figure 31B:
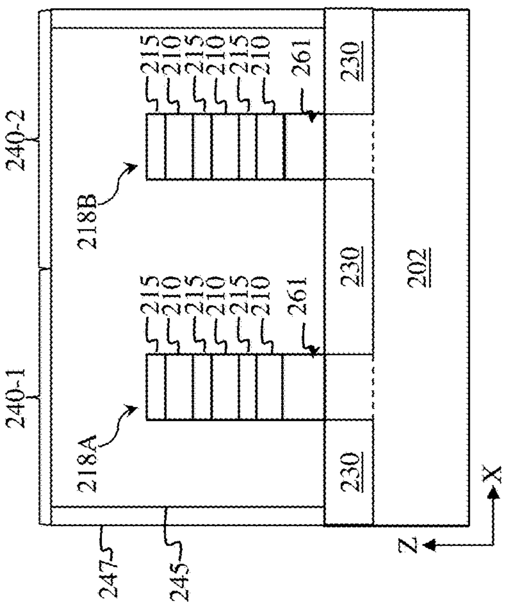
Figure 31C:
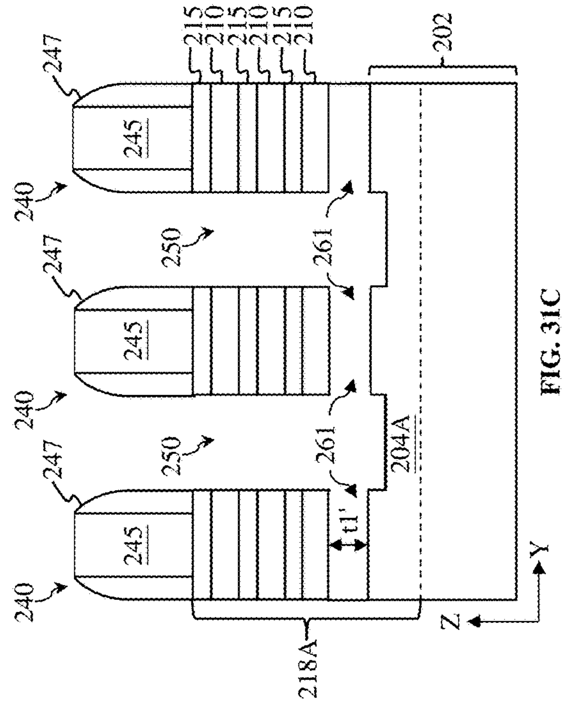
Figure 31D:
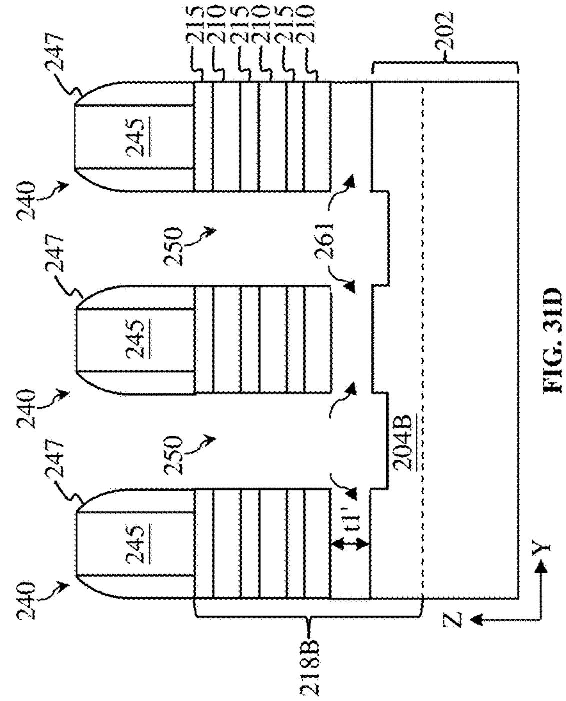
Figure 32A:
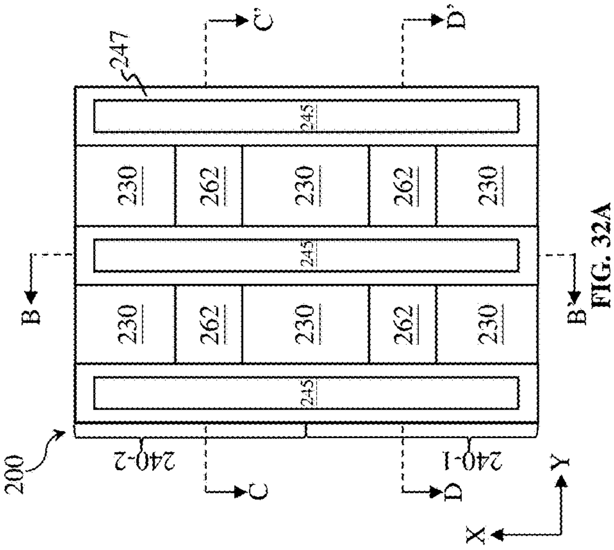
Figure 32B:
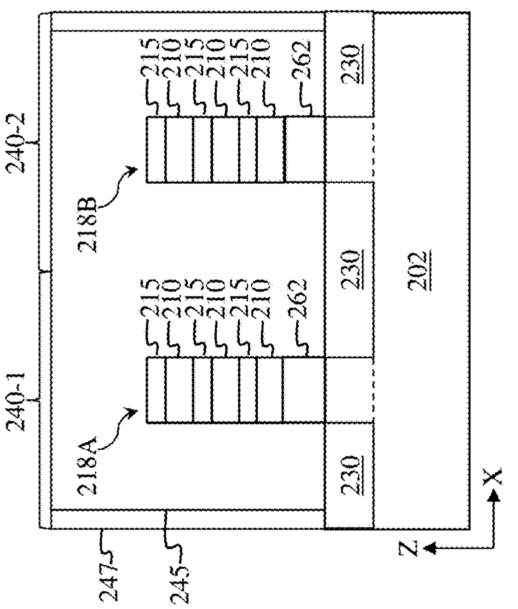
Figure 32C:
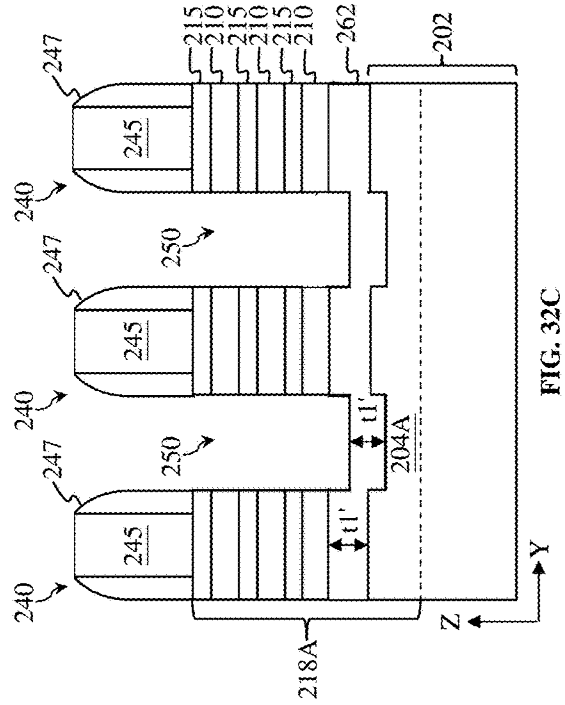
Figure 32D:
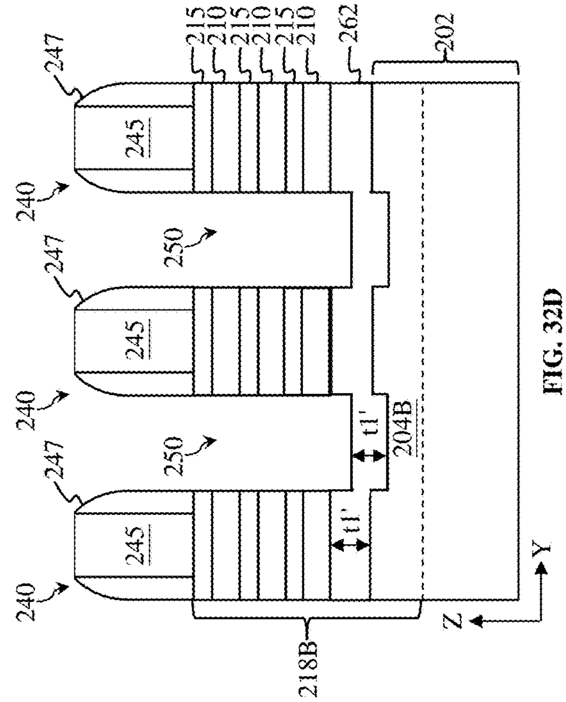
Figure 33A:
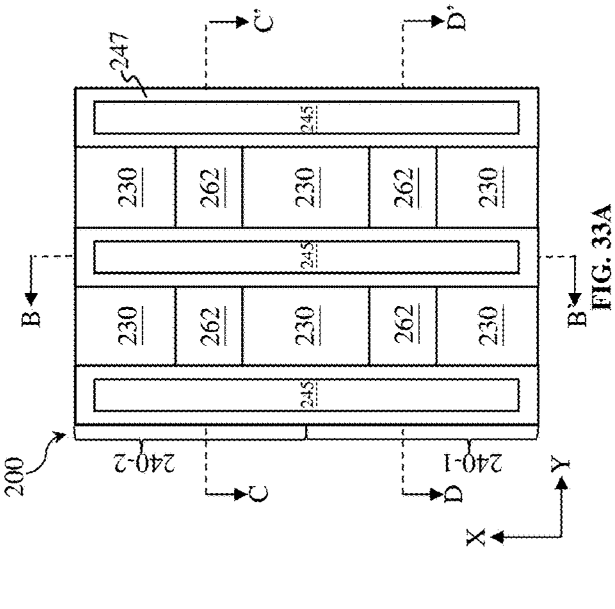
Figure 33B:
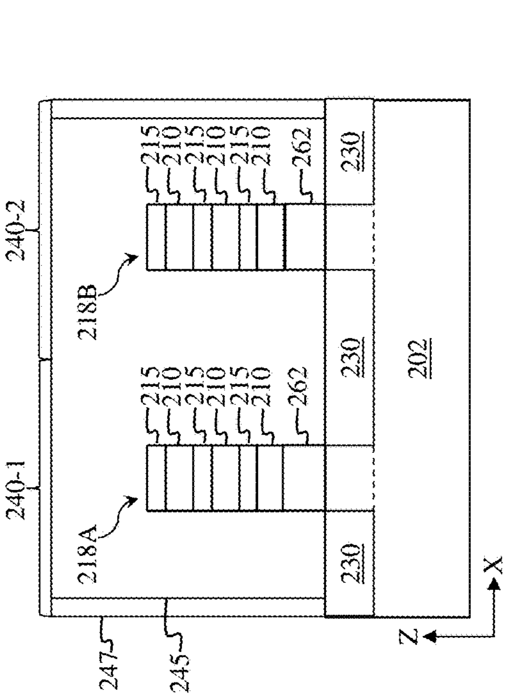
Figure 33C:
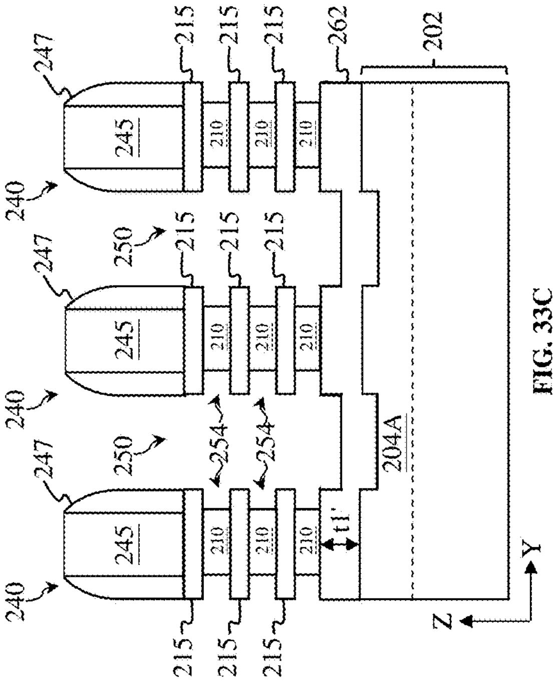
Figure 33D:
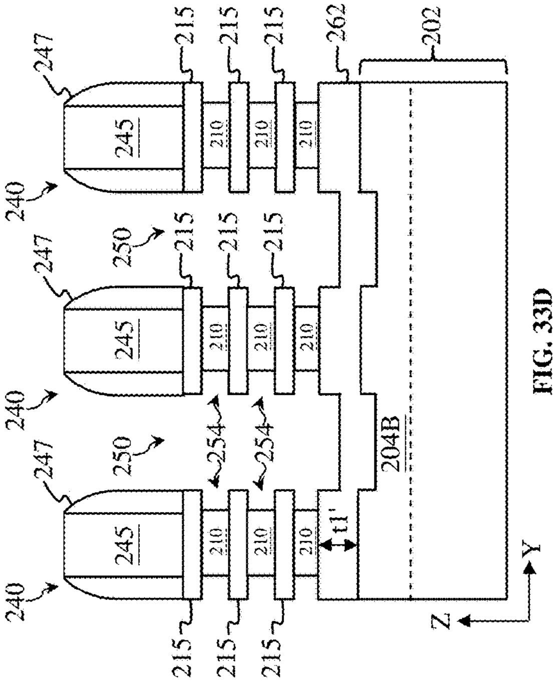
Figure 34A:
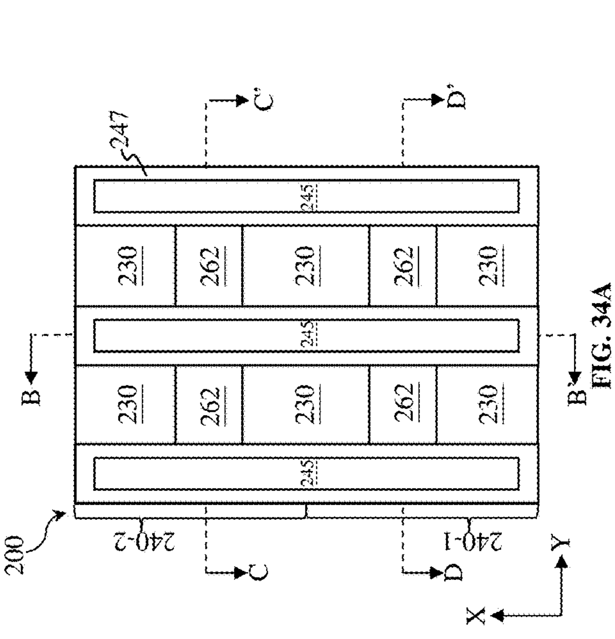
Figure 34B:
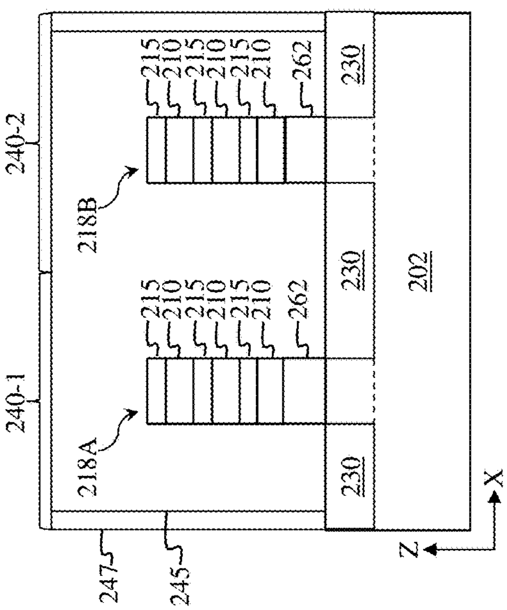
Figure 34C:
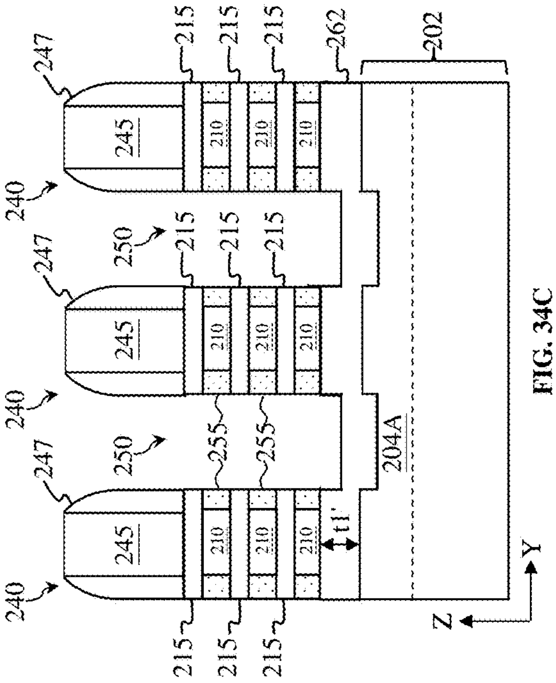
Figure 34D:
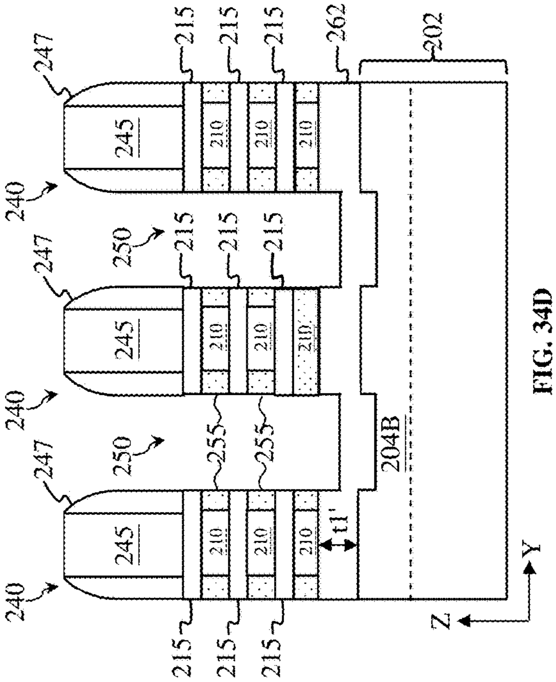
Figures 35A, 35B, 35C, 35D:
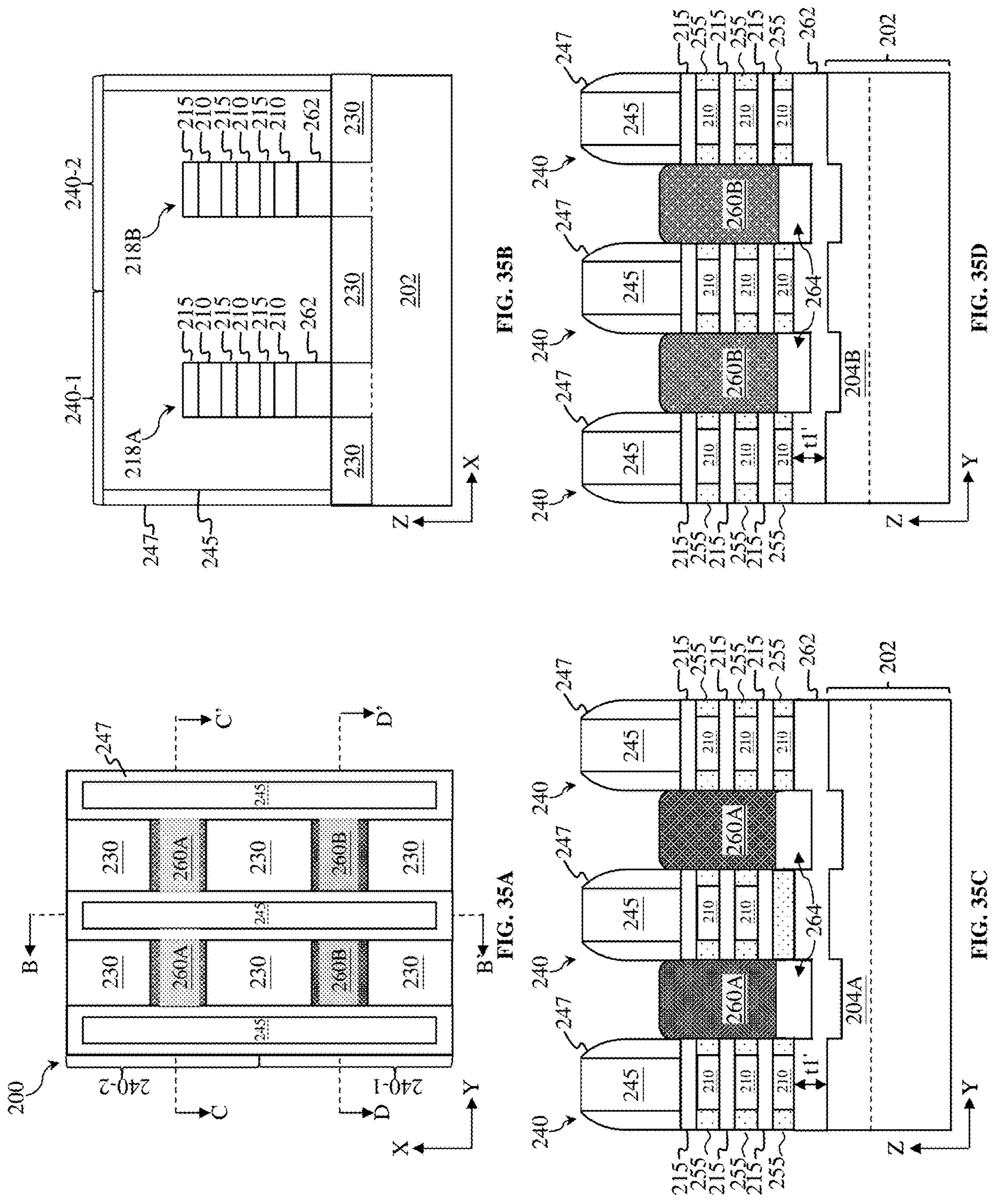
Figures 36A, 36B, 36C, 36D:
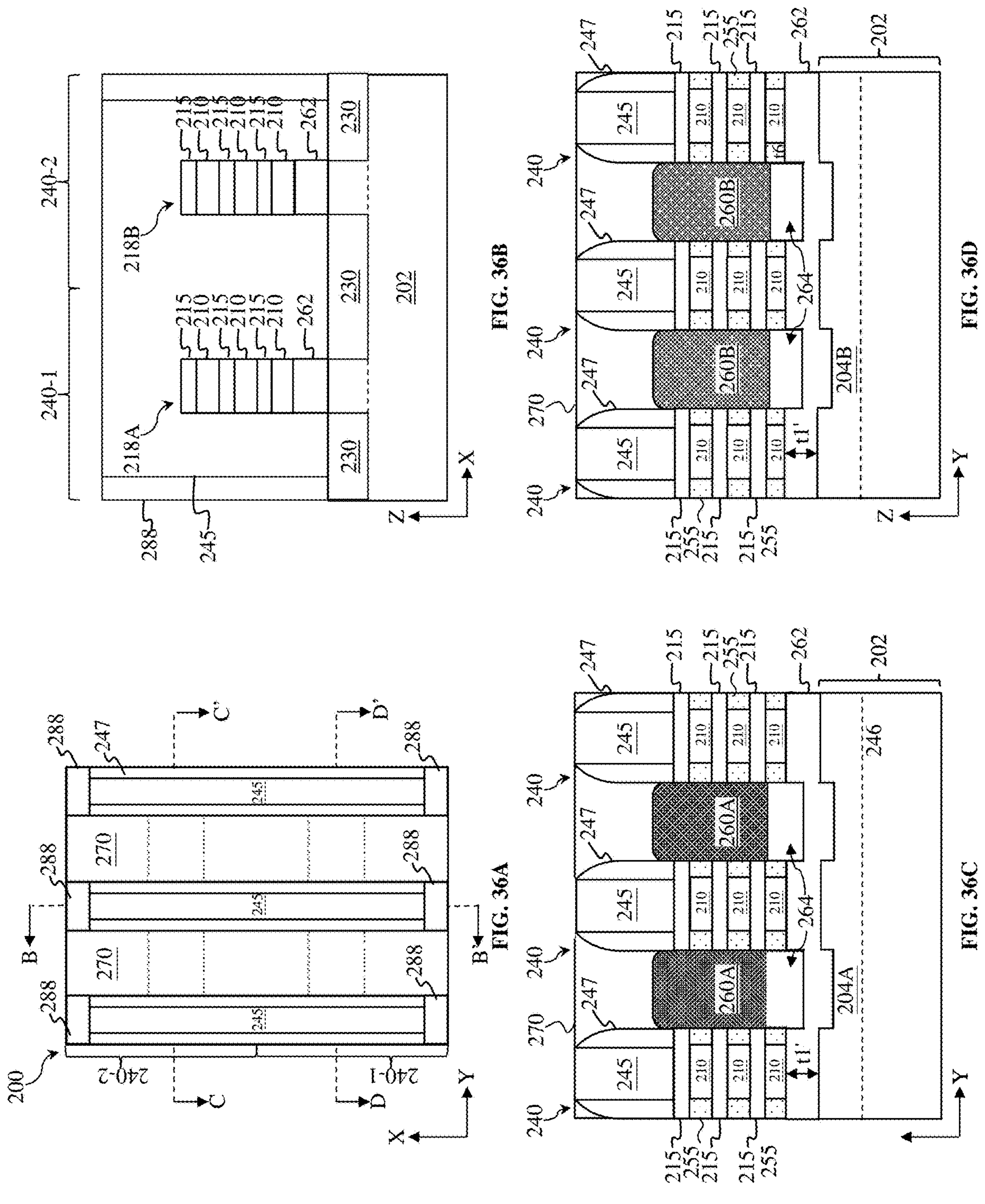
Figures 37A, 37B, 37C, 37D:
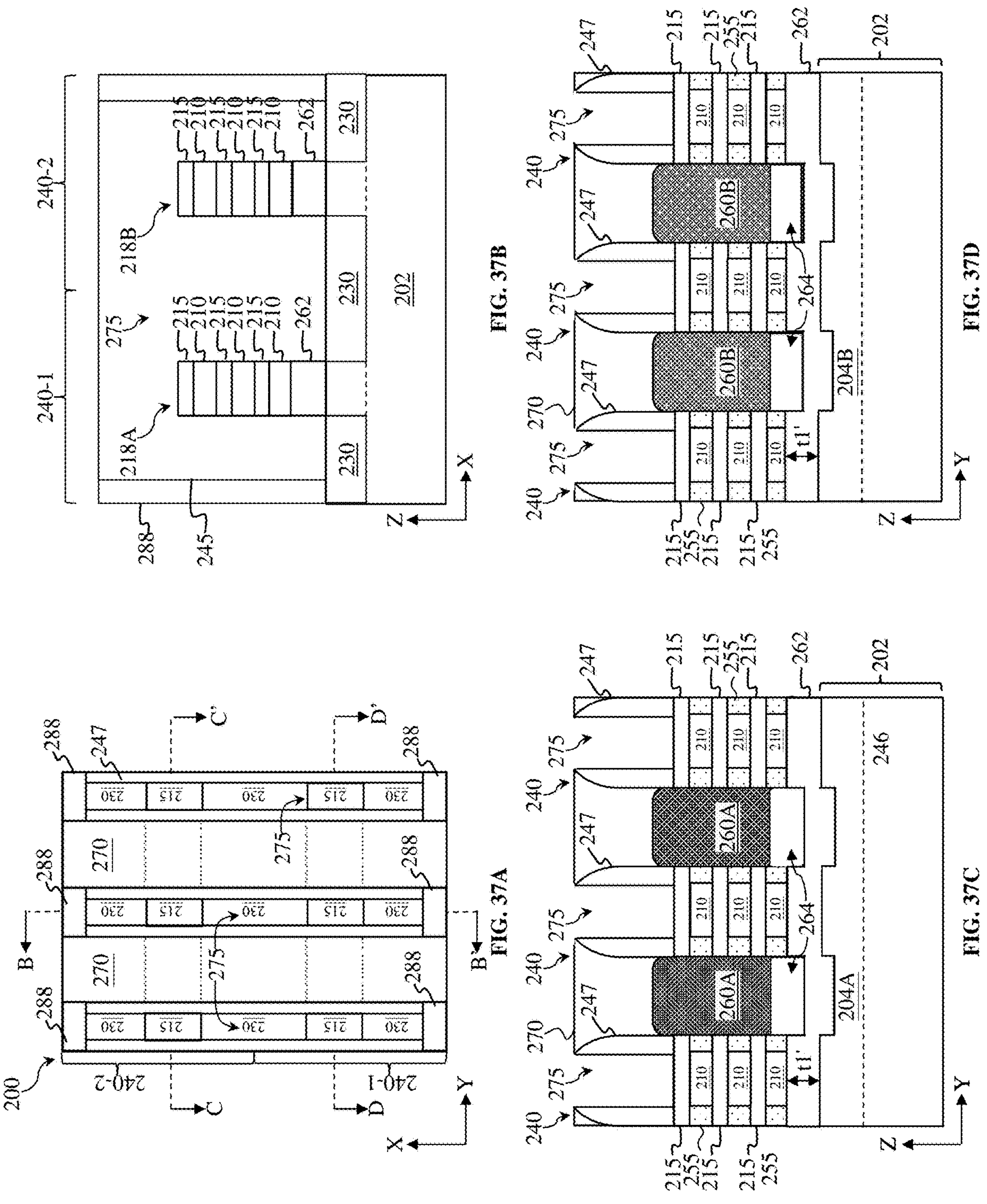
Figures 38A, 38B, 38C, 38D:
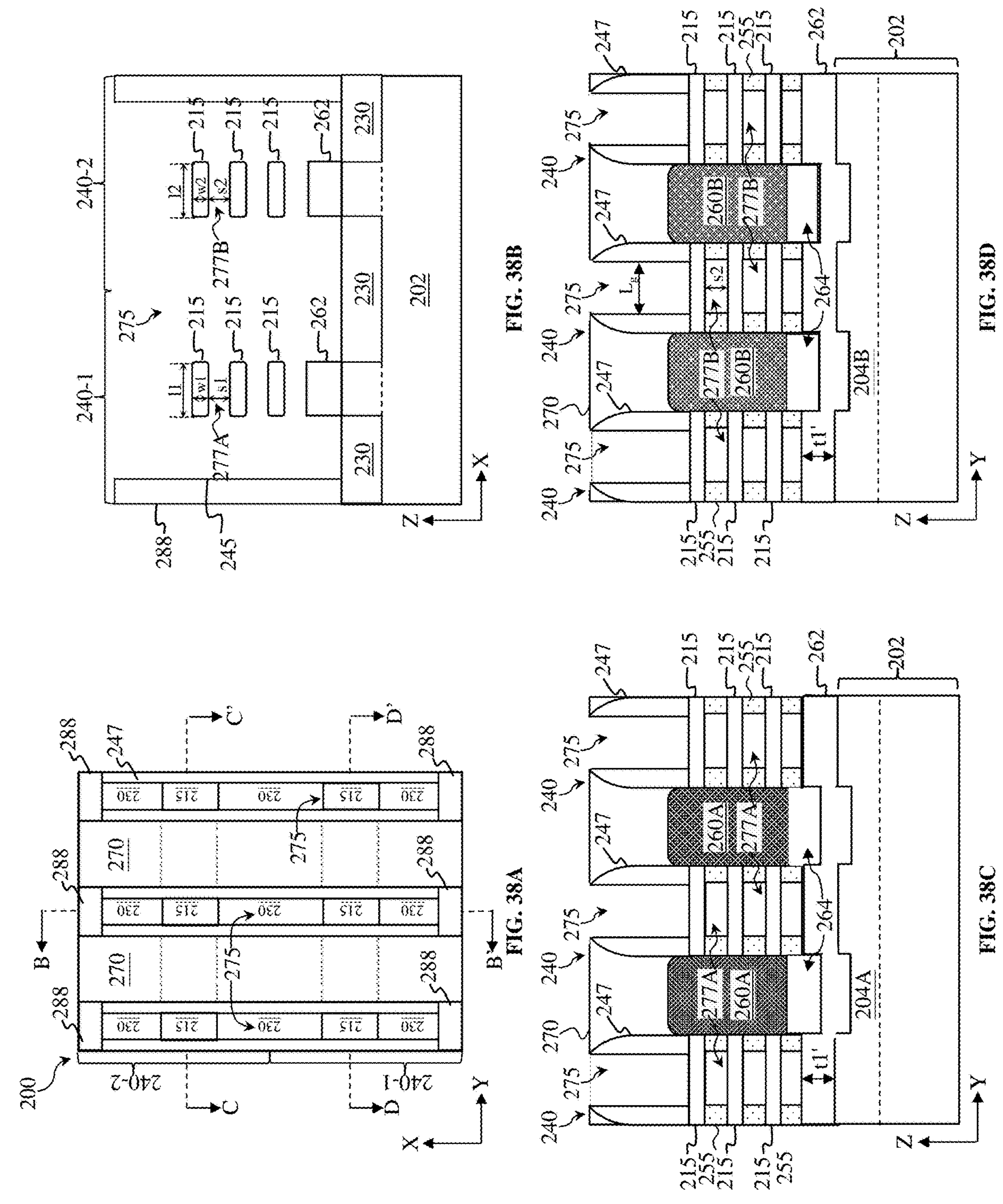
Figures 39A, 39B, 39C, 39D:
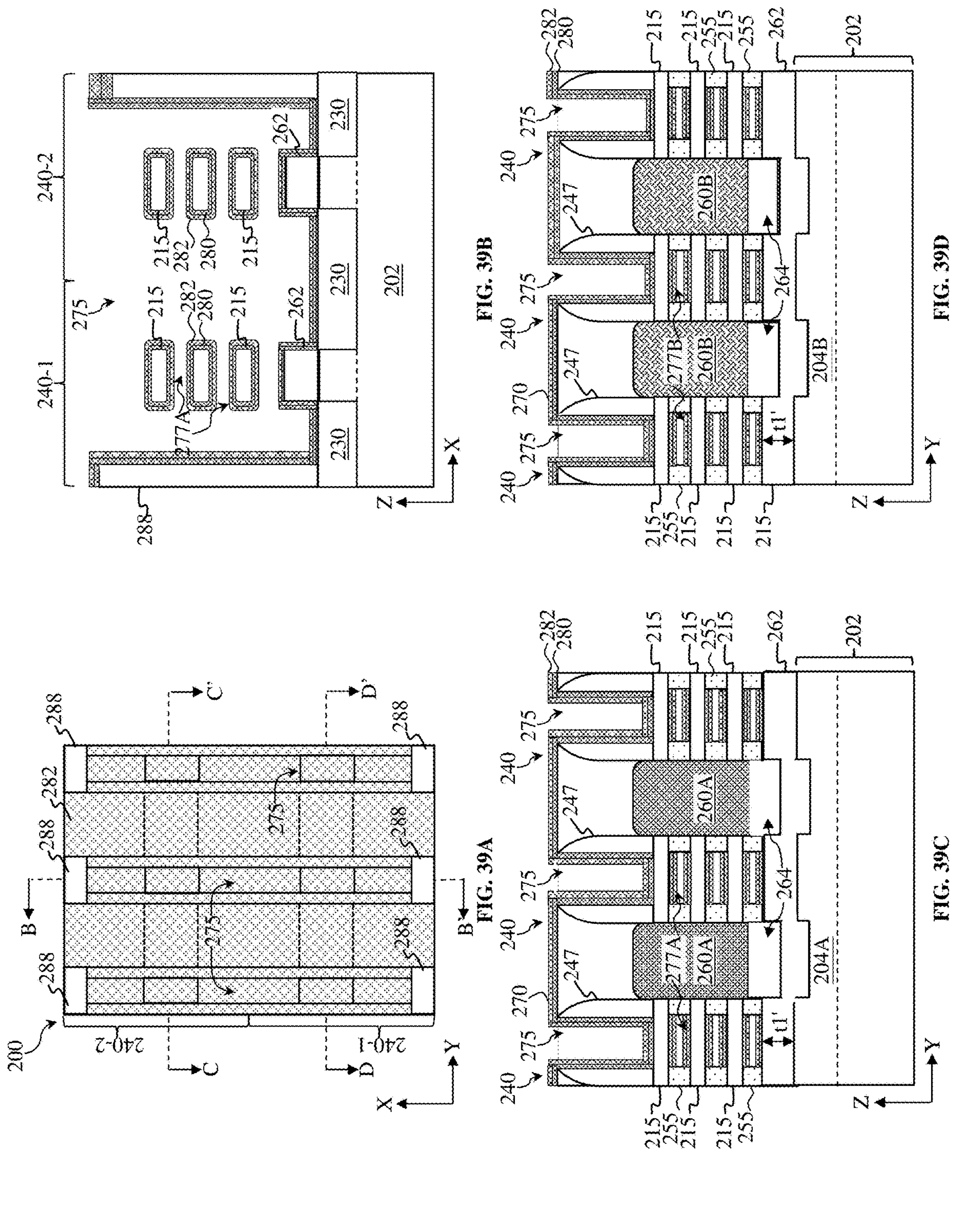
Figure 40A:
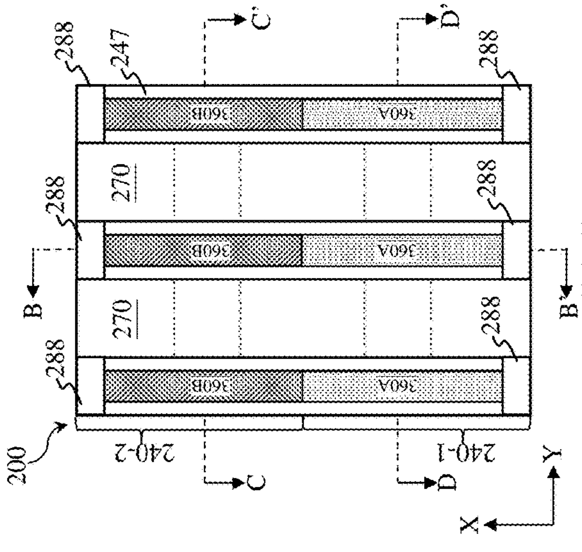
Figure 40B:
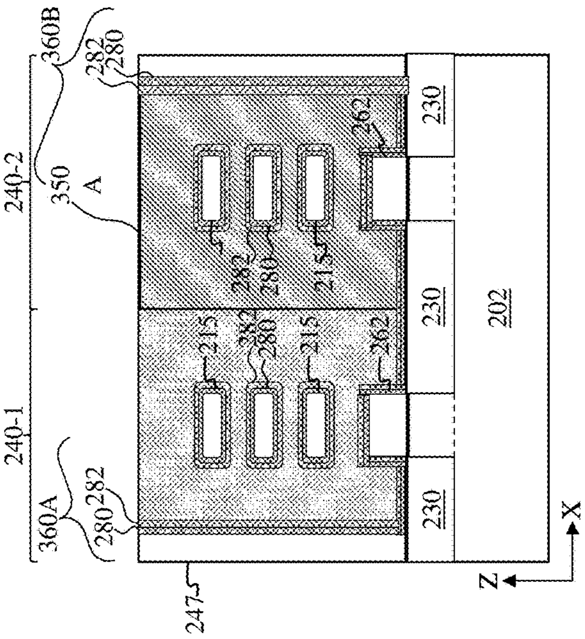
Figure 40C:
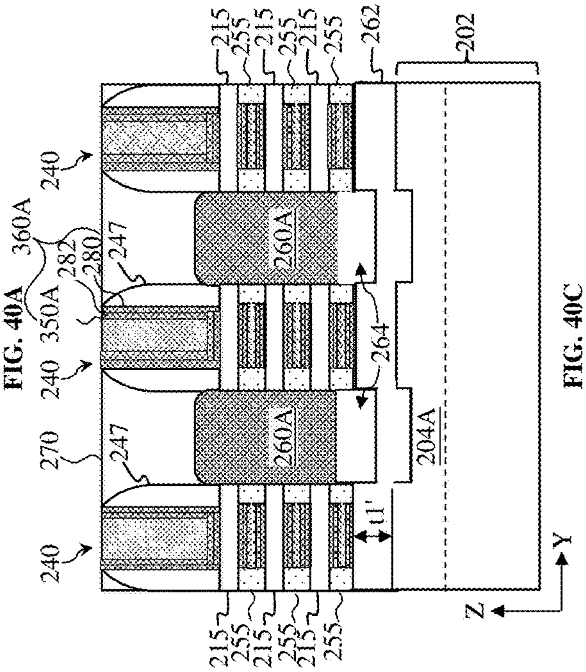
Figure 40D:
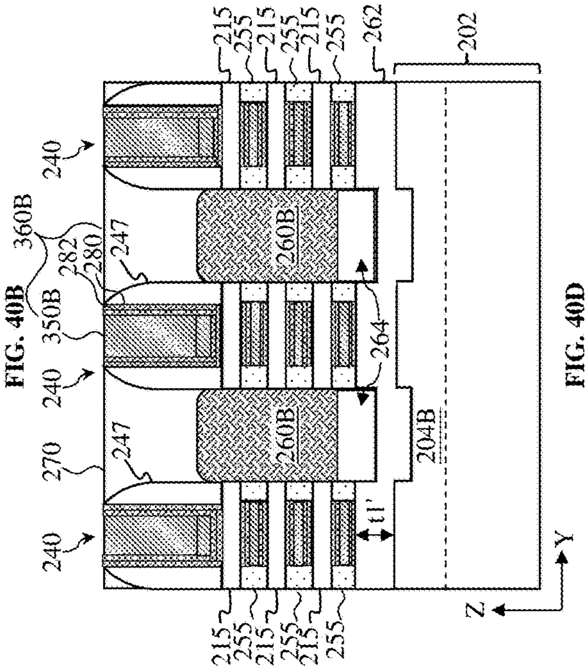
Figure 41A:
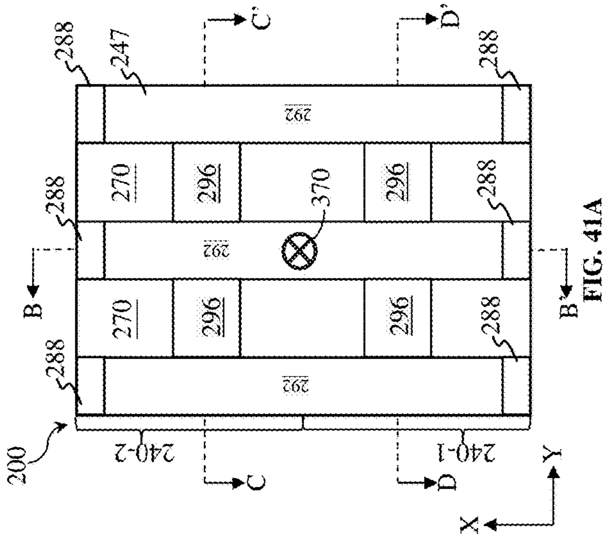
Figure 41B:
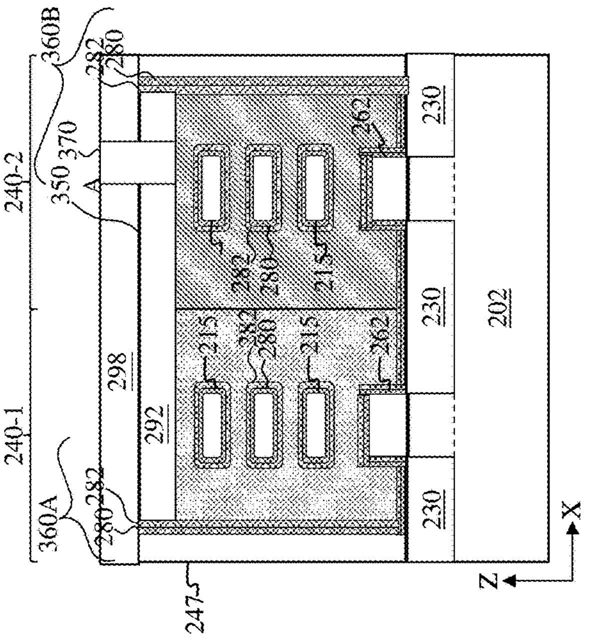
Figure 41C:
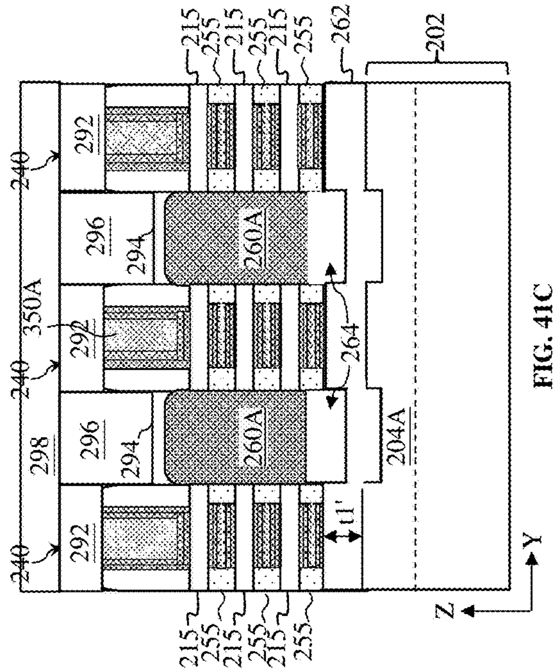
Figure 41D:
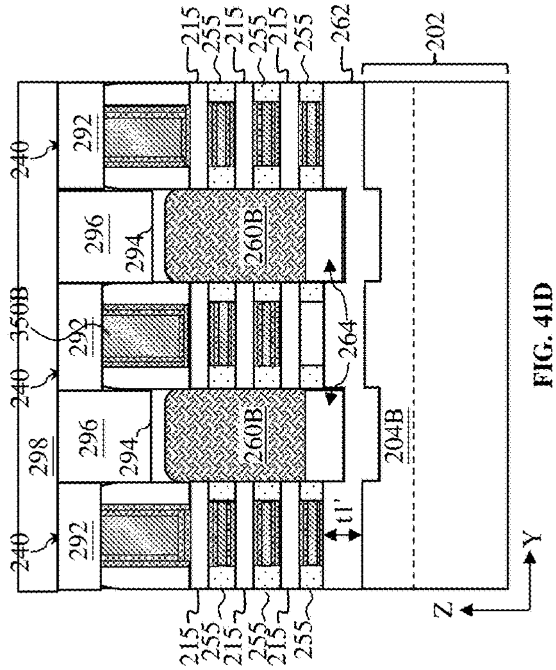
Figure 42B:
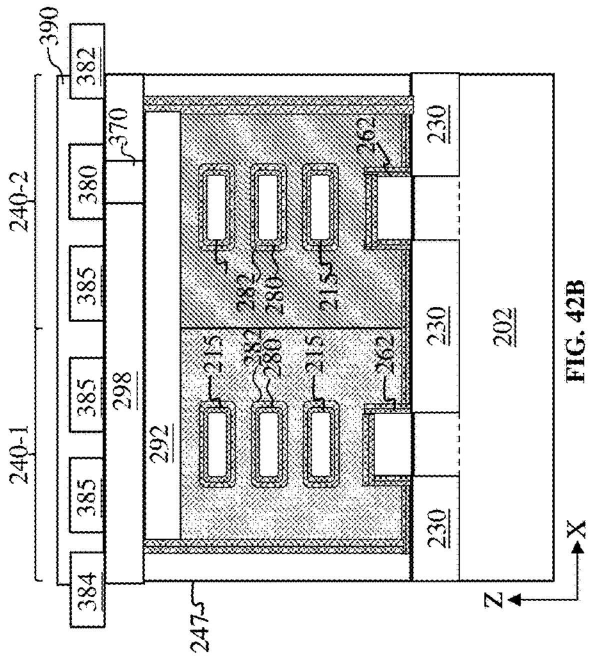
Figure 42D:
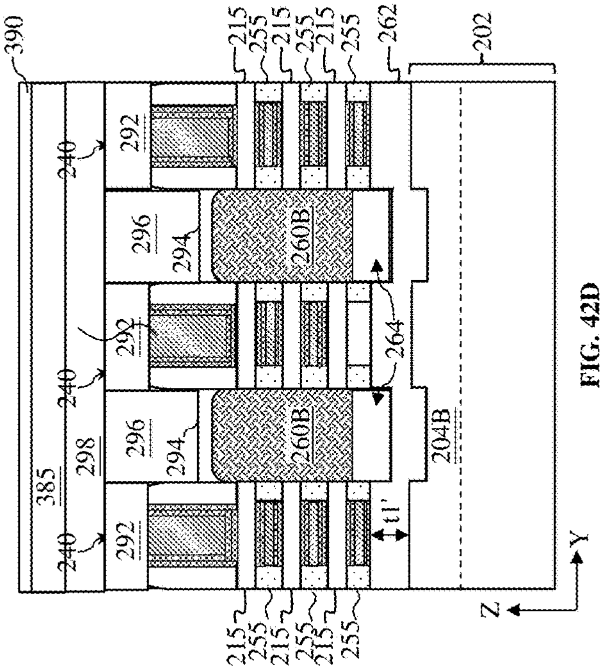
Figure 42A:
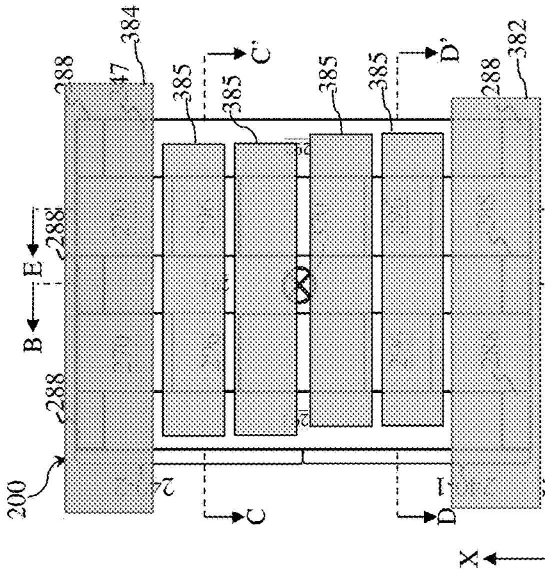
Figure 42C:
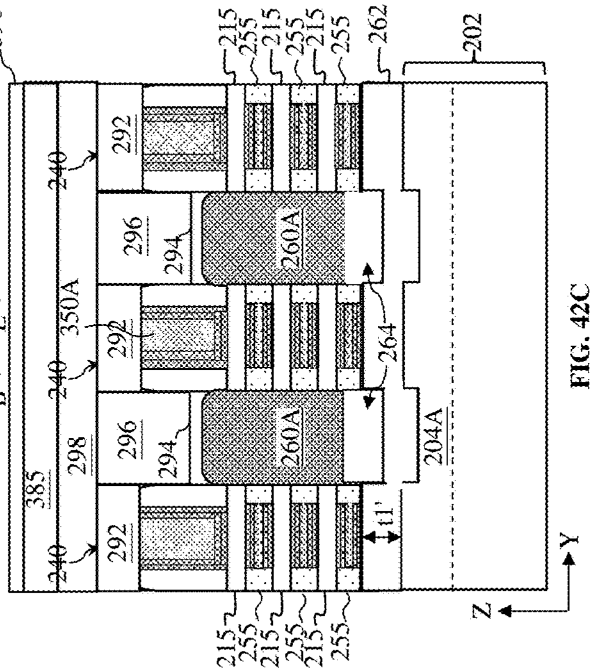
Figure 42E:
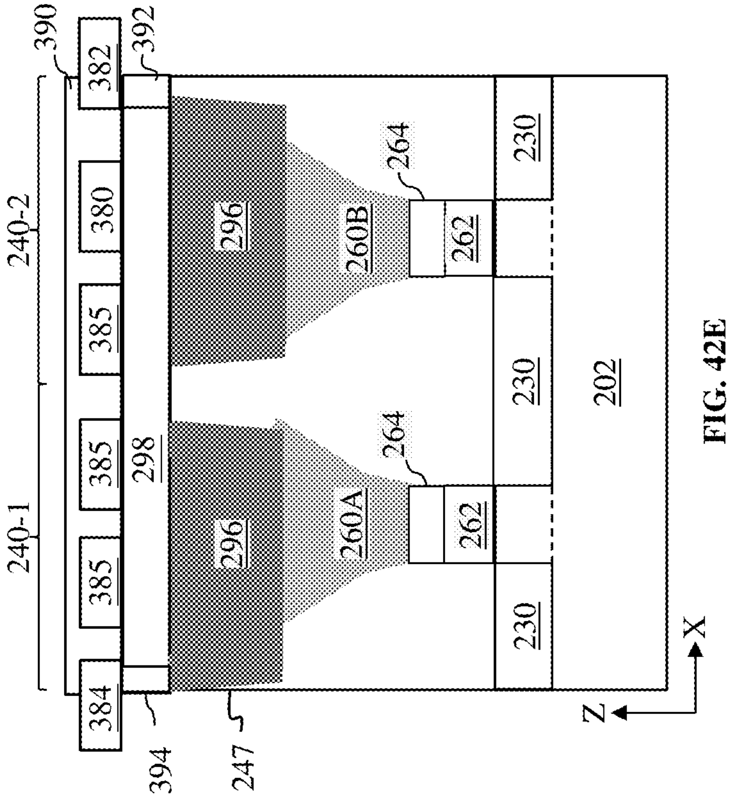
Figures 43A, 43B, 43C, 43D:
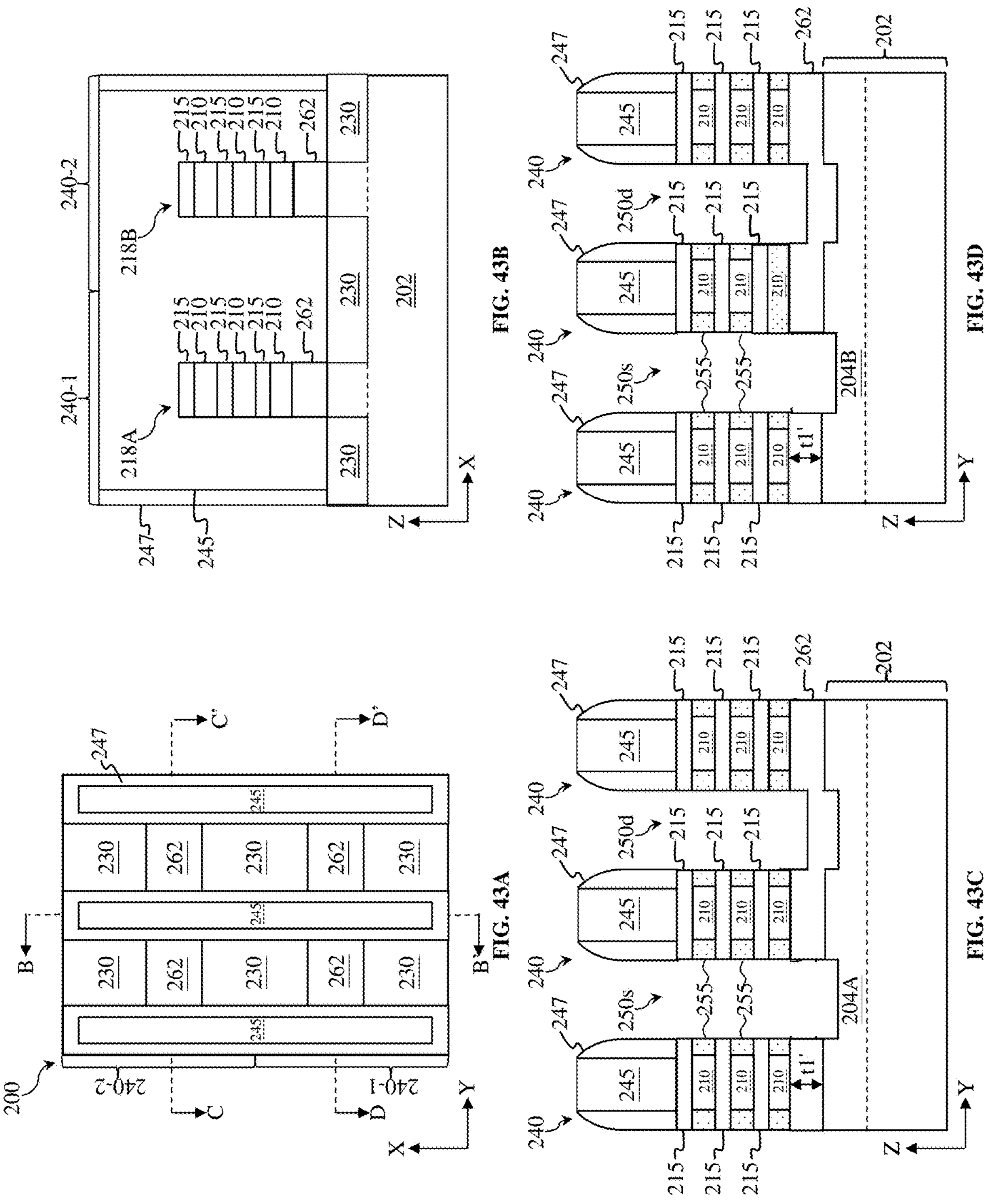
Figure 44A:
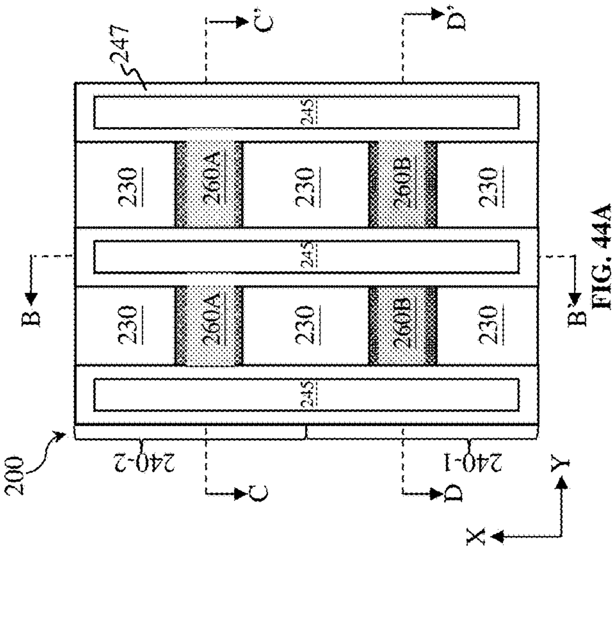
Figure 44B:
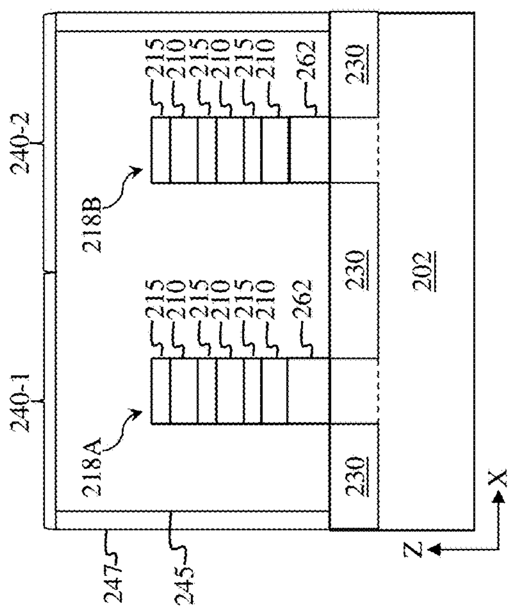
Figure 44C:
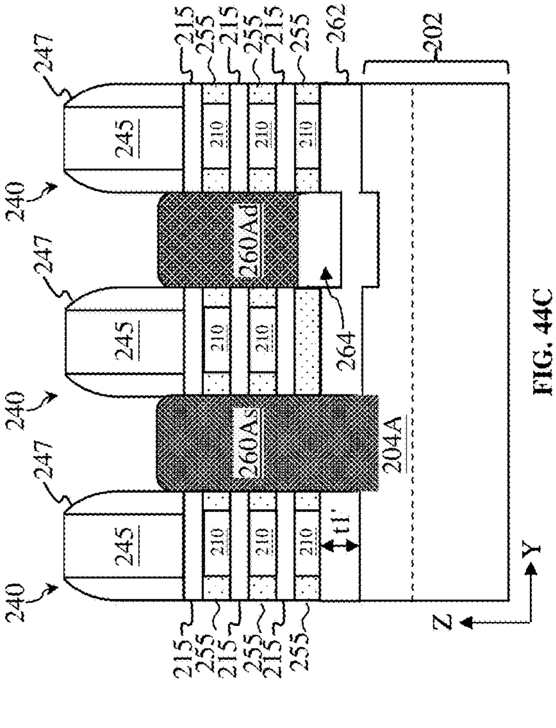
Figure 44D:
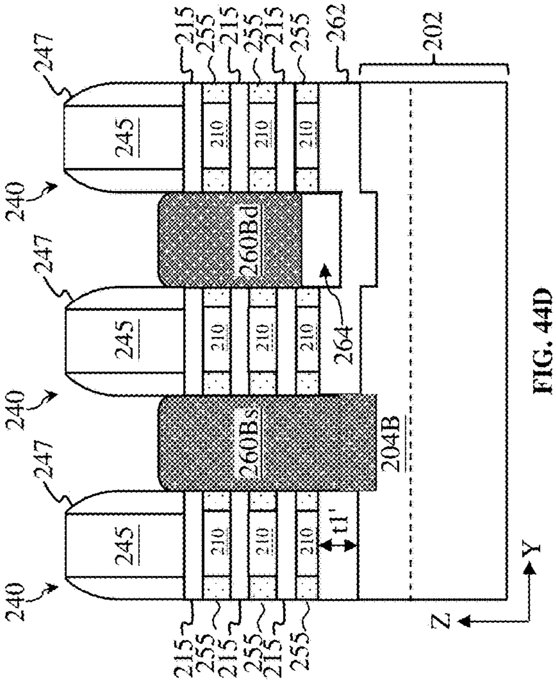
Figure 45B:
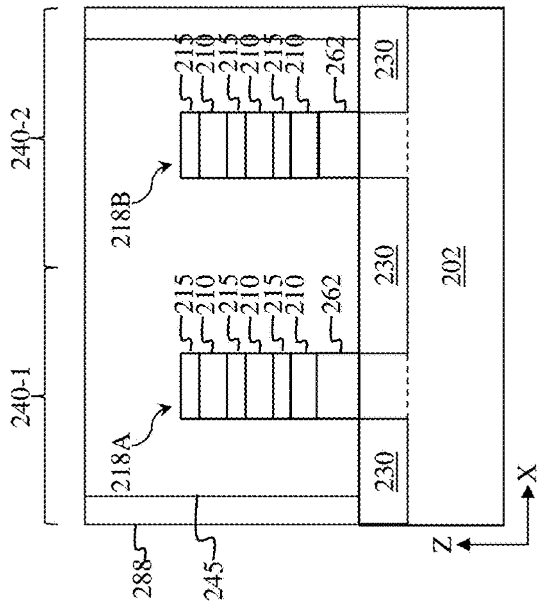
Figure 45A:
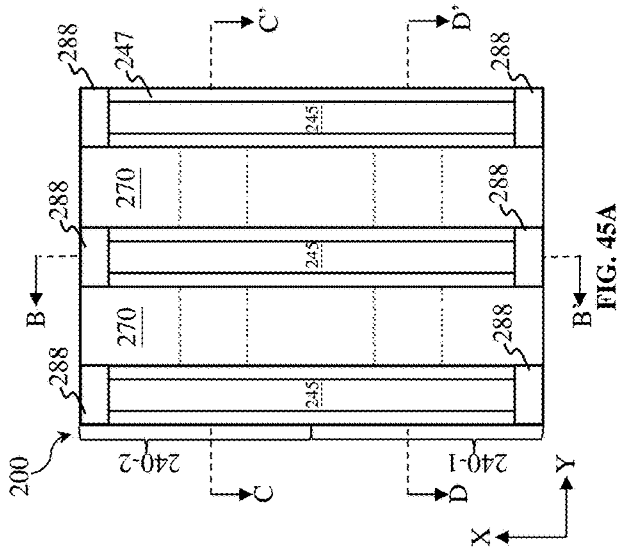
Figure 45D:
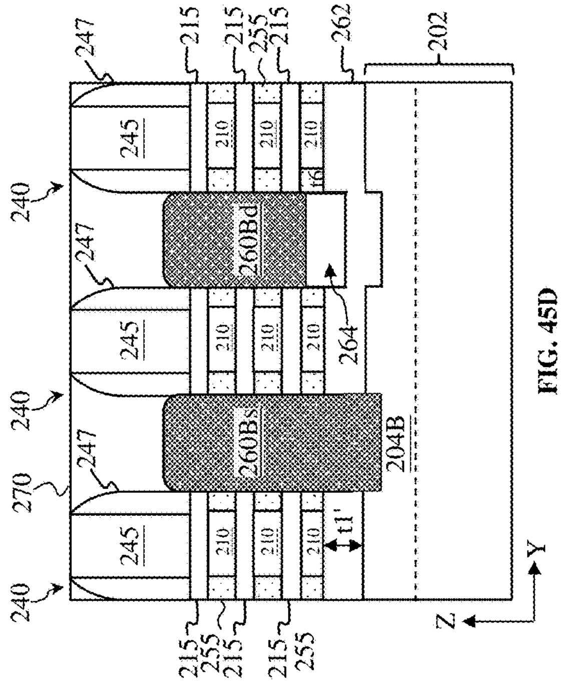
Figure 45C:
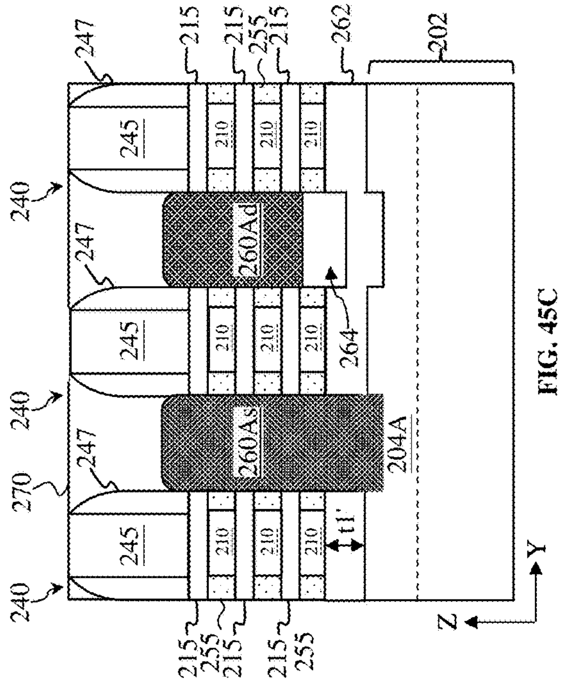
Figures 46A, 46B, 46C, 46D:
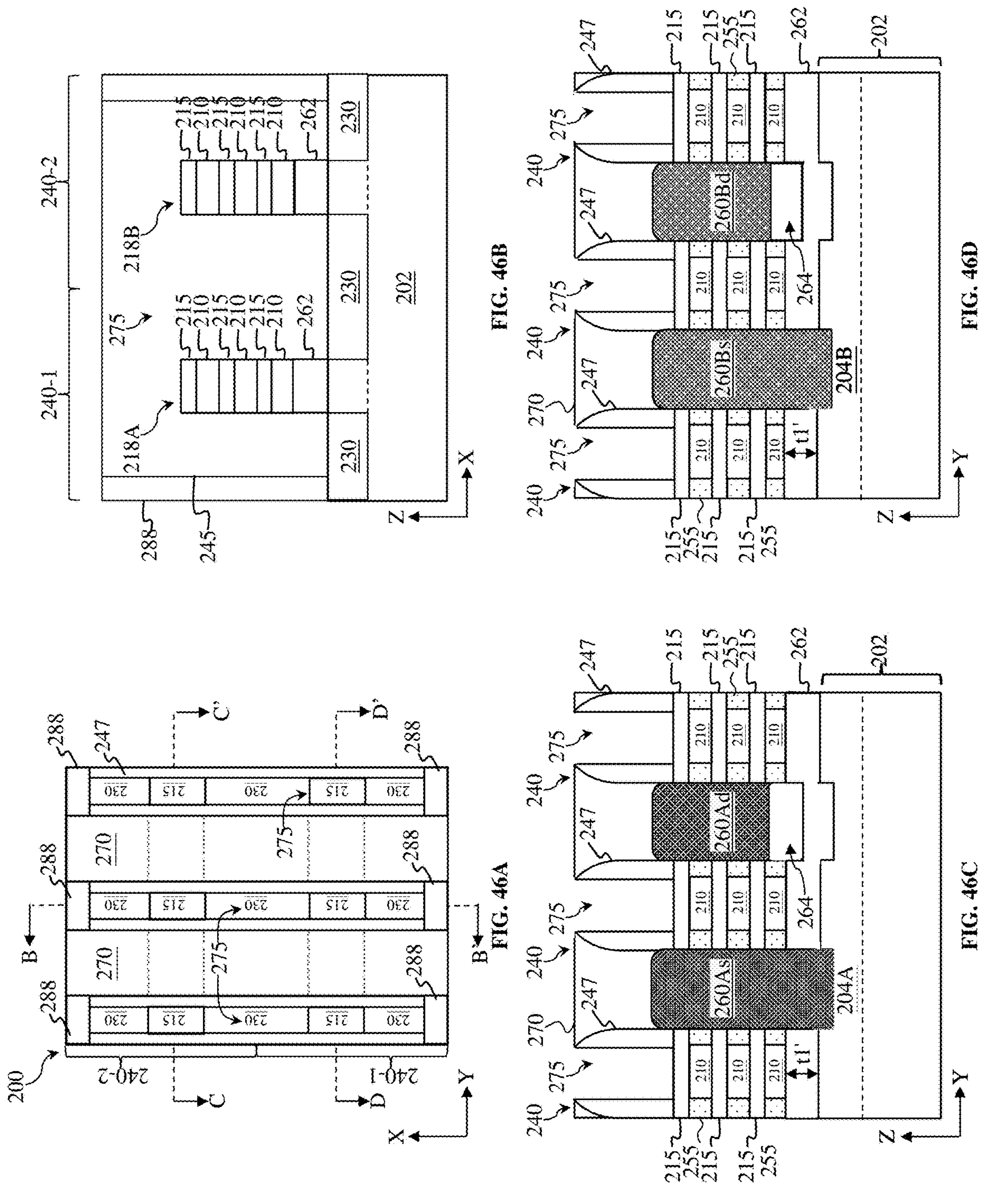
Figure 47A:
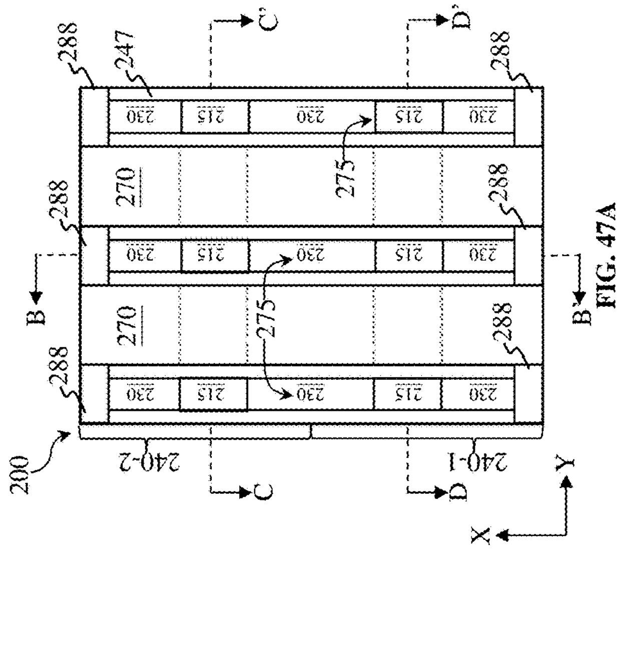
Figure 47B:
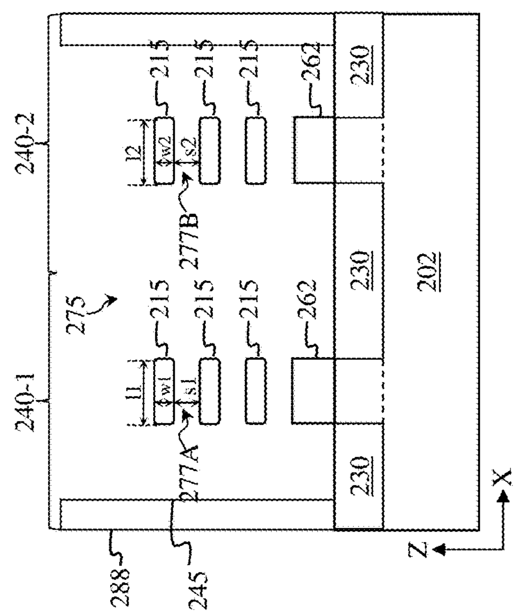
Figure 47C:
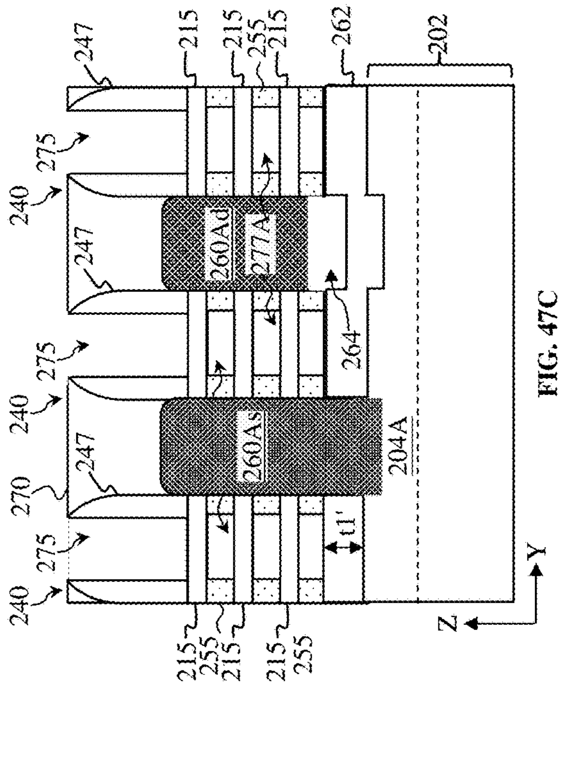
Figure 47D:
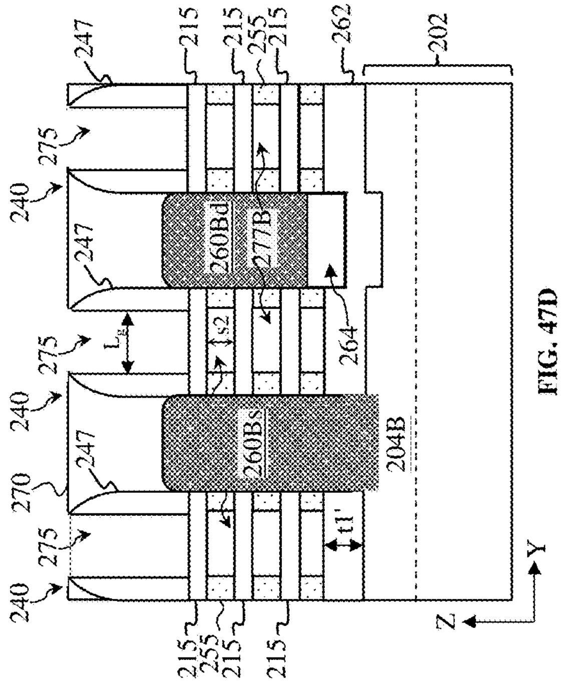
Figures 48A, 48B, 48C, 48D:
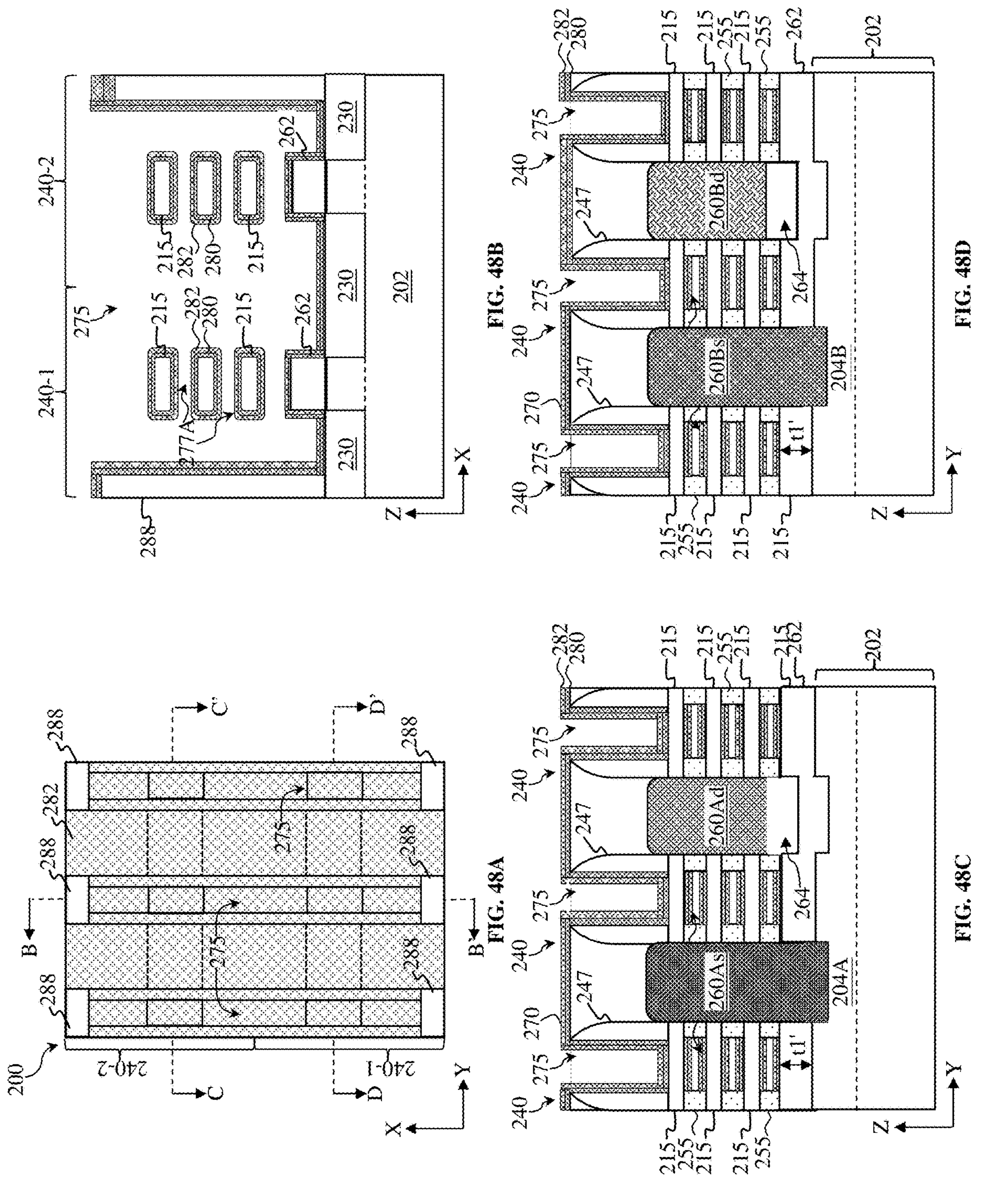
Figures 49A, 49B, 49C, 49D:
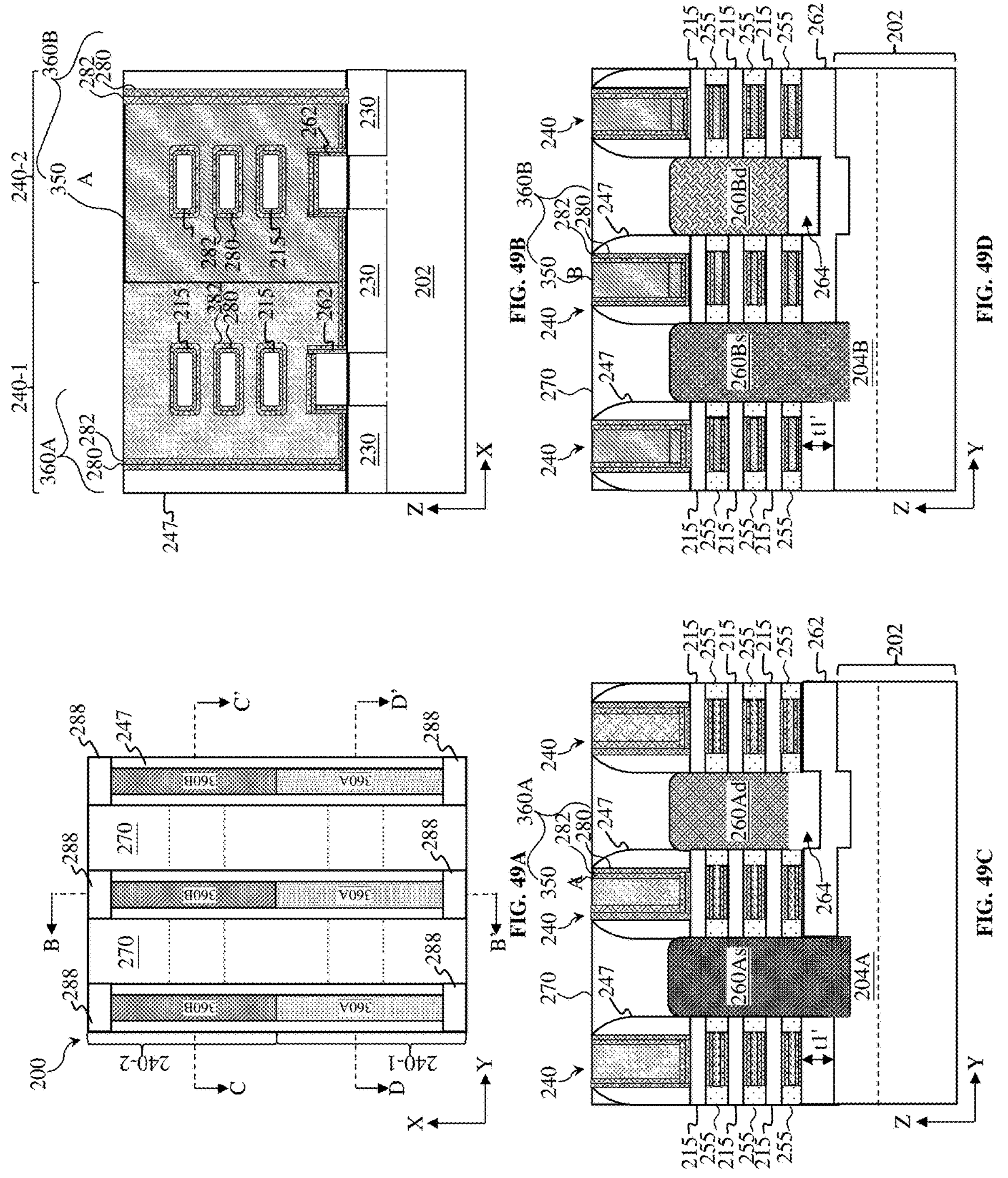
Figure 50A:
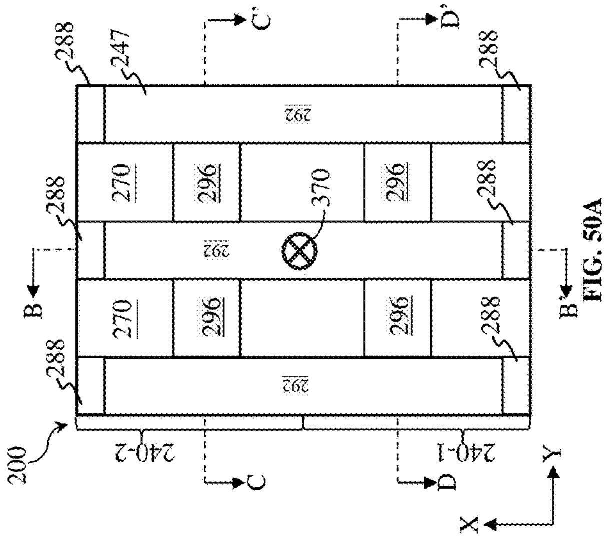
Figure 50B:
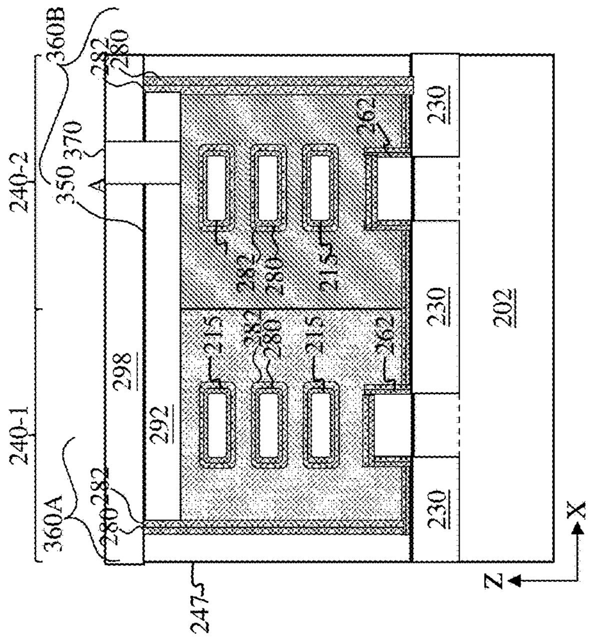
Figure 50C:
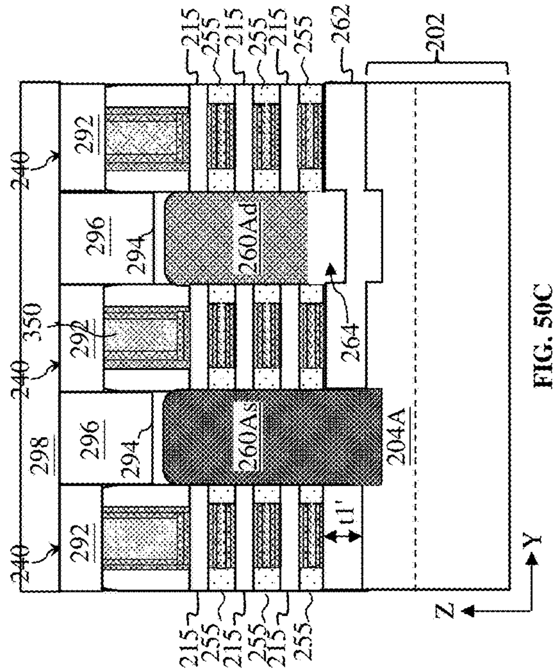
Figure 50D:
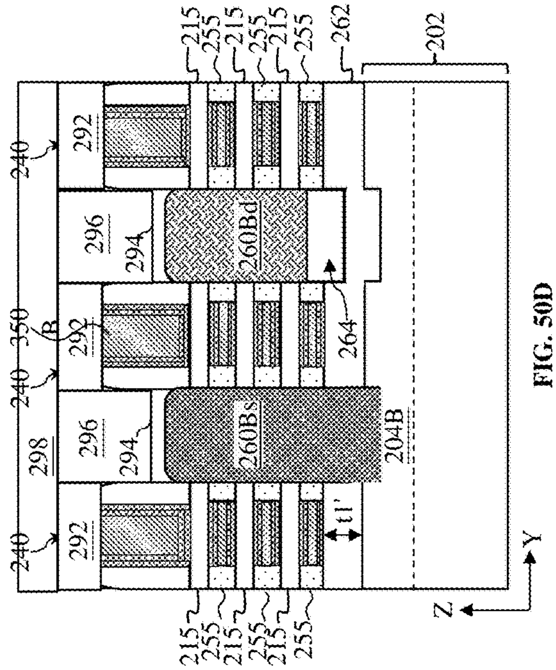

FIGS. 26A and 26B illustrate alternative process flows of method 1100 according to some embodiments of the present disclosure. FIGS. 27A-30A, 30A', 31A-42A, FIGS. 27B-30B, 30B', 31B-42B, FIGS. 27C-30C, 30C', 31C-42C, FIGS. 27D-30D, 30D', 31D-42D, and FIG. 42E are fragmentary diagrammatic views of a multigate device 200 (or device 200), in portion or entirety, at various fabrication stages (such as those associated with method 1100 in FIG. 26A and FIG. 26B) according to various aspects of the present disclosure. In particular, FIGS. 27A-30A, 30A', 31A-42A are top views of device 200 in an X-Y plane; FIGS. 27B-30B, 30B', 31B-42B are diagrammatic cross-sectional views of device 200 in an X-Z plane along lines B-B' of the respective FIGS. 27A-30A, 30A', 31A-42A, FIGS. 27C-30C, 30C', 31C-42C are diagrammatic cross-sectional views of device 200 in a Y-Z plane along lines C-C' of the respective FIGS. 27A-30A, 30A', 31A-42A; FIGS. 27D-30D, 30D', 31D-42D are diagrammatic cross-sectional views of device 200 in the Y-Z plane along lines D-D' of the respective FIGS. 27A-30A, 30A', 31A-42A; and FIG. 42E is a diagrammatic cross-sectional view of device 200 in the X-Z plane along lines E-E' of FIG. 42A.

Referring to block 1102 of FIG. 26A and to FIGS. 27A-27D, semiconductor layer stacks 205 are formed over the substrate 202. This processing step generally resembles that of the block 102 of FIG. 1A. Accordingly, FIGS. 27A-27D each depict a cross-sectional view that resemble those described above with respect to FIGS. 2A-2D, respectively. For example, p-well 204A and n-well 204B are formed in the substrate 202. A semiconductor layer stack 205 is formed over the substrate 202. The semiconductor layer stack 205 includes semiconductor layers 210 and semiconductor layers 215 stacked vertically in an alternating configuration. The semiconductor layers 210 may each have a thickness t1, and the semiconductor layers 215 may each have a thickness t2. The semiconductor layers 210 and 215 each includes a semiconductor material different from each other in order to achieve an etching selectivity in the subsequent channel release processes. In the depicted embodiments, the semiconductor layers 210 includes SiGe, and the semiconductor layers 215 includes Si. In some embodiments, the lowest semiconductor layer 210 is formed between the lowest semiconductor layer 215 and the substrate. Moreover, FIGS. 27A-27D depict three semiconductor layers 210 stacked with three semiconductor layers 215.

Block 1102 of FIG. 26A differs from block 102 of FIG. 1A, and FIGS. 27A-27D differ from FIGS. 2A-2D in that the semiconductor layer stack 205 includes another semiconductor layer 214 interposed between the substrate 202 and the lowest semiconductor layer 210. In some embodiments, the semiconductor layer 214 includes a material that differs from both the semiconductor layers 210 and from the semiconductor layers 215, such that an etching process may be designed to remove the semiconductor layer 214 in its entirety without substantially affecting the semiconductor layers 210 or the semiconductor layers 215. As described above, in some embodiments, the semiconductor layer 210 includes SiGe and the semiconductor layer 215 includes Si. In some embodiments, the semiconductor layer 214 also includes SiGe, however, having a different elemental composition, atomic percentage, or layer thickness from the semiconductor layers 210. Alternatively, the semiconductor layer 214 may be a pure Ge layer. For example, the semiconductor layers 210 includes Ge at an atomic percentage of about 10% to about 30%; while the semiconductor layers 214 includes Ge at an atomic percentage of about 30% to about 100%. In some embodiments, the Ge atomic percentage of the semiconductor layer 210 is less than the Ge atomic percentage of the semiconductor layer 214. Moreover, a difference between the Ge atomic percentage of the semiconductor layer 210 and the semiconductor layer 214 is greater than 10%. If the difference is less than 10%, desired etching selectivity described above and in more detail below may not be effectively achieved. In some embodiments, the semiconductor layer 214 has a thickness t1'. In some embodiments, the thickness t1' may be about 10 nm to about 50 nm. In some embodiments, a difference between the thickness t1 and the thickness t1' is less than about 40 nm. Still referring to block 1102 of FIG. 26A and to FIGS. 28A-28D, the semiconductor layer stack 205 is patterned to form fin structures 218A and 218B, respectively, similar to the step illustrated above with respect to FIGS. 3A-3D.

Referring to blocks 1104 of FIG. 26A and to FIGS. 29A-29D, method 1100 proceeds to form gate structures 240 on the fin structures 218A and 218B. For example, a gate portion 240-1 is formed on the fin structure 218A and a gate portion 240-2 is formed on the fin structure 218B. The gate structures 240 define channel regions 244 of the fin structures 218A and 218B, as well as the source/drain regions 242 on both sides of the channel regions. FIGS. 29A-29D generally resemble FIGS. 4C-4D, except the presence of the semiconductor layer 214. The method 1100 proceeds to block 1106 of FIG. 26A and FIGS. 30A-30D to form source/drain recesses 250. The source/drain recesses 250 generally resemble the source/drain recesses 250 described above with respect to FIGS. 5A-5D. For example, a distance between the bottom surface of the source/drain recesses 250 and the bottom surface of the semiconductor layers 210 may be t3. In the depicted embodiments, the source/drain recesses 250 extend below the top surface of the substrate 202. In other words, t3 is greater than t1'. Accordingly, the source/drain recesses 250 extend through the entire thickness dimension of the semiconductor layer 214 along the Z-direction to reach the p-well 204A and the n-well 204B, respectively. Moreover, the semiconductor layers 214 in the source/drain regions 242 are removed in their entireties, and sidewall surfaces of the semiconductor layers 214 in the channel region are exposed in their entirety in the source/drain recesses 250. Alternatively, the source/drain recesses 250 may extend to a bottom surface that is coplanar with the bottom surface of the semiconductor layer 214. In other words, t3 is about the same as t1'. In such embodiments, sidewall surfaces of the semiconductor layer 214 are exposed in the source/drain recesses 250 in their entirety. Still alternatively, referring to FIGS. 30A'-30D', the source/drain recesses 250 may extend below the top surface of the semiconductor layer 214 but above the bottom surface of the semiconductor layer 214. In other words, t3 is less than t1'. In such embodiments, the semiconductor layer 214 has a top surface that is lower in the source/drain regions 242 than in the channel regions 244. Any suitable methods may be used to form the source/drain recesses 250, such as those described above with respect to FIGS. 5A-5D.

Referring to block 1108 of FIG. 26A, the semiconductor layer 214 is removed in an etching operation. The removal of the semiconductor layer 214 forms gaps 261 between the lowest semiconductor layers 210 and the top surface of the substrate 202. The gaps 261 connect the adjacent source/drain recesses 250 to form open channels that extend across the lengthwise direction (e.g. along the Y-direction) of the device 200. In the depicted embodiments of FIGS. 31A-31D, t3 is greater than t1' (see FIGS. 30C-30D). Accordingly, the bottom surface of the gaps 261 extends above a bottom surface of the source/drain recesses 250. Alternatively, where t3 is less than or the same as t1' (see, e.g. FIGS. 30C'-30D'), the bottom surface of the gaps 261 extends along a bottom surface of the source/drain recesses 250 in both the channel regions 244 and the source/drain regions 242 (see FIGS. 29A-29D). The etching operation may implement any suitable methods to effect the formation of the gaps 261. As described above, there is an etching selectivity between the semiconductor layers 214 and the semiconductor layers 210 as well as between the semiconductor layers 214 and the semiconductor layers 215. Accordingly, the semiconductor layers 210 and semiconductor layers 215 are substantially preserved during the removal of the semiconductor layers 214.

Referring to block 1110 of FIG. 26A and to FIGS. 32A-32D, a dielectric material layer 262 is formed in the open channels formed from the gaps 261 and bottom portions of the source/drain recesses 250. In some embodiments, the dielectric material layer 262 fills the gaps 261 in their entirety. Therefore, a continuous dielectric material layer 262 is formed within the open channels such that the dielectric material layer 262 extend across different device regions (such as n-type transistor regions and p-type transistor regions). Accordingly, the dielectric material layer 262 has a top surface directly interfacing with the bottom surface of the semiconductor layers 210, and has a bottom surface directly interfacing with the substrate 202. In the depicted embodiments of FIGS. 32C-32D, t3 is greater than t1'. Moreover, the dielectric material layer 262 may be a conformal layer. Accordingly, the dielectric material layer 262 has a top surface that is lower in the source/drain regions 242 than in the channel regions 244 (see FIGS. 29A-29D). However, as described above, where t3 is the same as or less than t1', the dielectric material layer 262 may have a top surface that is coplanar in the source/drain region as in the channel region. Furthermore, in some embodiments, the dielectric material layer 262 may not be conformal. For example, the dielectric material layer 262 may instead have greater thickness in the source/drain regions 242 than in the channel regions 244 (see FIGS. 29A-29D), for example, such that a top surface of the dielectric material layer 262 extends along a plane close to the bottom surface of the semiconductor layer 215. While the profile of the dielectric material layer 262 differs from that described above with respect to FIGS. 6A-6D of method 100, the method of formation of the dielectric material layer 262 may be substantially similar to those already described.

At this processing stage, the dielectric material layer 262 separates the entirety of the source/drain recesses 250 from the fin structure 202. Accordingly, subsequently formed source/drain features in the source/drain recesses 250 are also separated in their entirety from the fin structure 202. Moreover, unlike the embodiments described above, the bottom channels previously described have been replaced with portions of the dielectric material layer 262. In other words, while previous embodiments mitigate the challenges by separating the bottom channels from the source and/or drain features, in the following embodiments, the bottom channels are removed entirely. Moreover, the dielectric material layer 262 separates the remaining portions of the fin 202 from the source and/or drain regions so as to mitigate the leakage current.

Referring to block 1112 of FIG. 26A and to FIGS. 33A-33D, gaps 254 are formed between end portions of the vertically adjacent semiconductor layers 215 by laterally etching portions of the semiconductor layers 210. This process may be similar to that of block 110 of FIG. 1A and described with respect to FIGS. 7A-7D. Proceeding further to blocks 1116 of FIG. 26A and to FIGS. 34A-34D, inner spacers 255 are formed between end portions of vertically adjacent semiconductor layers 215 (FIGS. 34A-34D). The inner spacers 255 may be formed by any suitable methods, such as those described above with respect to FIGS. 8A-8D. The inner spacers 255 of FIGS. 34C-34D differ from those described above with respect to FIGS. 8A-8D in that the lowest inner spacers 255 are formed between end portions of the lowest semiconductor layers 215 and the top surface of the dielectric material layer 262 and do not directly interface with the substrate 202. Source/drain features are formed in the source/drain recesses 250 (FIGS. 35A-35D) similar to those already described above with respect to FIGS. 9A-9D. In the depicted embodiments, air gaps 264 are formed between the bottom surfaces of the source/drain features 260A, 260B and the top surface of the dielectric material layers 262. Alternatively, as described above, the dielectric material layer 262 may be configured to have a top surface that extends along a plane close to the bottom surface of the semiconductor layer 215. Accordingly, similar to the situation illustrated in FIGS. 16A'-16D', the drain features 260Ad, 260Bd may be formed to directly contact the top surface of the dielectric material layer 262 in the drain regions 242 (see FIGS. 29A-29D). In other words, air gaps 264 may be omitted. Further steps generally resemble those already discussed with respect to method 100 and are not repeated.

Figure 51B:
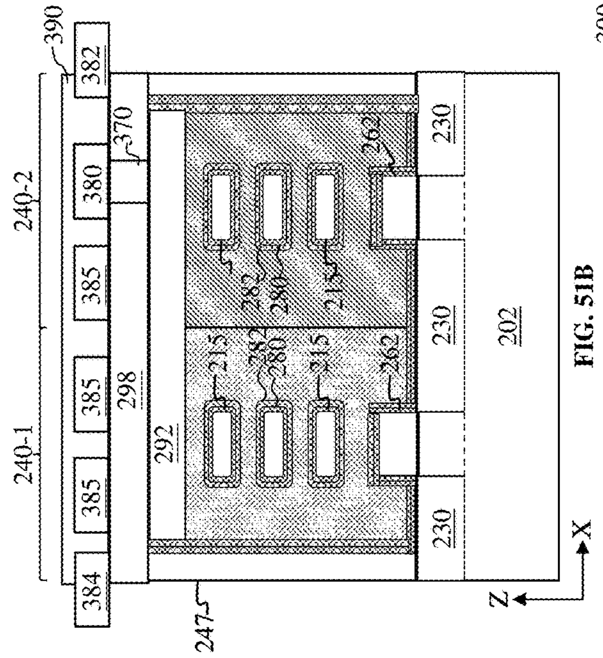
Figure 51D:
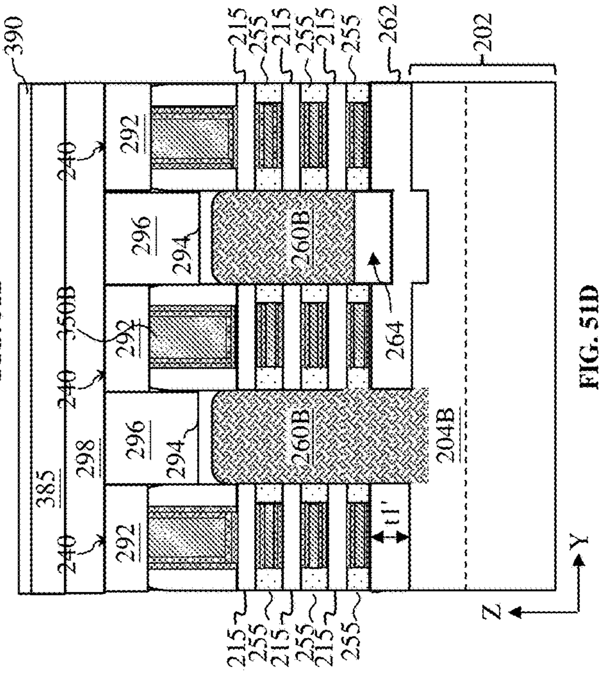
Figure 51A:
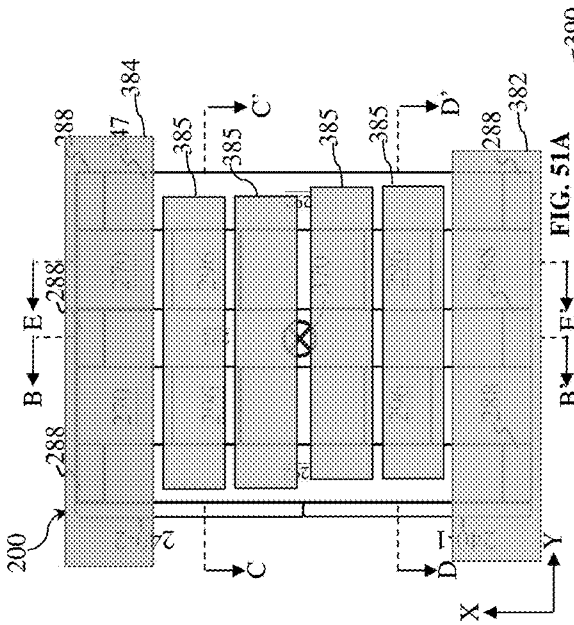
Figure 51C:
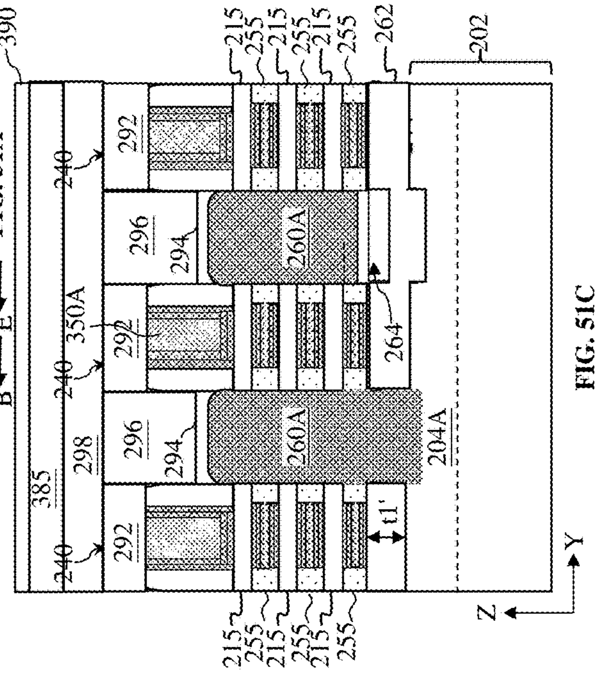
Figure 51E:
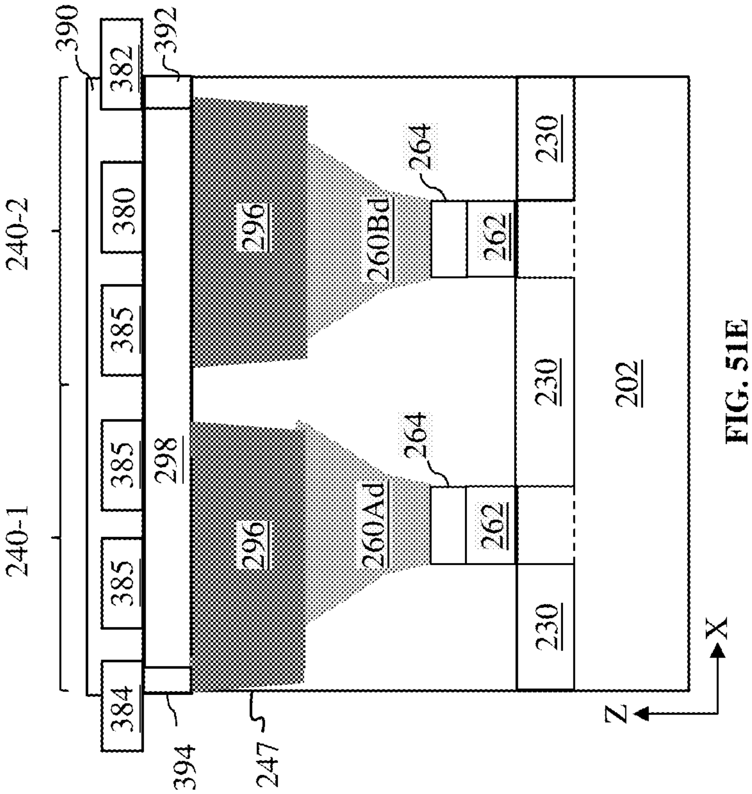

FIGS. 43A-51A, FIGS. 43B-51B, FIGS. 43C-51C, FIGS. 43D-51D, and 51E provide alternative embodiments of the method 1100. FIGS. 43A-51A are top views of device 200 in an X-Y plane; FIGS. 43B-51B are diagrammatic cross-sectional views of device 200 in an X-Z plane along lines B-B' of the respective FIGS. 43A-51A, FIGS. 43C-51C are diagrammatic cross-sectional views of device 200 in a Y-Z plane along lines C-C' of the respective FIGS. 43A-51A; FIGS. 43D-51D are diagrammatic cross-sectional views of device 200 in the Y-Z plane along lines D-D' of the respective FIGS. 43A-51A; and FIG. 51E is a diagrammatic cross-sectional view of device 200 in the X-Z plane along lines E-E' of FIG. 51A.

Referring back to block 1114 of FIG. 26A and to FIGS. 43A-43D, an optional etching operation may be performed to selectively remove the dielectric material layer 262 in the source recesses 250*s* and not in the drain recesses 250*d*.

Accordingly, a pair of source/drain recesses 250 are formed asymmetrically, where the source recess 250*s* is deeper than the drain recess 250*d*. This aspect is similar to the method 100 described above with respect to the FIGS. 17A-17D. FIGS. 43A-43D differs from FIGS. 17A-17D in that a sidewall surface of the dielectric material layer 262 is also exposed in the source recesses 250*s*. Source/drain features are formed in the source/drain recesses 250 (FIGS. 44A-44D) similar to those already described above with respect to FIGS. 18A-18D. The source/drain features here differ from those of FIGS. 18A-18D in that the source features 260As, 260Bs each directly contact the dielectric material layer 262 on a sidewall surface of the dielectric material layer 262. In the depicted embodiments, air gaps 264 are formed between the bottom surfaces of the drain features 260Ad, 260Bd and the top surface of the dielectric material layers 262. Alternatively, as described above, the dielectric material layer 262 may be configured to have a top surface that extends along a plane close to the bottom surface of the semiconductor layer 215. Accordingly, the drain features 260Ad, 260Bd may instead be formed to directly contact the top surface of the dielectric material layer 262 in the drain regions 242 (see FIGS. 29A-29D). In other words, air gaps 264 may be omitted. Further steps are illustrated in FIGS. 45A-51A, 45B-51B, 45C-51C, 45D-51D, and 51E which are generally similar to those already described above and are not repeated for simplicity and clarity.

Without being limited, the devices described above have several features. For example, the substrate is separated from the source features and/or both source and drain features by a dielectric material layer. The dielectric material may include an air gap. This reduces the current leakage through the bottom channel thereby improves the device performances.

The present disclosure provides for many different embodiments. One general aspect includes a semiconductor device. The semiconductor device includes a substrate, a fin on the substrate extending along a fin direction, a first source/drain feature and a second source/drain feature on the fin. The semiconductor device also includes a stack of semiconductor layers over a first portion of the fin and between the first source/drain feature and the second source/drain feature. Furthermore, the semiconductor device includes a gate structure over the stack of semiconductor layers. The gate structure extends along a gate direction perpendicular to the fin direction. Moreover, the gate structure engages with the stack of semiconductor layers. Additionally, the semiconductor device includes a dielectric layer interposing between the first source/drain feature and the fin along a vertical direction, where the vertical direction is perpendicular to the fin direction and to the gate direction. The dielectric layer interfaces with the first portion of the fin and isolates the first source/drain feature from the first portion of the fin.

In some embodiments, the semiconductor device further includes an air gap between a bottom surface of the first source/drain feature and a top surface of the dielectric layer. In some embodiments, the dielectric layer has a first portion under the first source/drain feature and a second portion under the second source/drain feature. The dielectric layer extends continuously from the first portion to the second portion. In some embodiments, the fin includes a source/drain region and a channel region. The dielectric layer is formed on the source/drain region of the fin and not on the channel region of the fin. In some embodiments, the second source/drain feature has a bottom surface formed in direct contact with the substrate. In some embodiments, the first source/drain feature is a drain feature, and the second source/drain feature is a source feature. In some embodiments, a bottom surface of the second source/drain feature extends below a bottom surface of the first source/drain feature, and the bottom surface of the first source/drain feature extends below a bottom surface of a lowest semiconductor layer of the stack of semiconductor layers. In some embodiments, the dielectric layer has a first top surface below the first source/drain feature. Moreover, the first top surface extends below a bottom surface of a lowest semiconductor layer of the stack of semiconductor layers; and the first top surface further extends above a top surface of the substrate. In some embodiments, the dielectric layer has a substantially uniform thickness. In some embodiments, a bottom surface of the first source/drain feature has a profile resembling a letter "V", a letter "U", or a letter "W".

One general aspect includes a method. The method includes receiving a semiconductor structure. The semiconductor structure includes a substrate, a first semiconductor layer above and interfacing with the substrate, a second semiconductor layer above and interfacing with the first semiconductor layer, and a gate structure over the second semiconductor layer. The method also includes etching portions of the first and the second semiconductor layers and further into the substrate to form source/drain recesses on both sides of the gate structure. The method further includes forming a dielectric layer in a bottom portion of the source/drain recesses. The dielectric layer has a top surface that extends below a top surface of the first semiconductor layer and above a bottom surface of the first semiconductor layer. The method additionally includes laterally etching the first semiconductor layer to form gaps, forming inner spacers in the gaps, and forming source/drain features in the source/drain recesses and over the dielectric layer.

In some embodiments, the method further includes, after forming the dielectric layer, removing a portion of the dielectric layer in a source trench of the source/drain recesses thereby exposing a portion of the substrate. Moreover, the forming of the source/drain features includes forming a source feature in the source trench from the exposed portion of the substrate, and forming a drain feature in a drain trench of the source/drain recesses from a sidewall surface of the second semiconductor layer. In some embodiments, the forming of the source/drain features further includes adjusting processing parameters to form an air gap between a top surface of the dielectric layer and a bottom surface of the source/drain features.

One general aspect includes a semiconductor device. The semiconductor device includes a substrate, a fin on the substrate extending along a fin direction, a source and a drain feature on the fin, and a stack of semiconductor layers over the fin and between the source feature and the drain feature. The semiconductor device also includes a gate structure over the stack of semiconductor layers. The gate structure extends along a gate direction perpendicular to the fin direction, and engages with the stack of semiconductor layers. The semiconductor further includes inner spacers, each of which being between the source feature and the gate structure or between the drain feature and the gate structure. Moreover, the inner spacers are further between vertically adjacent semiconductor layers of the stack of semiconductor layers. The semiconductor additionally includes a dielectric layer. The dielectric layer interposes between a drain feature and the fin along a vertical direction, where the vertical direction is perpendicular to the fin direction and to the gate direction. Still further, the semiconductor includes an air gap between the dielectric layer and the fin along the vertical direction.

In some embodiments, the dielectric layer is a first dielectric layer. The device further includes a second dielectric layer between a source feature and the fin along the vertical direction. In some embodiments, the air gap is a first air gap, and the device further includes a second air gap between the second dielectric layer and the fin. In some embodiments, a bottom surface of the source feature directly interfaces with the fin. Moreover, a bottom surface of the drain feature is spaced away from the fin. In some embodiments, the dielectric layer extends between the stack of semiconductor layers and the fin. Moreover, the dielectric layer interfaces with the gate structure. In some embodiments, the dielectric layer extends between the source feature and the fin. Additionally, a bottom surface of the source feature and a top surface of the dielectric layer define an air gap. In some embodiments, the dielectric layer interfaces with a side surface of an inner spacer of the inner spacers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:

a substrate;

a fin disposed over the substrate and extending along a fin lengthwise direction, wherein the fin has a first source/drain region, a second source/drain region, and a channel region disposed between the first source/drain region and the second source/drain region;

a first source/drain feature disposed over the first source/drain region of the fin and a second source/drain feature disposed over the second source/drain region of the fin;

a stack of semiconductor layers disposed over the channel region of the fin and between the first source/drain feature and the second source/drain feature;

a gate structure disposed over the stack of semiconductor layers, wherein the gate structure extends along a gate lengthwise direction that is different than the fin lengthwise direction and the gate structure engages the stack of semiconductor layers; and a dielectric layer disposed between the first source/drain feature and the first source/drain region of the fin, wherein no dielectric layer is disposed between the second source/drain feature and the second source/drain region of the fin, and a bottom surface of the second source/drain feature and a bottom surface of the dielectric layer are at a same depth in the fin.

2. The semiconductor device of claim 1, further comprising an air gap between a bottom surface of the first source/drain feature and a top surface of the dielectric layer.

3. The semiconductor device of claim 1, wherein the dielectric layer is disposed over the first source/drain region of the fin and over the channel region of the fin.

4. The semiconductor device of claim 1, wherein the dielectric layer is disposed over the first source/drain region of the fin and not over the channel region of the fin.

5. The semiconductor device of claim 1, wherein the channel region of the fin is disposed between the second source/drain feature and the dielectric layer.

6. The semiconductor device of claim 1, wherein the first source/drain feature is a drain feature, and the second source/drain feature is a source feature.

7. The semiconductor device of claim 1, wherein a portion of the channel region of the fin extends along the fin lengthwise direction from the second source/drain feature to the dielectric layer, such that the portion of the channel region is disposed between the second source/drain feature and the dielectric layer.

8. The semiconductor device of claim 1, wherein the dielectric layer interfaces with the first source/drain region of the fin.

9. The semiconductor device of claim 8, wherein the dielectric layer further interfaces with the second source/drain feature.

10. The semiconductor device of claim 1, wherein a bottom surface of the first source/drain feature has a profile resembling a letter "V", a letter "U", or a letter "W".

11. A semiconductor device, comprising:

a substrate;

a fin extending along a first direction from the substrate, wherein the fin extends lengthwise along a second direction different than the first direction;

a first source/drain feature and a second source/drain feature disposed over the fin;

a stack of semiconductor layers disposed over the fin, wherein the stack of semiconductor layers extend along the second direction between the first source/drain feature and the second source/drain feature;

a gate structure disposed over the stack of semiconductor layers, wherein the gate structure extends lengthwise along a third direction different than the second direction and the gate structure engages the stack of semiconductor layers;

inner spacers disposed between the first source/drain feature and the gate structure and between the second source/drain feature and the gate structure;

a dielectric layer disposed between the second source/drain feature and the fin along the first direction, wherein:

the dielectric layer extends along the second direction under the stack of semiconductor layers and the dielectric layer interfaces with the gate structure, and the dielectric layer extends along the second direction under the stack of semiconductor layers and contacts a lateral sidewall of the first source/drain feature; and an air gap between the second source/drain feature and the dielectric layer along the first direction.

12. The semiconductor device of claim 11, wherein a first portion of the dielectric layer disposed between the second source/drain feature and the fin has a first thickness along the first direction, a second portion of the dielectric layer interfacing with the gate structure has a second thickness along the first direction, and the second thickness is the same as the first thickness.

13. The semiconductor device of claim 11, wherein the dielectric layer is further disposed between the first source/drain feature and the fin along the first direction, the air gap is a first air gap, and the semiconductor device further comprises a second air gap between the first source/drain feature and the dielectric layer along the first direction.

14. The semiconductor device of claim 11, wherein a bottom surface of the first source/drain feature directly contacts the fin, and a bottom surface of the second source/drain feature is separated from the fin by at least the dielectric layer.

15. The semiconductor device of claim 11, wherein a first portion of the dielectric layer is disposed between the second source/drain feature and the fin, a second portion of the dielectric layer interfaces with the gate structure, and a top surface of the second first portion of the dielectric layer is above a top surface of the first second portion of the dielectric layer.

16. The semiconductor device of claim 15, wherein a bottom surface of the second portion of the dielectric layer is above a bottom surface of the first portion of the dielectric layer.

17. The semiconductor device of claim 11, wherein the dielectric layer interfaces with one of the inner spacers.

18. A semiconductor device, comprising:

a fin;

a first source/drain feature and a second source/drain feature disposed over the fin;

a stack of semiconductor layers extending in a first direction between the first source/drain feature and the second source/drain feature;

a gate structure disposed over the stack of semiconductor layers;

a dielectric layer disposed between the second source/drain feature and the fin, wherein:

the dielectric layer extends along the first direction under the stack of semiconductor layers and the dielectric layer interfaces with the gate structure, and the dielectric layer extends along the first direction under the stack of semiconductor layers and contacts a lateral sidewall of the first source/drain feature; and an air gap between the second source/drain feature and the dielectric layer.

19. The semiconductor device of claim 18, wherein the gate structure engages the stack of semiconductor layers.

20. The semiconductor device of claim 18, wherein a bottom surface of the first source/drain feature is below a bottom surface of a portion of the dielectric layer underlying the gate structure.

* * * * *